(12) United States Patent  (10) Patent No.: US 8,311,023 B1
Negus  (45) Date of Patent: *Nov. 13, 2012

(54) INTELLIGENT BACKHAUL RADIO

(75) Inventor: Kevin J. Negus, Hyattville, WY (US)

(73) Assignee: CBF Networks, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/371,366

(22) Filed: Feb. 10, 2012

Related U.S. Application Data

(63) Continuation of application No. 13/212,036, filed on Aug. 17, 2011.

(51) Int. Cl.
H04W 4/00 (2009.01)

(52) U.S. Cl. .......... 370/338; 370/310; 370/328; 455/73; 455/461

(58) Field of Classification Search .................. None
See application file for complete search history.

(56) References Cited

U.S. PATENT DOCUMENTS

| | | | |
|---|---|---|---|
| 5,604,744 A | 2/1997 | Andersson et al. | |
| 5,809,422 A | 9/1998 | Raleigh et al. | |
| 6,463,303 B1 | 10/2002 | Zhao | |
| 6,486,828 B1 | 11/2002 | Cahn et al. | |
| 6,912,195 B2 | 6/2005 | Vook et al. | |
| 6,985,123 B2 | 1/2006 | Gottl | |
| 7,027,837 B1 | 4/2006 | Uhlik et al. | |
| 7,171,223 B2 | 1/2007 | Herscovich et al. | |
| 7,221,722 B2 | 5/2007 | Thomas et al. | |
| 7,292,663 B1 | 11/2007 | Van Wechel et al. | |
| 7,394,439 B1 | 7/2008 | Johnson et al. | |
| 7,403,501 B2 | 7/2008 | Bordonaro et al. | |
| 7,587,177 B1 | 9/2009 | Kwong | |
| 7,593,729 B2 | 9/2009 | Barak et al. | |
| 7,599,290 B2 | 10/2009 | Dos Remedios et al. | |
| 7,616,554 B2 | 11/2009 | Asai et al. | |
| 7,620,370 B2 | 11/2009 | Barak et al. | |
| 7,756,519 B2 | 7/2010 | Barak et al. | |
| 7,848,241 B2 | 12/2010 | Natarajan et al. | |
| 7,948,942 B2 | 5/2011 | Zhang et al. | |
| 8,238,318 B1 * | 8/2012 | Negus | |
| 2001/0030939 A1 * | 10/2001 | Vijayan et al. ................. 370/208 |
| 2002/0060993 A1 * | 5/2002 | Dent ............................. 370/321 |
| 2004/0165650 A1 * | 8/2004 | Miyazaki et al. ............. 375/141 |
| 2005/0026616 A1 * | 2/2005 | Cavalli et al. ................. 455/436 |
| 2005/0075078 A1 | 4/2005 | Makinen et al. | |
| 2006/0141929 A1 | 6/2006 | Lockie et al. | |
| 2006/0164271 A1 | 7/2006 | Hirt et al. | |
| 2008/0080364 A1 | 4/2008 | Barak et al. | |
| 2008/0240307 A1 | 10/2008 | Wang et al. | |
| 2008/0242232 A1 | 10/2008 | Zavadsky et al. | |

(Continued)

OTHER PUBLICATIONS

"WiMAX/BWA/WiBRO/LTE RF MxFE 2×2 MIMO Transceiver, AD9356," Data Sheet, Analog Devices, 2010.

(Continued)

Primary Examiner — Hassan Phillips
Assistant Examiner — Gautam Sharma
(74) Attorney, Agent, or Firm — Nixon Peabody LLP

(57) ABSTRACT

A intelligent backhaul radio is disclosed that is compact, light and low power for street level mounting, operates at 100 Mb/s or higher at ranges of 300 m or longer in obstructed LOS conditions with low latencies of 5 ms or less, can support PTP and PMP topologies, uses radio spectrum resources efficiently and does not require precise physical antenna alignment.

28 Claims, 25 Drawing Sheets

U.S. PATENT DOCUMENTS

| | | | |
|---|---|---|---|
| 2009/0010238 | A1 | 1/2009 | Barak et al. |
| 2009/0052411 | A1 | 2/2009 | Leung et al. |
| 2009/0067526 | A1* | 3/2009 | Ratermann et al. ........... 375/261 |
| 2009/0143017 | A1 | 6/2009 | Barak et al. |
| 2009/0274130 | A1 | 11/2009 | Boch |
| 2009/0323621 | A1 | 12/2009 | Touboul et al. |
| 2010/0056205 | A1 | 3/2010 | Fuss |
| 2010/0157970 | A1 | 6/2010 | Gotman et al. |
| 2010/0272006 | A1 | 10/2010 | Bertrand et al. |
| 2011/0044279 | A1 | 2/2011 | Johansson et al. |
| 2011/0070855 | A1 | 3/2011 | Mariotti |
| 2011/0235514 | A1 | 9/2011 | Huang et al. |
| 2012/0063472 | A1 | 3/2012 | Le Pallec et al. |

OTHER PUBLICATIONS

"WiMAX/BWA/LTE RF MxFE 2×2 MIMO Transceiver, AD9357," Data Sheet, Analog Devices, 2010.

"WiMAX/WiBro RF MxFE MISO Transceiver, AD9354," Data Sheet, Analog Devices, 2008-2009.

"WiMAX/WiBro RF MxFE MISO Transceiver, AD9355," Data Sheet, Analog Devices, 2008-2009.

"WiMAX RF MxFE Transceiver, AD9352-5," Data Sheet, Analog Devices, 2008.

"WiMAX RF MxFE Transceiver, AD9353," Data Sheet, Analog Devices, 2007.

"WiMAX/WiBro RF MxFE Transceiver, AD9352," Data Sheet, Analog Devices, 2007.

"MGA-645T6—Low Noise Amplifier with Bypass/Shutdown Mode in Low Profile Package," Data Sheet, Avago Technologies, Nov. 2009, 16 pages.

"MGA-655T6—Low Noise Amplifier with Bypass Mode in Low Profile Package," Data Sheet, Avago Technologies, Nov. 2009, 14 pages.

"MGA-675T6—Low Noise Amplifier with Shutdown Mode in Low Profile Package for 4.9—6 GHz Application," Data Sheet, Avago Technologies, Nov. 2009, 16 pages.

"MGA-21108—Broadband Fully Integrated Matched Low-Noise Amplifier MMIC," Data Sheet, Avago Technologies, Aug. 2009, 21 pages.

"MGA-22003—2.3-2.7 GHz 3×3mm WiMAX/WiBro and WiFi Linear Amplifier Module," Data Sheet, Avago Technologies, Mar. 2010, 15 pages.

"MGA-23003—3.3-3.8 GHz 3×3mm WiMAX Power Amplifier," Data Sheet, Avago Technologies, Mar. 2010, 16 pages.

"MGA-25203—5.1-5.9GHz 3×3mm WiFi and WiMAX Power Amplifier," Data Sheet, Avago Technologies, Mar. 2010, 14 pages.

MGA-43328—(2.5-2.7) GHz 29dBm High Linearity Wireless Data Power Amplifier, Data Sheet, Avago Technologies, Mar. 2010, 19 pages.

"MGA-43328—High Linearity Wireless Data Power Amplifier for 2.5 to 2.7 GHz Applications," Data Sheet, Avago Technologies, Apr. 2010, 10 pages.

Baum, D. S. et al., "An Interim Channel Model for Beyond-3G Systems—Extending the 3GPP Spatial Channel Model (SCM)," IEEE, Vehicular Technology Conference, vol. 5, 2005, pp. 3132-3136.

Conrat, J-M. et al., "Typical MIMO Propagation Channels in Urban Macrocells at 2 GHz," EURASIP Journal on Wireless Communications and Networking, vol. 2007, Iss. 2, Jan. 2007, 9 pages.

Coon, J. P. et al., "Adaptive Frequency-Domain Equalization for Single-Carrier Multiple-Input Multiple-Output Wireless Transmissions," IEEE Transactions on Signal Processing, vol. 53, No. 8, Aug. 2005, pp. 3247-3256.

Coon, J. P. et al., "An Investigation of MIMO Single-Carrier Frequency-Domain MMSE Equalization," Centre for Communications Research, University of Bristol, Sep. 2002, 4 pages.

"DAN2400-PTP—Open SoC Platform for Sub-6GHz Wireless Point-to-Point Systems," DesignArt Networks, Jul. 2008, 2 pages.

Durgin, G. D., "Wideband Measurements of Angle and Delay Dispersion for Outdoor and Indoor Peer-to-Peer Radio Channels at 1920 MHz," IEEE Transactions on Antennas and Propagation, vol. 51, No. 5, May 2003, pp. 936-944.

Falconer, D. D. et al., "Broadband Wireless Using Single Carrier and Frequency Domain Equalization," Invited Overview Paper for WPMC '02, Honolulu, Oct. 2002, 10 pages.

Falconer, D. D. et al., "Frequency Domain Equalization for Single-Carrier Broadband Wireless Systems," Wideband Wireless Access Technologies to Broadband Internet, IEEE Communications Magazine, Apr. 2002, pp. 58-66.

"GainSpan GS1011M Low Power Wi-Fi® Module Family," Product Brief—Preliminary, GainSpan Corp., 2009, 2 pages.

Hentschel, T. et al., "The Digital Front-End—Bridge Between RFand Baseband-Processing," Software Defined Radio: Enabling Technologies by Walter Tuttlebee, Chapter 6, Jun. 2002, 58 pages.

"HMC536MS8G / 536MS8GE—GaAs MMIC Positive Control T/R Switch, DC-6 GHz," Data Sheet, Switches—SMT, Hittite Microwave Corp., 2008, pp. 10.295-10.299.

"Part 11: Wireless LAN Medium Access Control (MAC) and Physical Layer (PHY) Specifications—Amendment 5: Enhancements for Higher Throughput," IEEE Standard for Information Technology—Telecommunications and Information Exchange Between Systems—Local and Metropolitan Area Networks—Specific Requirements, IEEE Computer Society, IEEE Std 802.11, Sep. 2009, 536 pages.

"Part 11: Wireless LAN Medium Access Control (MAC) and Physical Layer (PHY) Specifications," IEEE Standard for Information Technology—Telecommunications and Information Exchange Between Systems—Local and Metropolitan Area Networks—Specific requirements, IEEE Computer Society, IEEE Std 802.11, Jun. 2007, 1233 pages.

"Part 16: Air Interface for Fixed Broadband Wireless Access Systems," IEEE Standard for Local and Metropolitan Area Networks, IEEE Std 802.16, IEEE Computer Society and the IEEE Microwave Theory and Techniques Society, Oct. 2004, 895 pages.

"Part 16: Air Interface for Fixed and Mobile Broadband Wireless Access Systems—Amendment 2: Physical and Medium Access Control Layers for Combined Fixed and Mobile Operation in Licensed Bands and Corrigendum 1," IEEE Standard for Local and Metropolitan Area Networks, IEEE Computer Society and the IEEE Microwave Theory and Techniques Society, IEEE Std 802.16e-2005 and IEEE Std 802.16-2004/Cor1-2005, Feb. 2006, 864 pages.

"Information Technology—Open Systems Interconnection—Basic Reference Model: The Basic Model," International Standard, ISO/IEC 7498-1, Second Edition Nov. 15, 1994, Corrected and Reprinted Jun. 15, 1996, 68 pages.

"SC-FDMA—Single Carrier FDMA in LTE," Data Sheet, IXIA Corp., Nov. 2009, 16 pages.

"Clock Synchronization in Carrier Ethernet Networks—Synchronous Ethernet and 1588v2 on Juniper Networks MX Series 3D Universal Edge Routers," White Paper, Juniper Networks, Inc., 2010, 11 pages.

Lashkarian, N., "Reconfigurable Digital Front-end Architecture for Wireless Base-Station Transmitters: Analysis, Design and FPGA Implementation," Seminar Presentation, University of California, Berkeley, Apr. 2006, 86 pages.

Padhi, S. K. et al., "A Dual Polarized Aperture Coupled Circular Patch Antenna Using a C-Shaped Coupling Slot," IEEE Transactions on Antennas and Propagation, vol. 51, No. 12, Dec. 2003, pp. 3295-3298.

Pancaldi, F. et al., "Single-Carrier Frequency Domain Equalization—A Focus on Wireless Applications," IEEE Signal Processing Magazine, Sep. 2008, 22 pages.

"PC203-PC203-10—Basestation PHY Processor," Wireless Communications Processors, Product Brief, picoChip Flexible Wireless, 2008, 4 pages.

Nathanzon, G. et al., "Cost-Effective Backhaul Alternatives for WiMAX Networks: Challenges & Solutions," Provigent Inc., Jun. 2008, 16 pages.

Soffer, R., "Microwave Wireless Backhaul for LTE Networks—Meeting the Rapidly-Increasing Demand for Mobile Data," Provigent Inc., Jan. 2010, 18 pages.

Soffer, R., "ProviBand—Next Generation Wireless Backhaul Technology," Technical White Paper, Provigent Inc., Jan. 2006, 13 pages.

"Doubling Capacity in Wireless Channels," Provigent Inc., 2008, 3 pages.

Sharony, J., "Introduction to Wireless MIMO—Theory and Applications," CEWIT—Center of Excellence in Wireless and Informational Technology, Stony Brook University, IEEE LI, Nov. 15, 2006, 63 pages.

Stüber, G. L., et al., "Broadband MIMO-OFDM Wireless Communications," Invited Paper, Proceedings of the IEEE, vol. 92, No. 2, Feb. 2004, pp. 271-294.

Tubbax, J., "OFDM Versus Single Carrier with Cyclic Prefix: A System-based Comparison for Binary Modulation," IMEC, Belgium, Jan. 2011, 4 pages.

"AccessGate—RAN Optimization for Mobile Backhaul Systems," Product Data Sheet, Memotec, 2009, Montreal, Quebec, Canada, 2 pages.

"Advances in Backhaul Synchronization—Maximizing ROI," Application Brief, Symmetricom Inc., 2008, 6 pages.

Beller, D. et al., "MPLS-TP—The New Technology for Packet Transport Networks," Alcatel-Lucent Deutschland AG, Stuttgart, 2009 11 pages.

"Carrier Ethernet Services Overview," Presentation, MEF, Aug. 2008, 32 pages.

Chundury, R., "Mobile Broadband Backhaul: Addressing the Challenge," Planning Backhaul Networks, Ericsson Review, 2008, pp. 4-9.

"Clock Distribution and Synchronization over Ethernet: IEEE1588v2 and SyncE," Presentation, VITESSE, Sep. 2009, 9 pages.

"Evolving Microwave Mobile Backhaul for Next-Generation Networks," White Paper, NEC Corp., Feb. 2008, 4 pages.

Frost, D. et al., "MPLS Transport Profile Data Plane Architecture," Internet Engineering Task Force, RFC 5960, Aug. 2010, 16 pages.

Garner, G. M., "IEEE 1588 Version 2," ISPCS Ann Arbor '08, Sep. 2008, 89 pages.

"IEEE 1588v2 (Precision Time Protocol) Testing," Application Note, IXIA, Dec. 2009, 12 pages.

"Understanding MPLS-TP and Its Benefits," White Paper, Cisco Systems Inc., 2009, 9 pages.

"Using OAM for Efficient and Cost-Effective Ethernet Backhaul Network Management," Application Note 229, EXFO Inc., Quebec City, Canada, 2010, 4 pages.

United States Federal Communications Commission (FCC) website: http://www.fcc.gov/; accessed Oct. 12, 2011.

OpenFlow website: http://www.openflow.org/; accessed Oct. 12, 2011.

U.S. Appl. No. 13/271,051, filed Oct. 12, 2011.
U.S. Appl. No. 13/371,346, filed Feb. 10, 2012.
U.S. Appl. No. 13/212,036, filed Aug. 17, 2011.
U.S. Appl. No. 13/415,778, filed Mar. 8, 2012.
Notice of Allowance in U.S. Appl. No. 13/212,036, mailed Apr. 3, 2012.
Office Action in U.S. Appl. No. 13/415,778, mailed Apr. 26, 2012.
U.S. Appl. No. 13/448,294, filed Apr. 16, 2012.
Office Action in U.S. Appl. No. 13/448,294, mailed on Jun. 21, 2012.
U.S. Appl. No. 13/536,927, filed Jun. 28, 2012.

* cited by examiner

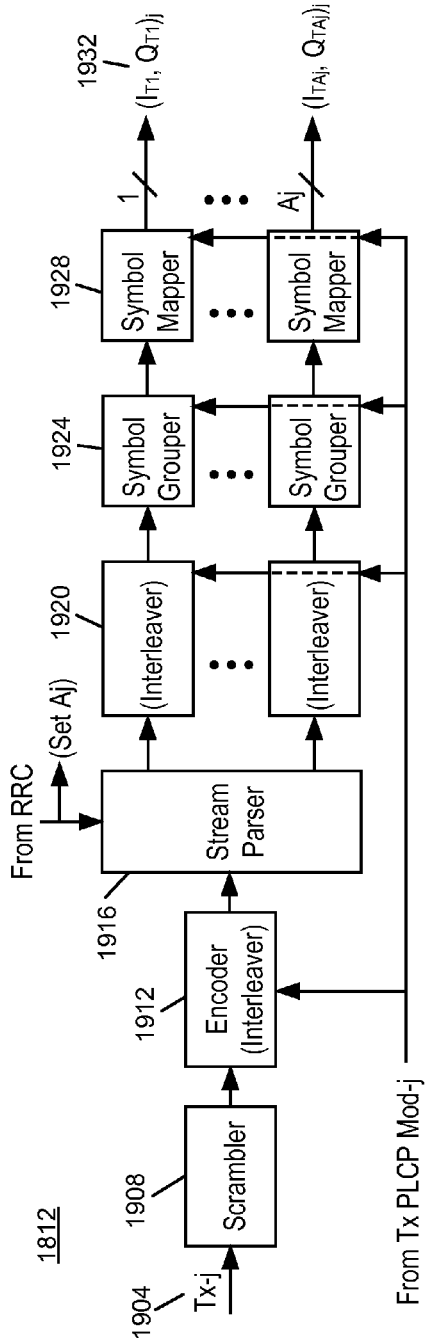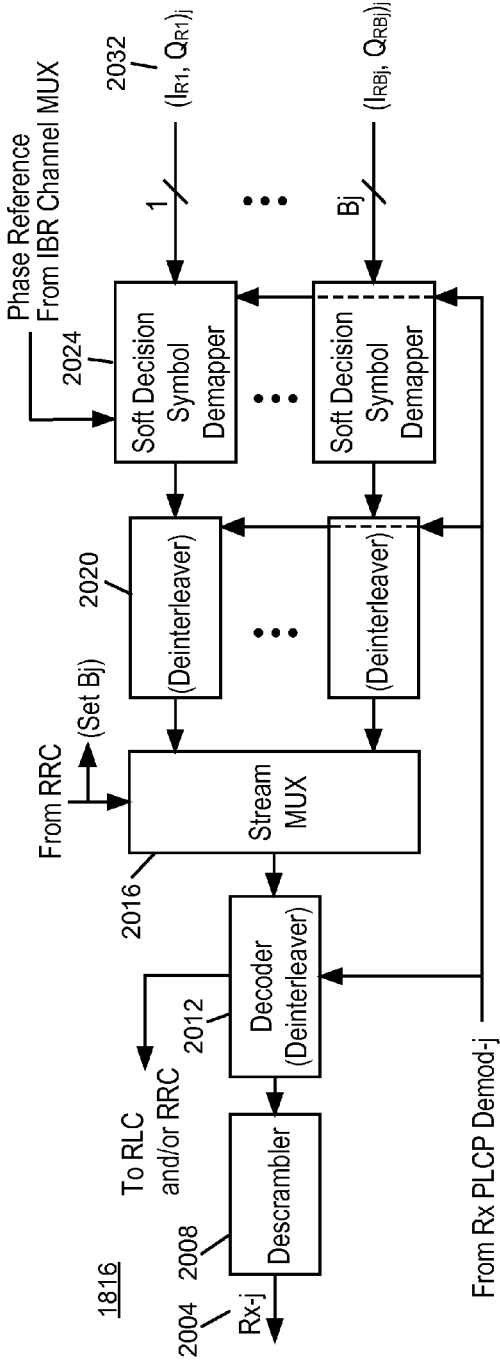
FIG. 19
FIG. 20

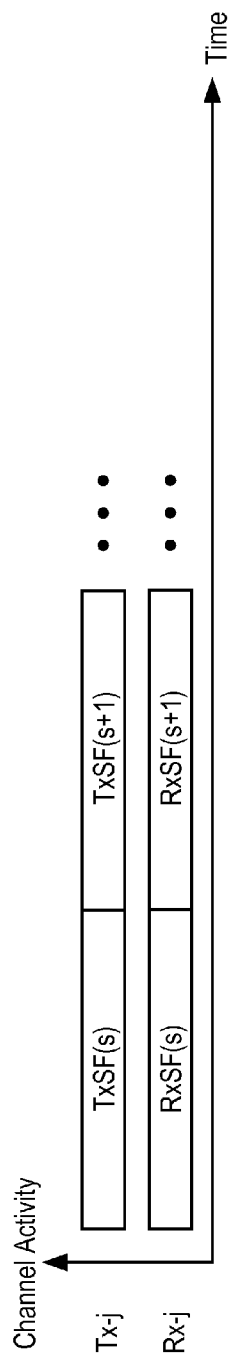
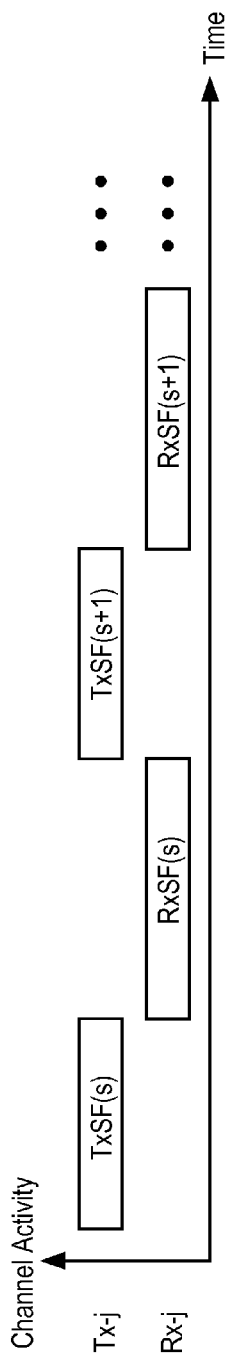
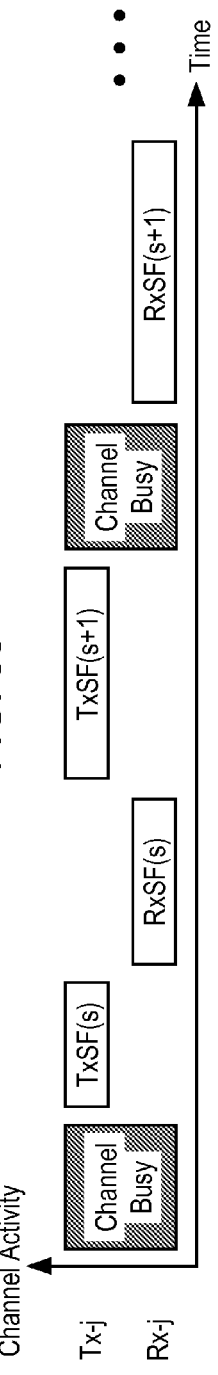
FIG. 34
FIG. 35
FIG. 36

INTELLIGENT BACKHAUL RADIO

CROSS-REFERENCE TO RELATED APPLICATION

The present application is a continuation application of U.S. patent application Ser. No. 13/212,036, filed on Aug. 17, 2011, and the disclosure of which is hereby incorporated herein by reference in its entirety.

BACKGROUND

1. Field

The present disclosure relates generally to data networking and in particular to a backhaul radio for connecting remote edge access networks to core networks.

2. Related Art

Data networking traffic has grown at approximately 100% per year for over 20 years and continues to grow at this pace. Only transport over optical fiber has shown the ability to keep pace with this ever-increasing data networking demand for core data networks. While deployment of optical fiber to an edge of the core data network would be advantageous from a network performance perspective, it is often impractical to connect all high bandwidth data networking points with optical fiber at all times. Instead, connections to remote edge access networks from core networks are often achieved with wireless radio, wireless infrared, and/or copper wireline technologies.

Radio, especially in the form of cellular or wireless local area network (WLAN) technologies, is particularly advantageous for supporting mobility of data networking devices. However, cellular base stations or WLAN access points inevitably become very high data bandwidth demand points that require continuous connectivity to an optical fiber core network.

When data aggregation points, such as cellular base station sites, WLAN access points, or other local area network (LAN) gateways, cannot be directly connected to a core optical fiber network, then an alternative connection, using, for example, wireless radio or copper wireline technologies, must be used. Such connections are commonly referred to as "backhaul."

Many cellular base stations deployed to date have used copper wireline backhaul technologies such as T1, E1, DSL, etc. when optical fiber is not available at a given site. However, the recent generations of HSPA+ and LTE cellular base stations have backhaul requirements of 100 Mb/s or more, especially when multiple sectors and/or multiple mobile network operators per cell site are considered. WLAN access points commonly have similar data backhaul requirements. These backhaul requirements cannot be practically satisfied at ranges of 300 m or more by existing copper wireline technologies. Even if LAN technologies such as Ethernet over multiple dedicated twisted pair wiring or hybrid fiber/coax technologies such as cable modems are considered, it is impractical to backhaul at such data rates at these ranges (or at least without adding intermediate repeater equipment). Moreover, to the extent that such special wiring (i.e., CAT 5/6 or coax) is not presently available at a remote edge access network location; a new high capacity optical fiber is advantageously installed instead of a new copper connection.

Rather than incur the large initial expense and time delay associated with bringing optical fiber to every new location, it has been common to backhaul cell sites, WLAN hotspots, or LAN gateways from offices, campuses, etc. using microwave radios. An exemplary backhaul connection using the microwave radios 132 is shown in FIG. 1. Traditionally, such microwave radios 132 for backhaul have been mounted on high towers 112 (or high rooftops of multi-story buildings) as shown in FIG. 1, such that each microwave radio 132 has an unobstructed line of sight (LOS) 136 to the other. These microwave radios 132 can have data rates of 100 Mb/s or higher at unobstructed LOS ranges of 300 m or longer with latencies of 5 ms or less (to minimize overall network latency).

Traditional microwave backhaul radios 132 operate in a Point to Point (PTP) configuration using a single "high gain" (typically >30 dBi or even >40 dBi) antenna at each end of the link 136, such as, for example, antennas constructed using a parabolic dish. Such high gain antennas mitigate the effects of unwanted multipath self-interference or unwanted co-channel interference from other radio systems such that high data rates, long range and low latency can be achieved. These high gain antennas however have narrow radiation patterns.

Furthermore, high gain antennas in traditional microwave backhaul radios 132 require very precise, and usually manual, physical alignment of their narrow radiation patterns in order to achieve such high performance results. Such alignment is almost impossible to maintain over extended periods of time unless the two radios have a clear unobstructed line of sight (LOS) between them over the entire range of separation. Furthermore, such precise alignment makes it impractical for any one such microwave backhaul radio to communicate effectively with multiple other radios simultaneously (i.e., a "point to multipoint" (PMP) configuration).

In wireless edge access applications, such as cellular or WLAN, advanced protocols, modulation, encoding and spatial processing across multiple radio antennas have enabled increased data rates and ranges for numerous simultaneous users compared to analogous systems deployed 5 or 10 years ago for obstructed LOS propagation environments where multipath and co-channel interference were present. In such systems, "low gain" (usually <6 dBi) antennas are generally used at one or both ends of the radio link both to advantageously exploit multipath signals in the obstructed LOS environment and allow operation in different physical orientations as would be encountered with mobile devices. Although impressive performance results have been achieved for edge access, such results are generally inadequate for emerging backhaul requirements of data rates of 100 Mb/s or higher, ranges of 300 m or longer in obstructed LOS conditions, and latencies of 5 ms or less.

In particular, "street level" deployment of cellular base stations, WLAN access points or LAN gateways (e.g., deployment at street lamps, traffic lights, sides or rooftops of single or low-multiple story buildings) suffers from problems because there are significant obstructions for LOS in urban environments (e.g., tall buildings, or any environments where tall trees or uneven topography are present).

FIG. 1 illustrates edge access using conventional unobstructed LOS PTP microwave radios 132. The scenario depicted in FIG. 1 is common for many $2^{nd}$ Generation (2G) and $3^{rd}$ Generation (3G) cellular network deployments using "macrocells". In FIG. 1, a Cellular Base Transceiver Station (BTS) 104 is shown housed within a small building 108 adjacent to a large tower 112. The cellular antennas 116 that communicate with various cellular subscriber devices 120 are mounted on the towers 112. The PTP microwave radios 132 are mounted on the towers 112 and are connected to the BTSs 104 via an nT1 interface. As shown in FIG. 1 by line 136, the radios 132 require unobstructed LOS.

The BTS on the right 104a has either an nT1 copper interface or an optical fiber interface 124 to connect the BTS 104a to the Base Station Controller (BSC) 128. The BSC 128 either is part of or communicates with the core network of the cellular network operator. The BTS on the left 104b is identical to the BTS on the right 104a in FIG. 1 except that the BTS on the left 104b has no local wireline nT1 (or optical fiber equivalent) so the nT1 interface is instead connected to a conventional PTP microwave radio 132 with unobstructed LOS to the tower on the right 112a. The nT1 interfaces for both BTSs 104a, 104b can then be backhauled to the BSC 128 as shown in FIG. 1.

FIG. 2 is a block diagram of the major subsystems of a conventional PTP microwave radio 200 for the case of Time-Division Duplex (TDD) operation, and FIG. 3 is a block diagram of the major subsystems of a conventional PTP microwave radio 300 for the case of Frequency-Division Duplex (FDD) operation.

As shown in FIG. 2 and FIG. 3, the conventional PTP microwave radio traditionally uses one or more (i.e. up to "n") T1 interfaces 204 (or in Europe, E1 interfaces). These interfaces 204 are common in remote access systems such as 2G cellular base stations or enterprise voice and/or data switches or edge routers. The T1 interfaces are typically multiplexed and buffered in a bridge (e.g., the Interface Bridge 208, 308) that interfaces with a Media Access Controller (MAC) 212, 312.

The MAC 212, 312 is generally denoted as such in reference to a sub-layer of Layer 2 within the Open Systems Interconnect (OSI) reference model. Major functions performed by the MAC include the framing, scheduling, prioritizing (or "classifying"), encrypting and error checking of data sent from one such radio at FIG. 2 or FIG. 3 to another such radio. The data sent from one radio to another is generally in a "user plane" if it originates at the T1 interface(s) or in the "control plane" if it originates internally such as from the Radio Link Controller (RLC) 248, 348 shown in FIG. 2 or FIG. 3. A typical MAC frame format 400 (known as a MAC protocol data unit, or "MPDU") with header 404, frame body 408 and frame check sum (FCS) 412 is shown in FIG. 4.

With reference to FIGS. 2 and 3, the Modem 216, 316 typically resides within the "baseband" portion of the Physical (PHY) layer 1 of the OSI reference model. In conventional PTP radios, the baseband PHY, depicted by Modem 216, 316, typically implements scrambling, forward error correction encoding, and modulation mapping for a single RF carrier in the transmit path. In receive, the modem typically performs the inverse operations of demodulation mapping, decoding and descrambling. The modulation mapping is conventionally Quadrature Amplitude Modulation (QAM) implemented with In-phase (I) and Quadrature-phase (Q) branches.

The Radio Frequency (RF) 220, 320 also resides within the PHY layer of the radio. In conventional PTP radios, the RF 220, 320 typically includes a single transmit chain (Tx) 224, 324 that includes I and Q digital to analog converters (DACs), a vector modulator, optional upconverters, a programmable gain amplifier, one or more channel filters, and one or more combinations of a local oscillator (LO) and a frequency synthesizer. Similarly, the RF 220, 320 also typically includes a single receive chain (Rx) 228, 328 that includes I and Q analog to digital converters (ADCs), one or more combinations of an LO and a frequency synthesizer, one or more channel filters, optional downconverters, a vector demodulator and an automatic gain control (AGC) amplifier. Note that in many cases some of the one or more LO and frequency synthesizer combinations can be shared between the Tx and Rx chains.

As shown in FIGS. 2 and 3, conventional PTP radios 200, 300 also include a single power amplifier (PA) 232, 332. The PA 232, 332 boosts the transmit signal to a level appropriate for radiation from the antenna in keeping with relevant regulatory restrictions and instantaneous link conditions. Similarly, such conventional PTP radios 232, 332 typically also include a single low-noise amplifier (LNA) 236, 336 as shown in FIGS. 2 and 3. The LNA 236, 336 boosts the received signal at the antenna while minimizing the effects of noise generated within the entire signal path.

As described above, FIG. 2 illustrates a conventional PTP radio 200 for the case of TDD operation. As shown in FIG. 2, conventional PTP radios 200 typically connect the antenna 240 to the PA 232 and LNA 236 via a band-select filter 244 and a single-pole, single-throw (SPST) switch 242.

As described above, FIG. 3 illustrates a conventional PTP radio 300 for the case of FDD operation. As shown in FIG. 3, in conventional PTP radios 300, then antenna 340 is typically connected to the PA 332 and LNA 336 via a duplexer filter 344. The duplexer filter 344 is essentially two band-select filters (tuned respectively to the Tx and Rx bands) connected at a common point.

In the conventional PTP radios shown in FIGS. 2 and 3, the antenna 240, 340 is typically of very high gain such as can be achieved by a parabolic dish so that gains of typically >30 dBi (or even sometimes >40 dBi), can be realized. Such an antenna usually has a narrow radiation pattern in both the elevation and azimuth directions. The use of such a highly directive antenna in a conventional PTP radio link with unobstructed LOS propagation conditions ensures that the modem 216, 316 has insignificant impairments at the receiver (antenna 240, 340) due to multipath self-interference and further substantially reduces the likelihood of unwanted co-channel interference due to other nearby radio links.

Although not explicitly shown in FIGS. 2 and 3, the conventional PTP radio may use a single antenna structure with dual antenna feeds arranged such that the two electromagnetic radiation patterns emanated by such an antenna are nominally orthogonal to each other. An example of this arrangement is a parabolic dish. Such an arrangement is usually called dual-polarized and can be achieved either by orthogonal vertical and horizontal polarizations or orthogonal left-hand circular and right-hand circular polarizations.

When duplicate modem blocks, RF blocks, and PA/LNA/switch blocks are provided in a conventional PTP radio, then connecting each PHY chain to a respective polarization feed of the antenna allows theoretically up to twice the total amount of information to be communicated within a given channel bandwidth to the extent that cross-polarization self-interference can be minimized or cancelled sufficiently. Such a system is said to employ "dual-polarization" signaling.

When an additional circuit (not shown) is added to FIG. 2 that can provide either the RF Tx signal or its anti-phase equivalent to either one or both of the two polarization feeds of such an antenna, then "cross-polarization" signaling can be used to effectively expand the constellation of the modem within any given symbol rate or channel bandwidth. With two polarizations and the choice of RF signal or its anti-phase, then an additional two information bits per symbol can be communicated across the link. Theoretically, this can be extended and expanded to additional phases, representing additional information bits. At the receiver, for example, a circuit (not shown) could detect if the two received polarizations are anti-phase with respect to each other, or not, and then combine appropriately such that the demodulator in the modem block can determine the absolute phase and hence deduce the values of the two additional information bits. Cross-polarization signaling has the advantage over dual-polarization signaling in that it is generally less sensitive to cross-polarization self-interference but for high order constellations such as 64-QAM or 256-QAM, the relative increase in channel efficiency is smaller.

In the conventional PTP radios shown in FIGS. 2 and 3, substantially all the components are in use at all times when the radio link is operative. However, many of these components have programmable parameters that can be controlled dynamically during link operation to optimize throughout and reliability for a given set of potentially changing operating conditions. The conventional PTP radios of FIGS. 2 and 3 control these link parameters via a Radio Link Controller (RLC) 248, 348. The RLC functionality is also often described as a Link Adaptation Layer that is typically implemented as a software routine executed on a microcontroller within the radio that can access the MAC 212, 312, Modem 216, 316, RF 220, 320 and/or possibly other components with controllable parameters. The RLC 248, 348 typically can both vary parameters locally within its radio and communicate with a peer RLC at the other end of the conventional PTP radio link via "control frames" sent by the MAC 212, 312 with an appropriate identifying field within a MAC Header 404 (in reference to FIG. 4).

Typical parameters controllable by the RLC 248, 348 for the Modem 216, 316 of a conventional PTP radio include encoder type, encoding rate, constellation selection and reference symbol scheduling and proportion of any given PHY Protocol Data Unit (PPDU). Typical parameters controllable by the RLC 248, 348 for the RF 220, 320 of a conventional PTP radio include channel frequency, channel bandwidth, and output power level. To the extent that a conventional PTP radio employs two polarization feeds within its single antenna, additional parameters may also be controlled by the RLC 248, 348 as self-evident from the description above.

In conventional PTP radios, the RLC 248, 348 decides, usually autonomously, to attempt such parameter changes for the link in response to changing propagation environment characteristics such as, for example, humidity, rain, snow, or co-channel interference. There are several well-known methods for determining that changes in the propagation environment have occurred such as monitoring the receive signal strength indicator (RSSI), the number of or relative rate of FCS failures at the MAC 212, 312, and/or the relative value of certain decoder accuracy metrics. When the RLC 248, 348 determines that parameter changes should be attempted, it is necessary in most cases that any changes at the transmitter end of the link become known to the receiver end of the link in advance of any such changes. For conventional PTP radios, and similarly for many other radios, there are at least two well-known techniques which in practice may not be mutually exclusive. First, the RLC 248, 348 may direct the PHY, usually in the Modem 216, 316 relative to FIGS. 2 and 3, to pre-pend a PHY layer convergence protocol (PLCP) header to a given PPDU that includes one or more (or a fragment thereof) given MPDUs wherein such PLCP header has information fields that notify the receiving end of the link of parameters used at the transmitting end of the link. Second, the RLC 248, 348 may direct the MAC 212, 312 to send a control frame, usually to a peer RLC 248, 348, including various information fields that denote the link adaptation parameters either to be deployed or to be requested or considered.

The foregoing describes at an overview level the typical structural and operational features of conventional PTP radios which have been deployed in real-world conditions for many radio links where unobstructed (or substantially unobstructed) LOS propagation was possible. The conventional PTP radio on a whole is completely unsuitable for obstructed LOS or PMP operation.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Some embodiments of the claimed invention are directed to backhaul radios that are compact, light and low power for street level mounting, operate at 100 Mb/s or higher at ranges of 300 m or longer in obstructed LOS conditions with low latencies of 5 ms or less, can support PTP and PMP topologies, use radio spectrum resources efficiently and do not require precise physical antenna alignment. Radios with such exemplary capabilities as described by multiple various embodiments are referred to herein by the term "Intelligent Backhaul Radio" (IBR).

According to an aspect of the invention, an intelligent backhaul radio is disclosed that includes one or more demodulator cores, wherein each demodulator core demodulates one or more receive symbol streams to produce a respective receive data interface stream; a plurality of receive RF chains to convert from a plurality of receive RF signals to a plurality of respective receive chain output signals; a frequency selective receive path channel multiplexer, interposed between the one or more demodulator cores and the plurality of receive RF chains, to produce the one or more receive symbol streams provided to the one or more demodulator cores from the plurality of receive chain output signals; an antenna array including: a plurality of directive gain antenna elements; and one or more selectable RF connections that selectively couple certain of the plurality of directive gain antenna elements to certain of the plurality of receive RF chains, wherein the number of directive gain antenna elements that can be selectively coupled to receive RF chains exceeds the number of receive RF chains that can accept receive RF signals from the one or more selectable RF connections; and a radio resource controller, wherein the radio resource controller sets or causes to be set the specific selective couplings between the certain of the plurality of directive gain antenna elements and the certain of the plurality of receive RF chains.

At least two or more of the directive gain antenna elements that can be selectively coupled to receive RF chains may be oriented in different directions to provide directional diversity.

The set of directive gain antenna elements that can be selectively coupled to receive RF chains may include directive gain antenna elements of at least two different orthogonal polarizations.

The set of the directive gain antenna elements that can be selectively coupled to receive RF chains may be divided between one subset with a first polarization and a second subset with a second polarization. The first polarization may be vertical and the second polarization may be horizontal. The first polarization may be left-hand circular and the second polarization may be right-hand circular.

The set of receive RF chains that can accept receive RF signals from the one or more selectable RF connections may be divided between one subset that accepts receive RF signals from directive gain antenna elements with the first polarization and a second subset that accepts receive RF signals from directive gain antenna elements with a second polarization.

The directive gain antenna elements that can be selectively coupled to receive RF chains may be arranged on a plurality of facets with one or more directive gain antenna elements per facet, and each facet may be oriented at a different angle in the azimuth relative to at least one other facet.

The one or more selectable RF connections may be arranged such that any receive RF chains that can accept receive RF signals from the one or more selectable RF connections can be selectively coupled to directive gain antenna elements from more than one facet.

The one or more selectable RF connections may be arranged such that the set of receive RF chains that can accept receive RF signals from the one or more selectable RF connections can be selectively coupled to directive gain antenna elements from any two facets sharing a common projected edge.

The one or more selectable RF connections may be arranged such the set of receive RF chains that can accept receive RF signals from the one or more selectable RF connections can be selectively coupled to directive gain antenna elements from any two facets closest to each other in azimuthal angle amongst all facets include directive gain antenna elements that can be selectively coupled to receive RF chains.

Each facet may include directive gain antenna elements of at least two different orthogonal polarizations.

One or more directive gain antenna elements or other antenna elements within the antenna array may be coupled to one or more respective receive RF chains other than by said one or more selectable RF connections.

The one or more respective receive RF chains may be coupled to the one or more directive gain antenna elements or other antenna elements within the antenna array other than by said one or more selectable RF connections may be each coupled to a respective Discrete Fourier Transformer within the frequency selective receive path channel multiplexer.

The intelligent backhaul radio may further include one or more modulator cores, wherein each modulator core modulates a respective transmit data interface stream to produce one or more transmit symbol streams; a plurality of transmit RF chains to convert from a plurality of transmit chain input signals to a plurality of respective transmit RF signals; a transmit path channel multiplexer, interposed between the one or more modulator cores and the plurality of transmit RF chains, to produce the plurality of transmit chain input signals provided to the plurality of transmit RF chains from the one or more transmit symbol streams; and, wherein the antenna array further includes a plurality of RF connections to couple at least certain of the plurality of directive gain antenna elements to the plurality of transmit RF chains.

The number of transmit RF chains may equal the number of transmit symbol streams.

The transmit path channel multiplexer may couple the plurality of transmit RF chains to respective transmit symbol streams such that each respective transmit chain input signal includes information from only one respective transmit symbol stream.

The number of transmit RF chains may exceed the number of transmit symbol streams, and the transmit path channel multiplexer may couple at least one set of two or more of the plurality of transmit RF chains to a particular transmit symbol stream such that each transmit chain input signal for a particular set of two or more of the plurality of transmit RF chains includes information from only the one respective particular transmit symbol stream.

At least one or more of the RF connections may be selectable RF connections that selectively couple certain of the plurality of directive gain antenna elements to certain of the plurality of transmit RF chains, and wherein the number of directive gain antenna elements that can be selectively coupled to transmit RF chains may exceed the number of transmit RF chains that can provide transmit RF signals to the one or more selectable RF connections.

At least one of the directive gain antenna elements that can be selectively coupled to transmit RF chains may also be one of the directive gain antenna elements that can be selectively coupled to receive RF chains.

All of the directive gain antenna elements that can be selectively coupled to transmit RF chains may also be directive gain antenna elements that can be selectively coupled to receive RF chains.

None of the plurality of directive gain antenna elements that can be coupled to the plurality of transmit RF chains may also be a directive gain antenna element that can be coupled to any receive RF chain.

The number of directive gain antenna elements that can be coupled to the plurality of transmit RF chains may equal the number of transmit RF chains.

The antenna array may further include a plurality of transmit power amplifiers, wherein each transmit power amplifier can be coupled to at least one of the plurality of transmit RF chains and to at least one of the plurality of directive gain antenna elements that can be coupled to the plurality of transmit RF chains.

At least two or more of the directive gain antenna elements that can be coupled to transmit RF chains may be oriented in different directions to provide directional diversity.

The set of directive gain antenna elements that can be coupled to transmit RF chains may include directive gain antenna elements of at least two different orthogonal polarizations.

The set of the directive gain antenna elements that can be coupled to transmit RF chains may be divided between one subset with a first transmit polarization and a second subset with a second transmit polarization.

The first transmit polarization may be vertical and the second transmit polarization may be horizontal.

The first transmit polarization may be left-hand circular and the second transmit polarization may be right-hand circular. The set of transmit RF chains that can provide transmit RF signals to the one or more RF connections may be divided between one subset that provides transmit RF signals to directive gain antenna elements with the first transmit polarization and a second subset that provides transmit RF signals to directive gain antenna elements with the second transmit polarization.

At least two of the directive gain antenna elements that can be coupled to transmit RF chains may be each arranged on separate respective facets amongst a plurality of facets with one or more directive gain antenna elements per facet, and each facet may be oriented at a different angle in the azimuth relative to at least one other facet.

At least one of the directive gain antenna elements that can be coupled to transmit RF chains may be arranged on a facet with no directive gain antenna element that can be coupled to any receive RF chain.

All of the directive gain antenna elements that can be coupled to transmit RF chains may be arranged on one or more facets each with no directive gain antenna element that can be coupled to any receive RF chain.

The radio resource controller may set or cause to be set the specific selective couplings between the certain of the plurality of directive gain antenna elements and the certain of the plurality of transmit RF chains.

The radio resource controller may set or cause to be set the specific selective couplings between the certain of the plurality of directive gain antenna elements and the certain of the plurality of transmit RF chains such that the directive gain antenna elements selectively coupled to transmit RF chains for a transmit superframe are those selectively coupled to receive RF chains in an immediately preceding receive superframe.

Each of the one or more modulator cores may include at least one encoder; at least one symbol grouper; and at least one symbol mapper.

At least one of the one or more modulator cores may produce at least two transmit symbol streams and such at least one of the one or more modulator cores may further include a stream parser, interposed between the transmit data interface and the at least two symbol groupers, to split a stream of data within the modulator core into two or more sub-streams.

Each of the one or more modulator cores may further include at least one scrambler.

Each of the one or more modulator cores may further include at least one interleaver.

Each of the one or more demodulator cores may include at least one decoder; and at least one soft decision symbol demapper.

At least one of the one or more demodulator cores may demodulatee at least two receive symbol streams and wherein such at least one of the one or more demodulator cores may further include a stream multiplexer, interposed between the receive data interface and the at least two soft decision symbol demappers, to combine two or more sub-streams of data within the demodulator core into a single stream.

Each of the one or more demodulator cores may further include at least one descrambler.

Each of the one or more demodulator cores may further include at least one deinterleaver.

The transmit path channel multiplexer may operate on one or more successive blocks of symbols from the one or more transmit symbol streams and the transmit path channel multiplexer may include at least one cyclic prefix adder that prepends a fraction of the block of transmit chain time domain samples to be transmitted sequentially last in time to such block to produce a cyclically-extended block of transmit chain time domain samples.

The transmit path channel multiplexer may further include at least one transmit channel equalizer. Each transmit channel equalizer may produce transmit chain channel-equalized symbols by applying respective stream-specific and chain-specific transmit weights to the successive blocks of symbols from the one or more transmit symbol streams coupled to each transmit channel equalizer.

The respective stream-specific and chain-specific transmit weights applied to the successive blocks of symbols from the one or more transmit symbol streams may vary with relative symbol position within such blocks.

The relative symbol position may represent a particular frequency component of the transmit chain input signal.

The frequency selective receive path channel multiplexer may operate on one or more successive blocks of samples from the plurality of receive chain output signals and the frequency selective receive path channel multiplexer may include a plurality of respective cyclic prefix removers that discard a fraction of the samples within the one or more successive blocks of samples from the plurality of respective receive chain output signals corresponding to a known cyclic prefix length for a set of one or more transmit symbol streams expected to be present within the plurality of receive chain output signals; a complex Discrete Fourier Transformer coupled to each respective cyclic prefix remover, wherein each complex Discrete Fourier Transformer decomposes the cyclic prefix removed one or more successive blocks of samples from the plurality of receive chain output signals into a set of receive chain frequency domain subchannel samples; and one or more receive channel equalizers coupled to the plurality of complex Discrete Fourier Transformers, wherein each respective receive channel equalizer produces a set of channel-equalized frequency domain estimates representative of a respective one of the one or more transmit symbol streams expected to be present within the plurality of receive chain output signals by applying respective stream-specific and chain-specific receive weights to the respective sets of receive chain frequency domain subchannel samples, and wherein said stream-specific and chain-specific receive weights applied to the respective sets of receive chain frequency domain subchannel samples vary with relative frequency domain subchannel position within such sets.

The intelligent backhaul radio may further include a channel equalizer coefficients generator, wherein the channel equalizer coefficients generator determines the stream-specific and chain-specific receive weights that vary with relative frequency domain subchannel position based on comparison of sets of receive chain frequency domain subchannel samples with the expected samples corresponding to known blocks of training pilots associated with each of the one or more transmit symbol streams expected to be present within the plurality of receive chain output signals.

The stream-specific and chain-specific transmit weights may also be determined by the channel equalizer coefficients generator.

A respective block of training pilots from a pilot symbol library within or coupled to the transmit path channel multiplexer may be selectively applied to each of the one or more transmit symbol streams.

A pilot symbol library within or coupled to the transmit path channel multiplexer may supply pilot symbols for selective insertion at predetermined positions within certain successive blocks of symbols from the one or more transmit symbol streams.

A respective block of training pilots from a pilot data library within or coupled to one or more modulator cores may be selectively applied to each of the one or more transmit symbol streams.

A pilot data library within or coupled to one or more modulator cores may supply pilot data for selective insertion at predetermined positions within certain successive blocks of symbols from the one or more transmit symbol streams.

Preamble symbols from a preamble symbol library within or coupled to the transmit path channel multiplexer may be selectively applied to at least one of the one or more transmit symbol streams.

Preamble samples from a preamble samples library within or coupled to the transmit path channel multiplexer may be selectively applied to at least one of the plurality of transmit chain input signals.

The intelligent backhaul radio may further include an acquisition/synchronization detector. The acquisition/synchronization detector may provide symbol boundary and block boundary timing references.

The intelligent backhaul radio may further include an interface bridge configured to couple the intelligent backhaul radio to a data network, the interface bridge including one or more Ethernet interfaces to couple the interface bridge to the data network, the interface bridge multiplexing and buffering the one or more Ethernet interfaces; and a media access controller to exchange data to and from the data network via coupling to at least the interface bridge and to and from at least one other intelligent backhaul radio via coupling to at least the one or more modulator cores and the one or more demodulator cores, wherein the media access controller outputs transmit data to a transmit path and inputs receive data from a receive path.

The data network may be a remote data network. The data network may be a core data network.

The intelligent backhaul radio may further include a transmit physical layer convergence protocol generator; and a receive physical layer convergence protocol analyzer. The transmit physical layer convergence protocol generator, interposed between the media access controller and the one or more modulator cores, may prepend or append additional information bits to the transmit data outputted by the media access controller in the process of composing the one or more transmit data interface streams to the one or more modulator cores. The receive physical layer convergence protocol analyzer, interposed between the media access controller and the one or more demodulator cores, may detect and analyze additional information bits prepended or appended within the one or more receive data interface streams provided by the one or more demodulator cores in the process of composing the receive data inputted to the media access controller.

The intelligent backhaul radio may further include a radio link controller, wherein the radio link controller sets or causes to be set certain modulation mapping or forward error correction encoding parameters for the one or more modulator cores.

The radio link controller may set or cause to be set certain parameters within the plurality of transmit RF chains or a plurality of transmit power amplifiers each coupled to a respective transmit RF chain related to the transmitted signal power from the intelligent backhaul radio.

The radio link controller may compose or cause to be composed a control frame to be sent via the media access controller to another radio link controller in another intelligent backhaul radio.

The radio resource controller may compose or cause to be composed a control frame to be sent via the media access controller to another radio resource controller in another intelligent backhaul radio.

The intelligent backhaul radio may further include an intelligent backhaul management system agent that sets or causes to be set certain policies relevant to the radio resource controller, wherein the intelligent backhaul management system agent exchanges information with other intelligent backhaul management system agents within other intelligent backhaul radios or with one or more intelligent backhaul management system servers.

According to another aspect of the invention, an intelligent backhaul radio is disclosed that includes one or more demodulator cores, wherein each demodulator core demodulates one or more receive symbol streams to produce a respective receive data interface stream, each of the one or more demodulator cores including at least one decoder; and at least one soft decision symbol demapper. The intelligent backhaul radio also includes a plurality of receive RF chains to convert from a plurality of receive RF signals to a plurality of respective receive chain output signals. The intelligent backhaul radio also includes a frequency selective receive path channel multiplexer, interposed between the one or more demodulator cores and the plurality of receive RF chains, to produce the one or more receive symbol streams provided to the one or more demodulator cores from the plurality of receive chain output signals wherein the frequency selective receive path channel multiplexer operates on one or more successive blocks of samples from the plurality of receive chain output signals and the frequency selective receive path channel multiplexer includes a plurality of respective cyclic prefix removers that discard a fraction of the samples within the one or more successive blocks of samples from the plurality of respective receive chain output signals corresponding to a known cyclic prefix length for a set of one or more transmit symbol streams expected to be present within the plurality of receive chain output signals; a plurality of complex Discrete Fourier Transformers, each complex Discrete Fourier Transformer coupled to each respective cyclic prefix remover, wherein each complex Discrete Fourier Transformer decomposes the cyclic prefix removed one or more successive blocks of samples from the plurality of receive chain output signals into a set of receive chain frequency domain subchannel samples; and one or more receive channel equalizers coupled to the plurality of complex Discrete Fourier Transformers, wherein each respective receive channel equalizer produces a set of channel-equalized frequency domain estimates representative of a respective one of the one or more transmit symbol streams expected to be present within the plurality of receive chain output signals by applying respective stream-specific and chain-specific receive weights to the respective sets of receive chain frequency domain subchannel samples, and wherein said stream-specific and chain-specific receive weights applied to the respective sets of receive chain frequency domain subchannel samples vary with relative frequency domain subchannel position within such sets. The intelligent backhaul radio also includes one or more modulator cores, wherein each modulator core modulates a respective transmit data interface stream to produce one or more transmit symbol streams wherein each of the one or more modulator cores includes at least one encoder; at least one symbol grouper; and at least one symbol mapper. The intelligent backhaul radio also includes a plurality of transmit RF chains to convert from a plurality of transmit chain input signals to a plurality of respective transmit RF signals. The intelligent backhaul radio also includes a transmit path channel multiplexer, interposed between the one or more modulator cores and the plurality of transmit RF chains, to produce the plurality of transmit chain input signals provided to the plurality of transmit RF chains from the one or more transmit symbol streams wherein the transmit path channel multiplexer operates on one or more successive blocks of symbols from the one or more transmit symbol streams and the transmit path channel multiplexer includes at least one cyclic prefix adder that prepends a fraction of the block of transmit chain time domain samples to be transmitted sequentially last in time to such block to produce a cyclically-extended block of transmit chain time domain samples. The intelligent backhaul radio also includes an antenna array including a plurality of directive gain antenna elements; one or more selectable RF connections that selectively couple certain of the plurality of directive gain antenna elements to certain of the plurality of receive RF chains, wherein the number of directive gain antenna elements that can be selectively coupled to receive RF chains exceeds the number of receive RF chains that can accept receive RF signals from the one or more selectable RF connections; and a plurality of RF connections to couple at least certain of the plurality of directive gain antenna elements to the plurality of transmit RF chains; wherein at least two or more of the directive gain antenna elements that can be selectively coupled to receive RF chains are oriented in different directions to provide directional diversity, wherein the set of directive gain antenna elements that can be selectively coupled to receive RF chains include directive gain antenna elements of at least two different orthogonal polarizations, wherein the set of the directive gain antenna elements that can be selectively coupled to receive RF chains is divided between one subset with a first polarization and a second subset with a second polarization, and wherein the first polarization is vertical and the second polarization is horizontal. The intelligent backhaul radio also includes a radio resource controller, wherein the radio resource controller sets or causes to be set the specific selective couplings between the certain of the plurality of directive gain antenna elements and the certain of the plurality of receive RF chains. The intelligent backhaul radio also includes an interface bridge configured to couple the intelligent backhaul radio to a data network, the interface bridge including one or more Ethernet interfaces to couple the interface bridge to the data network, the interface bridge multiplexing and buffering the one or more Ethernet interfaces. The intelligent backhaul radio also includes a media access controller to exchange data to and from the data network via coupling to at least the interface bridge and to and from at least one other intelligent backhaul radio via coupling to at least the one or more modulator cores and the one or more demodulator cores, wherein the media access controller outputs transmit data to a transmit path and inputs receive data from a receive path. The intelligent backhaul radio also includes a radio link controller, wherein the radio link controller sets or causes to be set certain modulation mapping or forward error correction encoding parameters for the one or more modulator cores.

The first polarization may be left-hand circular and the second polarization may be right-hand circular.

The set of receive RF chains that can accept receive RF signals from the one or more selectable RF connections may be divided between one subset that accepts receive RF signals from directive gain antenna elements with the first polarization and a second subset that accepts receive RF signals from directive gain antenna elements with a second polarization.

The directive gain antenna elements that can be selectively coupled to receive RF chains may be arranged on a plurality of facets with one or more directive gain antenna elements per facet, and each facet may be oriented at a different angle in the azimuth relative to at least one other facet. The one or more selectable RF connections may be arranged such that any receive RF chains that can accept receive RF signals from the one or more selectable RF connections can be selectively coupled to directive gain antenna elements from more than one facet. The one or more selectable RF connections may be arranged such that the set of receive RF chains that can accept receive RF signals from the one or more selectable RF connections can be selectively coupled to directive gain antenna elements from any two facets sharing a common projected edge. The one or more selectable RF connections may be arranged such the set of receive RF chains that can accept receive RF signals from the one or more selectable RF connections can be selectively coupled to directive gain antenna elements from any two facets closest to each other in azimuthal angle amongst all facets including directive gain antenna elements that can be selectively coupled to receive RF chains. Each facet may include directive gain antenna elements of at least two different orthogonal polarizations.

The number of transmit RF chains may equal the number of transmit symbol streams.

The transmit path channel multiplexer may couple the plurality of transmit RF chains to respective transmit symbol streams such that each respective transmit chain input signal includes information from only one respective transmit symbol stream.

The number of transmit RF chains may exceed the number of transmit symbol streams, and wherein transmit path channel multiplexer may couple at least one set of two or more of the plurality of transmit RF chains to a particular transmit symbol stream such that each transmit chain input signal for a particular set of two or more of the plurality of transmit RF chains includes information from only the one respective particular transmit symbol stream.

The set of the plurality of directive gain antenna elements that can be coupled to the plurality of transmit RF chains may be different than the set of the plurality of directive gain antenna elements that can be coupled to the plurality of receive RF chains.

The number of directive gain antenna elements that can be coupled to the plurality of transmit RF chains may equal the number of transmit RF chains.

The antenna array may further include a plurality of transmit power amplifiers, wherein each transmit power amplifier can be coupled to at least one of the plurality of transmit RF chains and to at least one of the plurality of directive gain antenna elements that can be coupled to the plurality of transmit RF chains.

At least two or more of the directive gain antenna elements that can be coupled to transmit RF chains may be oriented in different directions to provide directional diversity.

The set of directive gain antenna elements that can be coupled to transmit RF chains may include directive gain antenna elements of at least two different orthogonal polarizations.

The set of the directive gain antenna elements that can be coupled to transmit RF chains may be divided between one subset with a first transmit polarization and a second subset with a second transmit polarization. The first transmit polarization may be vertical and the second transmit polarization may be horizontal. The set of transmit RF chains that can provide transmit RF signals to the one or more RF connections may be divided between one subset that provides transmit RF signals to directive gain antenna elements with the first transmit polarization and a second subset that provides transmit RF signals to directive gain antenna elements with the second transmit polarization.

At least two of the directive gain antenna elements that can be coupled to transmit RF chains may be each arranged on separate respective facets amongst a plurality of facets with one or more directive gain antenna elements per facet, and each facet may be oriented at a different angle in the azimuth relative to at least one other facet.

At least one of the directive gain antenna elements that can be coupled to transmit RF chains may be arranged on a facet with no directive gain antenna element that can be coupled to any receive RF chain.

The directive gain antenna elements that can be coupled to transmit RF chains may be arranged on one or more facets, and the one or more facets do not include a directive gain antenna element that can be coupled to a receive RF chain.

At least one of the one or more modulator cores may produce at least two transmit symbol streams and such at least one of the one or more modulator cores may further include a stream parser, interposed between the transmit data interface and the at least two symbol groupers, to split a stream of data within the modulator core into two or more sub-streams.

At least one of the one or more demodulator cores may demodulate at least two receive symbol streams and such at least one of the one or more demodulator cores may further include a stream multiplexer, interposed between the receive data interface and the at least two soft decision symbol demappers, to combine two or more sub-streams of data within the demodulator core into a single stream.

The intelligent backhaul radio may further include a channel equalizer coefficients generator, wherein the channel equalizer coefficients generator determines stream-specific and chain-specific receive weights that vary with relative frequency domain subchannel position based on comparison of sets of receive chain frequency domain subchannel samples with the expected samples corresponding to known blocks of training pilots associated with each of the one or more transmit symbol streams expected to be present within the plurality of receive chain output signals.

A respective block of training pilots from a pilot symbol library within or coupled to the transmit path channel multiplexer may be selectively applied to each of the one or more transmit symbol streams.

A pilot symbol library within or coupled to the transmit path channel multiplexer may supply pilot symbols for selective insertion at predetermined positions within certain successive blocks of symbols from the one or more transmit symbol streams.

A respective block of training pilots from a pilot data library within or coupled to one or more modulator cores may be selectively applied to each of the one or more transmit symbol streams.

A pilot data library within or coupled to one or more modulator cores may supply pilot data for selective insertion at predetermined positions within certain successive blocks of symbols from the one or more transmit symbol streams.

The data network may be a remote data network.

The data network may be a core data network.

The radio link controller may set or cause to be set certain parameters within the plurality of transmit RF chains or a plurality of transmit power amplifiers each coupled to a respective transmit RF chain related to the transmitted signal power from the intelligent backhaul radio.

The radio link controller may compose or cause to be composed a control frame to be sent via the media access controller to another radio link controller in another intelligent backhaul radio.

The radio resource controller may compose or cause to be composed a control frame to be sent via the media access controller to another radio resource controller in another intelligent backhaul radio.

The intelligent backhaul radio may further include an intelligent backhaul management system agent that sets or causes to be set certain policies relevant to the radio resource controller, wherein the intelligent backhaul management system agent exchanges information with other intelligent backhaul management system agents within other intelligent backhaul radios or with one or more intelligent backhaul management system servers.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

FIG. 19 is a block diagram illustrating a modulator core j according to one embodiment of the invention.

FIG. 20 is a block diagram illustrating a demodulator core j according to one embodiment of the invention.

FIG. 23 is a block diagram illustrating a channel multiplexer (MUX) according to one embodiment of the invention.

FIG. 34 is a timing diagram illustrating channel activity for FDD with fixed superframe timing according to one embodiment of the invention.

FIG. 35 is a timing diagram illustrating channel activity for TDD with fixed superframe timing according to one embodiment of the invention.

FIG. 36 is a timing diagram illustrating channel activity for TDD/CSMA with variable superframe timing according to one embodiment of the invention.

DETAILED DESCRIPTION

Figure 5:
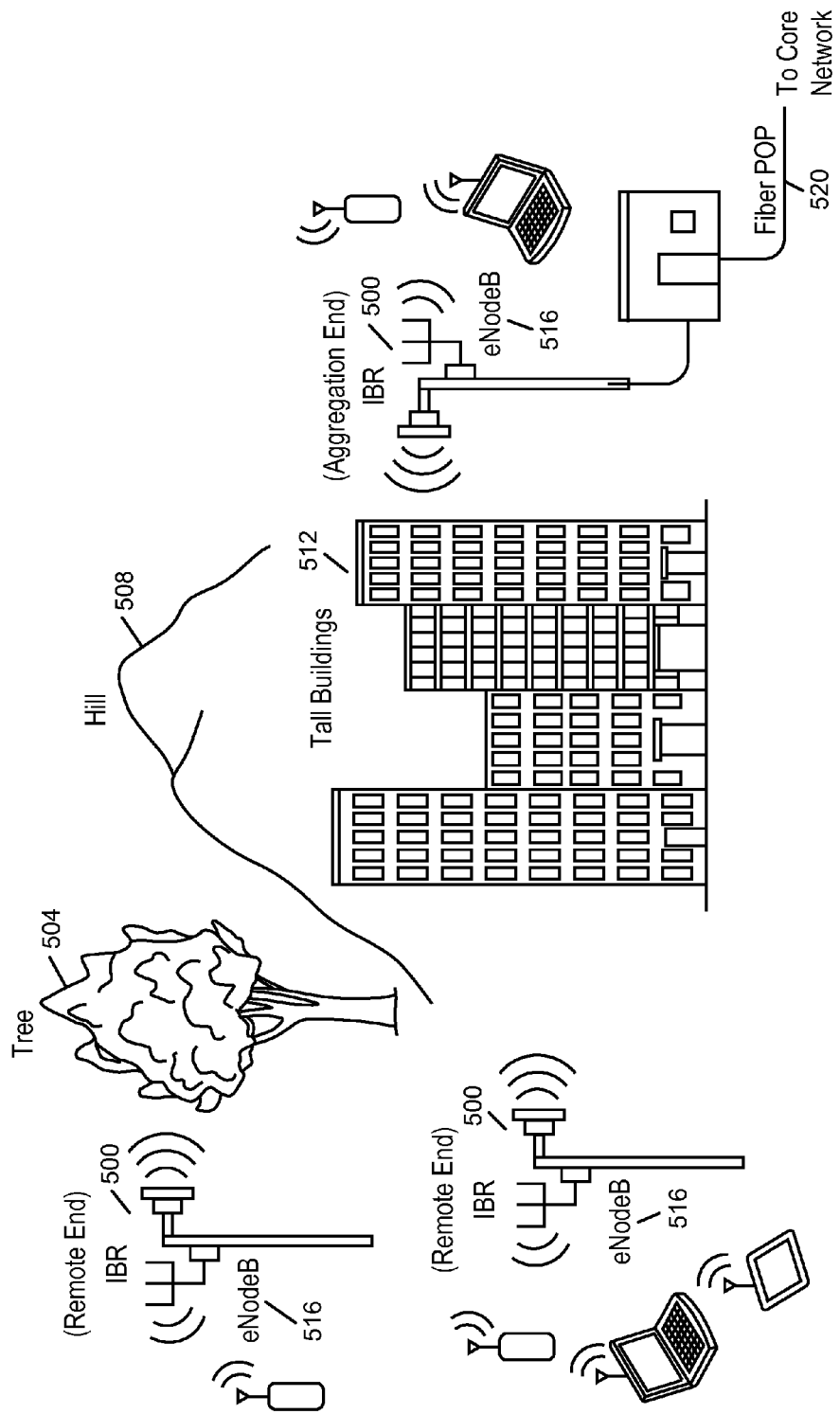
FIG. 5 is an illustration of intelligent backhaul radios (IBRs) deployed for cellular base station backhaul with obstructed LOS according to one embodiment of the invention.

FIG. 5 illustrates deployment of intelligent backhaul radios (IBRs) in accordance with an embodiment of the invention. As shown in FIG. 5, the IBRs 500 are deployable at street level with obstructions such as trees 504, hills 508, buildings 512, etc. between them. The IBRs 500 are also deployable in configurations that include point to multipoint (PMP), as shown in FIG. 5, as well as point to point (PTP). In other words, each IBR 500 may communicate with more than one other IBR 500.

For 3G and especially for 4$^{th}$ Generation (4G), cellular network infrastructure is more commonly deployed using "microcells" or "picocells." In this cellular network infrastructure, compact base stations (eNodeBs) 516 are situated outdoors at street level. When such eNodeBs 516 are unable to connect locally to optical fiber or a copper wireline of sufficient data bandwidth, then a wireless connection to a fiber "point of presence" (POP) requires obstructed LOS capabilities, as described herein.

For example, as shown in FIG. 5, the IBRs 500 include an Aggregation End IBR (AE-IBR) and Remote End IBRs (RE-IBRs). The eNodeB 516 of the AE-IBR is typically connected locally to the core network via a fiber POP 520. The RE-IBRs and their associated eNodeBs 516 are typically not connected to the core network via a wireline connection; instead, the RE-IBRs are wirelessly connected to the core network via the AE-IBR. As shown in FIG. 5, the wireless connection between the IBRs include obstructions (i.e., there may be an obstructed LOS connection between the RE-IBRs and the AE-IBR).

Figure 6:
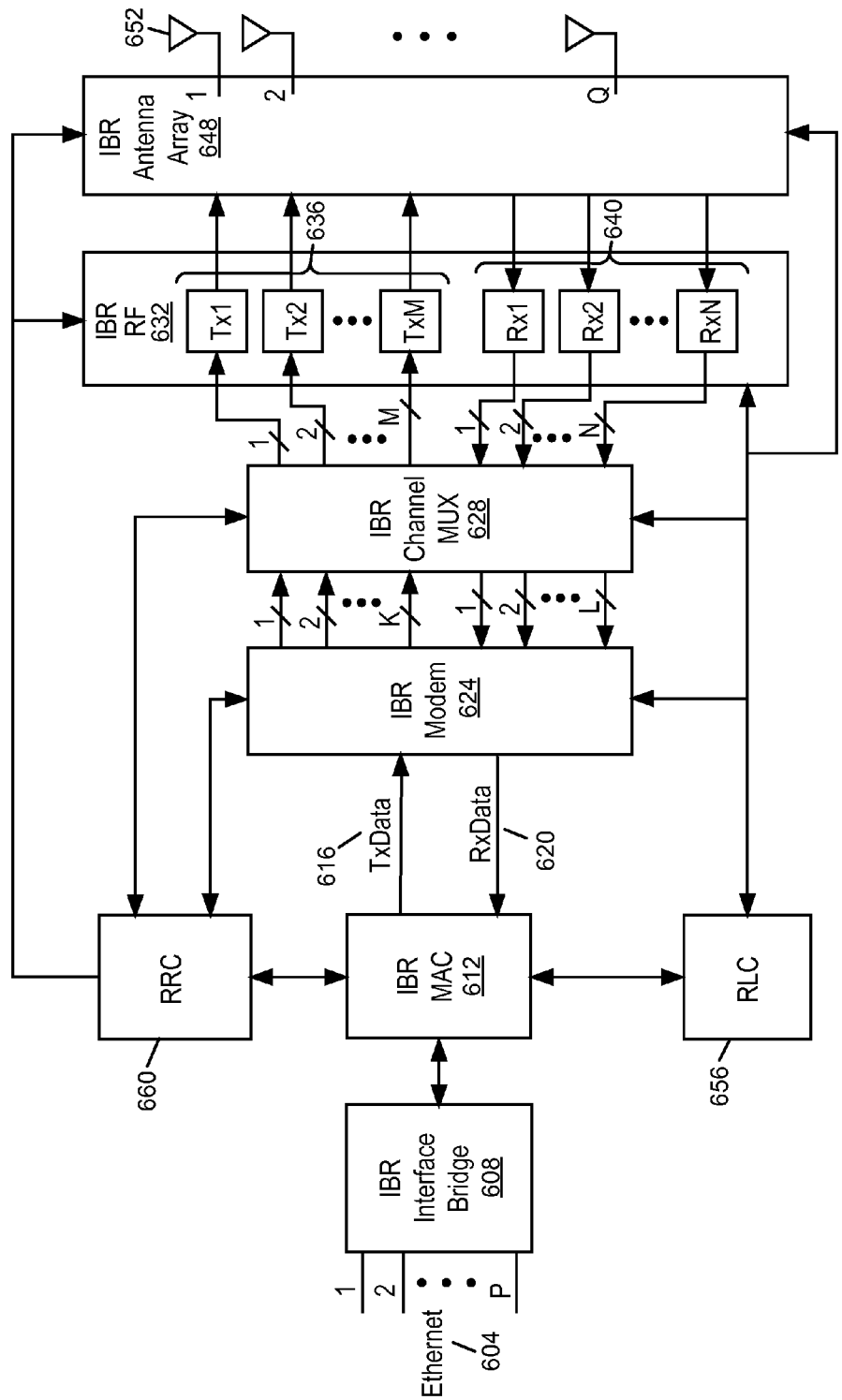
FIG. 6 is a block diagram of an IBR according to one embodiment of the invention.
Figure 7:
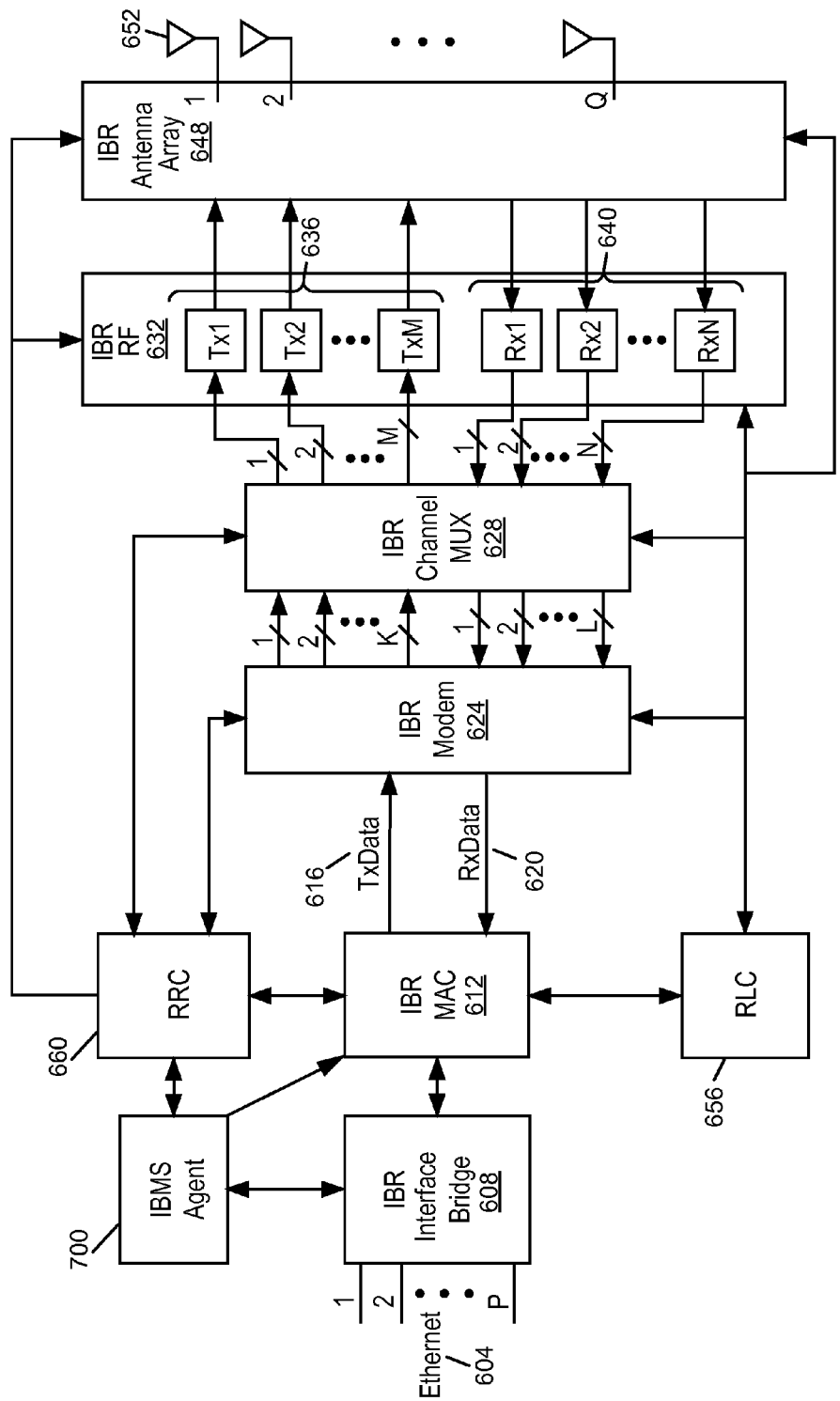
FIG. 7 is a block diagram of an IBR according to one embodiment of the invention.

FIGS. 6 and 7 illustrate exemplary embodiments of the IBRs 500 shown in FIG. 5. In FIGS. 6 and 7, the IBRs 500 include interfaces 604, interface bridge 608, MAC 612, modem 624, channel MUX 628, RF 632, which includes Tx1 ... TxM 636 and Rx1 ... RxN 640, antenna array 648 (includes multiple antennas 652), a Radio Link Controller (RLC) 656 and a Radio Resource Controller (RRC) 660. The IBR may optionally include an IBMS agent 700 as shown in FIG. 7. It will be appreciated that the components and elements of the IBRs may vary from that illustrated in FIGS. 6 and 7. The various elements of the IBR are described below by their structural and operational features in numerous different embodiments.

The external interfaces of the IBR (i.e., the IBR Interface Bridge 608 on the wireline side and the IBR Antenna Array 648 (including antennas 652) on the wireless side) are a starting point for describing some fundamental differences between the numerous different embodiments of the IBR 500 and the conventional PTP radios described above (or other commonly known radio systems, such as those built to existing standards including 802.11n (WiFi) and 802.16e (WiMax)).

In some embodiments, the IBR Interface Bridge 608 physically interfaces to standards-based wired data networking interfaces 604 as Ethernet 1 through Ethernet P. "P" represents a number of separate Ethernet interfaces over twisted-pair, coax or optical fiber. The IBR Interface Bridge 608 can multiplex and buffer the P Ethernet interfaces 604 with the IBR MAC 612. For the case of P=1 (a single Ethernet interface), the multiplexing operation of the IBR Interface Bridge 608 is a trivial "pass-through" between the single Ethernet interface and the buffer. In exemplary embodiments, the IBR Interface Bridge 608 preserves "Quality of Service" (QoS) or "Class of Service" (CoS) prioritization as indicated, for example, in IEEE 802.1q 3-bit Priority Code Point (PCP) fields within the Ethernet frame headers, such that either the IBR MAC 612 schedules such frames for transmission according to policies configured within the IBR of FIG. 6 or communicated via the IBMS Agent 700 of FIG. 7, or the IBR interface bridge 608 schedules the transfer of such frames to the IBR MAC 612 such that the same net effect occurs. In other embodiments, the IBR interface bridge 608 also forwards and prioritizes the delivery of frames to or from another IBR over an instant radio link based on Multiprotocol Label Switching (MPLS) or Multiprotocol Label Switching Transport Profile (MPLS-TP).

In some embodiments, the IBR Interface Bridge 608 can also perform layer 2 switching of certain Ethernet interfaces to other Ethernet interfaces 604 in response to radio link failure conditions and policies configured within the IBR of FIG. 6 or communicated via the IBMS Agent 700 of FIG. 7. A radio link failure condition can arise from any one or more of multiple possible events, such as the following exemplary radio link failure condition events:

physical failure of a component within the IBR other than the IBR Interface Bridge and its power supply;
degradation of the RF link beyond some pre-determined throughput level due to either changing propagation environment or additional co-channel interference; and
failure of any kind at the other end of the RF link that prevents connection to the ultimate source or destination.

Figure 8:
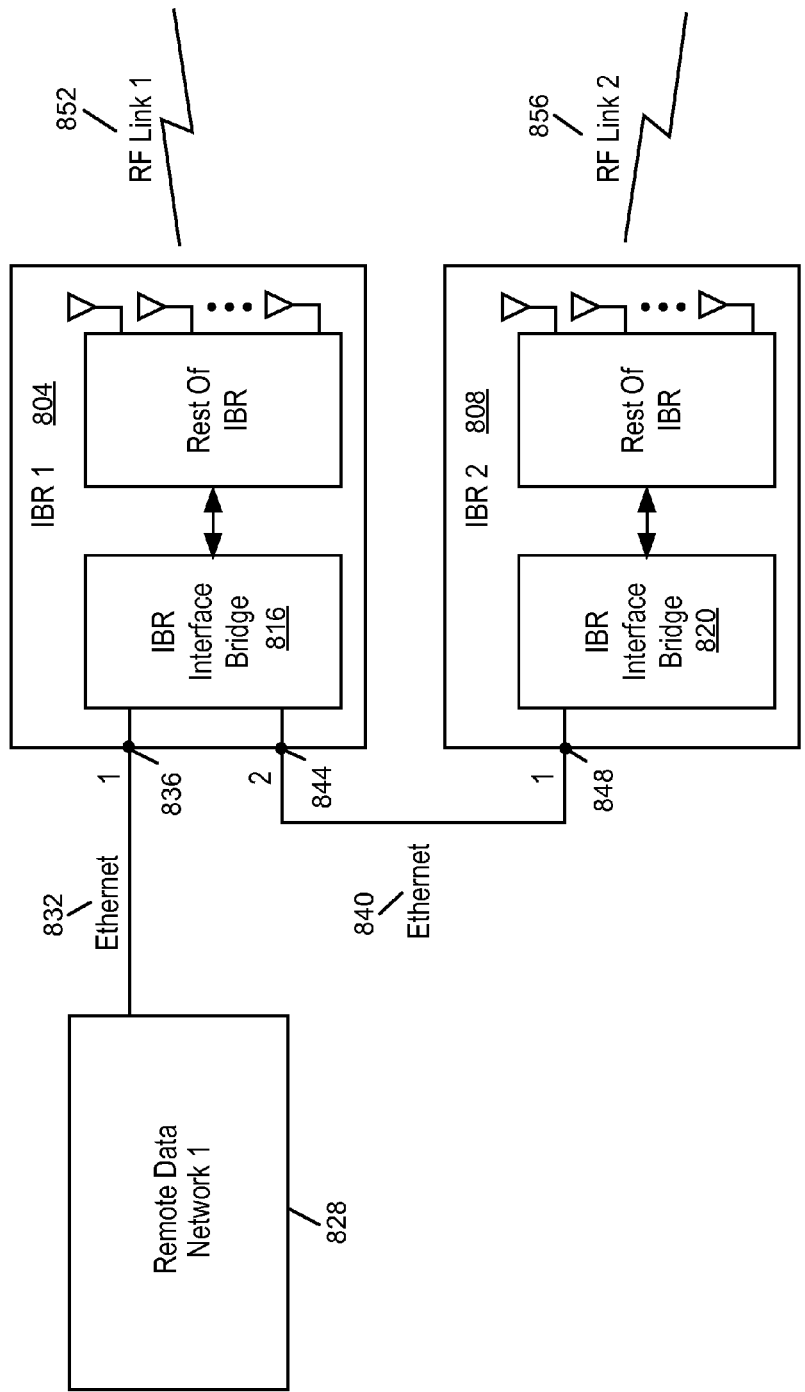
FIG. 8 is a block diagram illustrating an exemplary deployment of IBRs according to one embodiment of the invention.

FIG. 8 illustrates an exemplary configuration of multiple IBRs (IBR 1 1 804, IBR 2 808). Each IBR 804, 808 has layer 2 switching in the IBR interface bridges 816, 820 (each corresponding to an instance of the IBR Interface Bridge 608 of FIGS. 6 and 7). In one embodiment, the data networking traffic can be from, for example, a cellular eNodeB, a WiFi hotspot, a enterprise edge router, or any of numerous other remote data networks 828. As shown in FIG. 8, the remote data network 828 is connected via an Ethernet cable (copper or fiber) 832 to the first Ethernet port 836 on the IBR Interface Bridge 816 of IBR1 804. Another Ethernet cable 840 connects the second Ethernet port 844 on the IBR Interface Bridge 816 of IBR1 804 to the first Ethernet port 848 on the IBR Interface Bridge 820 of IBR2 808. If a radio link failure condition occurs for any reason, such as those listed above, with respect to RF Link 1 852, then the layer 2 switch within the IBR Interface Bridge 816 of IBR1 804 can automatically connect all data networking traffic originating from or destined to Remote Data Network 1 828 via IBR2 808 and RF Link2 856, completely transparently to Remote Data Network 1 828. This provides fail over redundancy to reduce the probability of network outage at Remote Data Network 1 828.

In some embodiments, the IBR Interface Bridge with layer 2 switching can also be configured to perform load balancing in response to operating conditions and policies configured within the IBR of FIG. 6 or communicated via the IBMS Agent 700 of FIG. 7. For example, with reference to FIG. 8, the layer 2 switch in the IBR Interface Bridge 816 of IBR1 804 can connect all data networking traffic in excess of data rates above a certain limit, such as a pre-determined level or the instantaneous supportable rate on RF Link 1 852, over to IBR2 808. For full two-way functionality of this load balancing, an analogous load balancing capability exists within the layer 2 switch of an IBR at the respective other ends of both RF Link 1 852 and RF Link 2 856.

Figure 9:
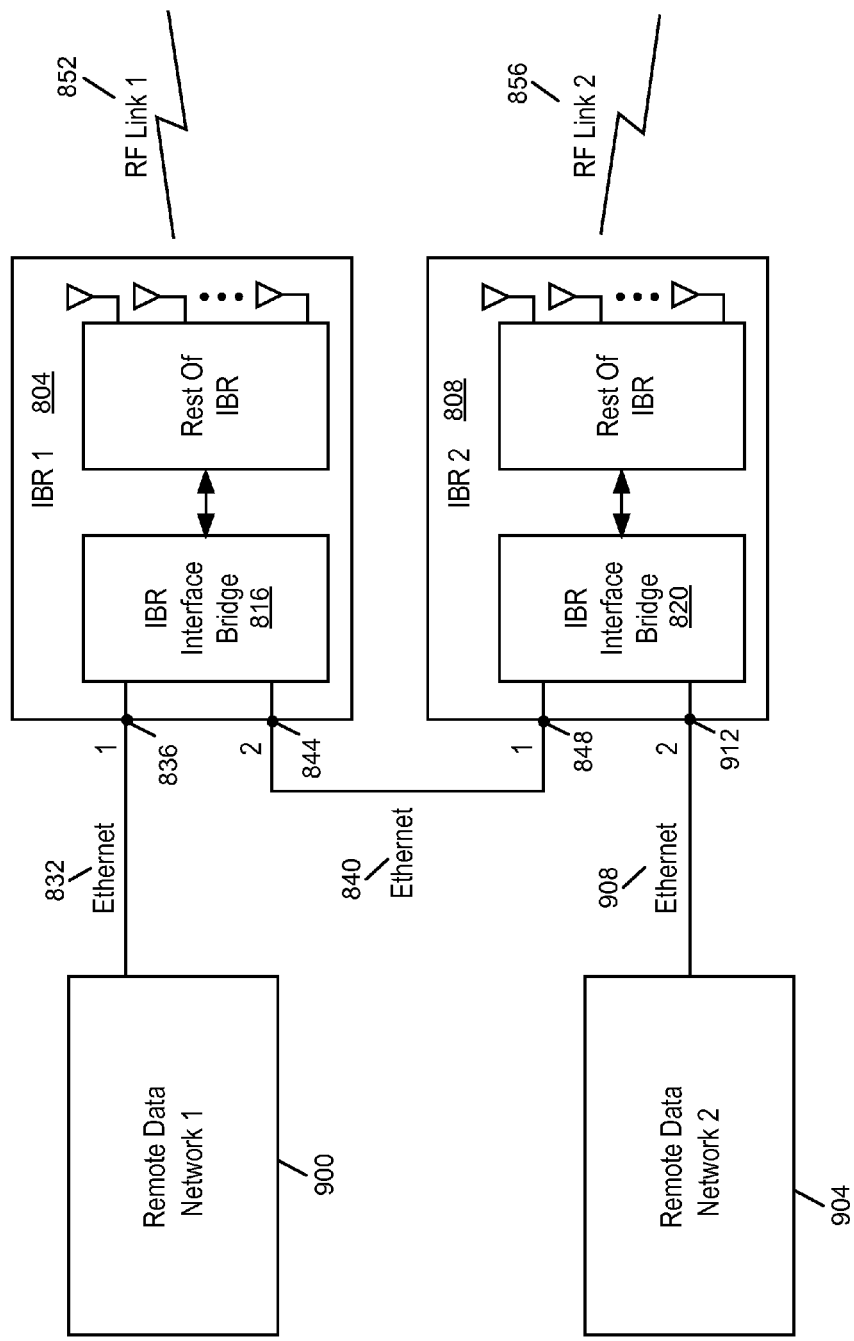
FIG. 9 is a block diagram illustrating an exemplary deployment of IBRs according to one embodiment of the invention.

FIG. 9 illustrates an alternative configuration of IBRs 804, 808 with layer 2 switching capability and optional load balancing capability for the case of two disparate Remote Data Networks 1 and 2 (900 and 904, respectively). The two Remote Data Networks 1 and 2 (900 and 904) are at or within Ethernet cabling distance of two IBRs 1 and 2 (804, 808) operating on two RF links 1 and 2 (852, 856). As described above, the Remote Data Network 828 is connected via Ethernet cable 832 to the first Ethernet port 836, and the IBRs 1 and 2 (804, 808) are connected via Ethernet cable 840 at Ethernet ports 844 and 848 respectively. The Remote Data Network 2 904 is connected to IBR 2 808 via Ethernet cable 908 at the Ethernet port 912. In the embodiment shown in FIG. 9, if a radio link failure condition occurs for any reason, such as those listed above, with respect to RF Link 1 852, then the IBR Interface Bridge 816 of IBR1 804 can use its layer 2 switch to connect to the IBR Interface Bridge 820 of IBR2 808 via Ethernet cable 840 such that IBR2 808 can backhaul, subject to its throughput capabilities and prioritization policies, the traffic originating from or destined to both Remote Data Network 1 900 and Remote Data Network 2 904. Similarly, the IBRs 804, 808 can perform load balancing across both RF Links 1 and 2 (852, 856), for traffic originating from or destined to Remote Data Networks 1 and 2 (900, 904).

In some embodiments, RF link 1 852 may utilize spectrum possessing advantageous conditions, such as reduced interference, wider channel bandwidth, better propagation characteristics, and/or higher allowable power than the spectrum utilized by RF Link 2 856, or vice versa. In the situation where a radio link failure condition occurs with respect to the more advantageous spectrum, either control signaling between the two IBR Interface Bridges 816, 820 of IBRs 1 and 2 as shown in FIG. 6 or messaging between the two IBMS Agents 700 as shown in FIG. 7, whether directly or indirectly via one or more intermediaries, can cause the redundant IBR 808 to change to the advantageous spectrum no longer being used by RF Link 852 with the failure condition.

Figure 10:
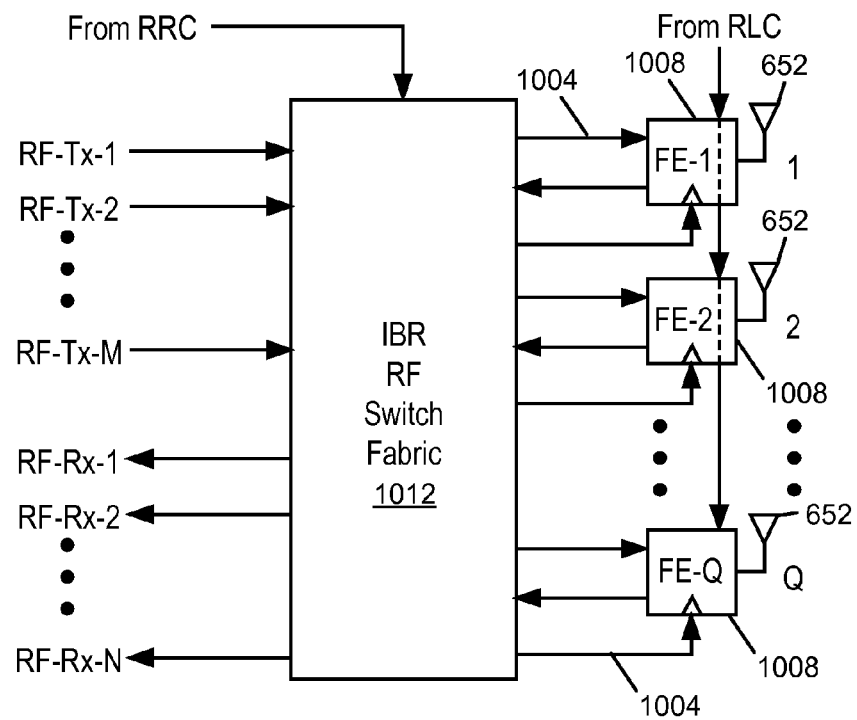
FIG. 10 is a block diagram of an IBR antenna array according to one embodiment of the invention.

FIG. 10 illustrates an exemplary embodiment of an IBR Antenna Array 648. FIG. 10 illustrates an antenna array having Q directive gain antennas 652 (i.e., where the number of antennas is greater than 1). In FIG. 10, the IBR Antenna Array 648 includes an IBR RF Switch Fabric 1012, RF interconnections 1004, a set of Front-ends 1008 and the directive gain antennas 652. The RF interconnections 1004 can be, for example, circuit board traces and/or coaxial cables. The RF interconnections 1004 connect the IBR RF Switch Fabric 1012 and the set of Front-ends 1008. Each Front-end 1008 is associated with an individual directive gain antenna 652, numbered consecutively from 1 to Q.

Figure 11:
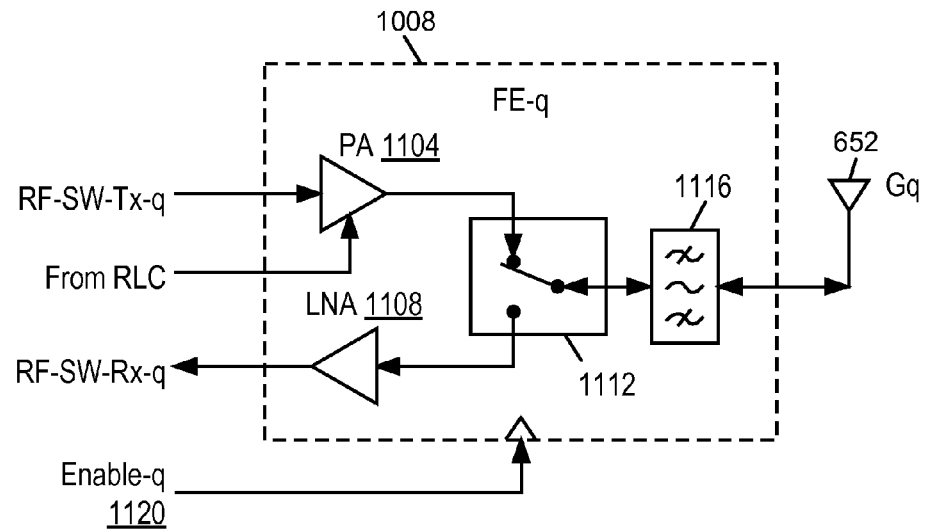
FIG. 11 is a block diagram of a front-end unit for TDD operation according to one embodiment of the invention.
Figure 12:
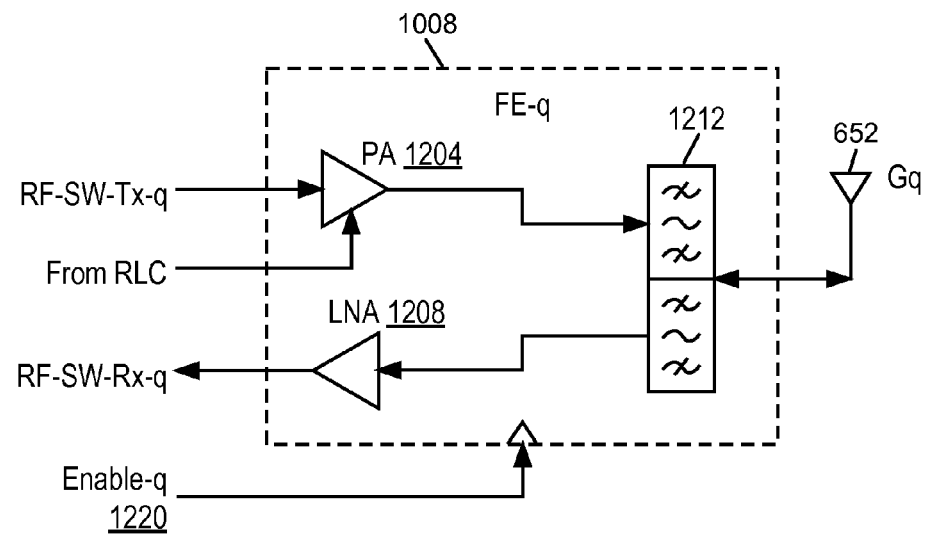
FIG. 12 is a block diagram of a front-end unit for FDD operation according to one embodiment of the invention.

FIG. 11 illustrates an exemplary embodiment of the Front-end circuit 1008 of the IBR Antenna Array 648 of FIG. 10 for the case of TDD operation, and FIG. 12 illustrates an exemplary embodiment of the Front-end circuit 1008 of the IBR Antenna Array 648 of FIG. 10 for the case of FDD operation.

The Front-end circuit 1008 of FIG. 11 includes a transmit power amplifier PA 1104, a receive low noise amplifier LNA 1108, SPDT switch 1112 and band-select filter 1116. The Front-end circuit 1008 of FIG. 12 includes a transmit power amplifier PA 1204, receive low noise amplifier LNA 1208, and duplexer filter 1212. These components of the Front-end circuit are substantially conventional components available in different form factors and performance capabilities from multiple commercial vendors.

As shown in FIGS. 11 and 12, each Front-end 1008 also includes an "Enable" input 1120, 1220 that causes substantially all active circuitry to power-down. Power-down techniques are well known. Power-down is advantageous for IBRs in which not all of the antennas are utilized at all times. It will be appreciated that alternative embodiments of the IBR Antenna Array may not utilize the "Enable" input 1120, 1220 or power-down feature. Furthermore, for embodiments with antenna arrays where some antenna elements are used only for transmit or only for receive, then certain Front-ends (not shown) may include only the transmit or only the receive paths of FIGS. 11 and 12 as appropriate.

As described above, each Front-end (FE-q) corresponds to a particular directive gain antenna 652. Each antenna 652 has a directivity gain Gq. For IBRs intended for fixed location street-level deployment with obstructed LOS between IBRs, whether in PTP or PMP configurations, each directive gain antenna 652 may use only moderate directivity compared to antennas in conventional PTP systems at a comparable RF transmission frequency. Based on measurements of path loss taken at street level at 2480 MHz in various locations in and nearby San Jose, Calif. during August and September 2010, IBR antennas should have a Gq of at least 6 dBi, and, in typical embodiments for operation between 2 GHz and 6 GHz RF transmission frequency, a Gq in the range of 10-18 dBi, wherein the radiation pattern in the elevation direction is typically less than 90° and nominally parallel to the local surface grade. At higher RF transmission frequencies, higher gain ranges of Gq are expected to be preferable. For example, Gq may be preferably 16-24 dBi for 20-40 GHz operation or 20-28 dBi for 60-90 GHz operation. In one particular embodiment, the directive gain antennas 652 are "patch" type antennas with Gq of about 13 dBi and nominally equal elevation and azimuth radiation patterns (about 40° each). Patch type antennas are advantageous because they can be realized using substantially conventional printed circuit board (PCB) fabrication techniques, which lowers cost and facilitates integration with Front-end circuit components and/or some or substantially all of the IBR RF Switch Fabric. However, may other antenna types, such as helical, horn, and slot, as well as microstrip antennas other than patch (such as reflected dipoles), and the like, may be used with the IBR Antenna Array. In an alternative embodiment, the directive gain antennas 652 are reflected dipoles with Gq of about 15 dBi (about 50° azimuth and 20° elevation). In many embodiments, the antenna elements are chosen with elevation angular patterns considerably less than azimuthal angular patterns.

In the IBR Antenna Array 648 illustrated in FIGS. 6, 7 and 10, the total number of individual antenna elements 652, Q, is greater than or equal to the larger of the number of RF transmit chains 636, M, and the number of RF receive chains 640, N. In some embodiments, some or all of the antennas 652 may be split into pairs of polarization diverse antenna elements realized by either two separate feeds to a nominally single radiating element or by a pair of separate orthogonally oriented radiating elements. Such cross polarization antenna pairs enable either increased channel efficiency or enhanced signal diversity as described for the conventional PTP radio.

The cross-polarization antenna pairs as well as any non-polarized antennas are also spatially diverse with respect to each other.

In some embodiments, certain antenna elements 652 may be configured with different antenna gain Gq and/or radiation patterns compared to others in the same IBR to provide pattern diversity.

Figure 13:
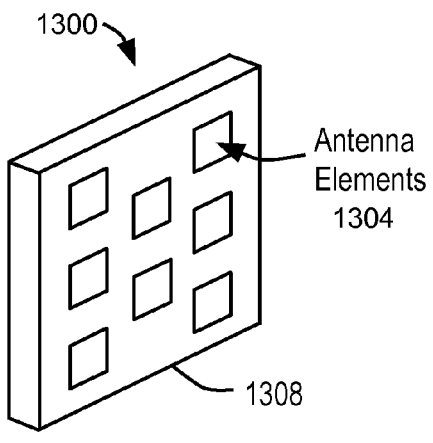
FIG. 13 is a perspective view of an IBR according to one embodiment of the invention.

In some embodiments, some antenna elements 652 may be oriented in different ways relative to others to achieve directional diversity. For example, FIG. 13 illustrates an IBR suitable for obstructed LOS PTP operation (or sector-limited PMP operation) in which spatial diversity (and optionally polarization diversity and/or pattern diversity) is utilized to the exclusion of directional diversity. As shown in FIG. 13, all of the antenna elements 1304 are positioned on a front facet 1308 of the IBR. In FIG. 13, the IBR 1300 includes eight antenna elements 1304 (Q=8). It will be appreciated that the IBR 1300 may include less than or more than eight antenna elements 1304.

Figure 14:
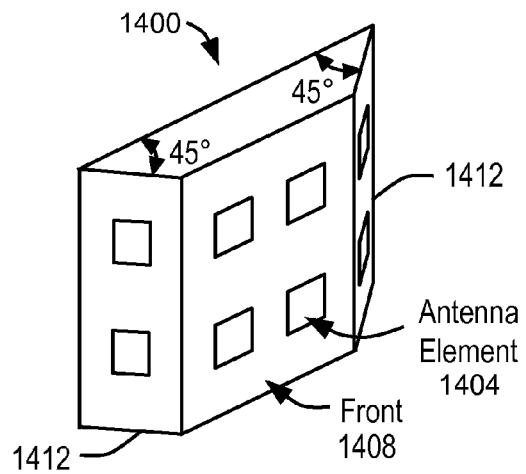
FIG. 14 is a perspective view of an IBR according to one embodiment of the invention.

FIG. 14 illustrates another embodiment of an IBR 1400 where directional diversity is present. IBR 1400 includes the same number of antenna elements as the IBR 1300 shown in FIG. 13 (Q=8, or 16 if using cross-polarization feeds to all antenna elements). In FIG. 14, the antenna elements 1404 are arranged on a front facet 1408 and two side facets 1412. In FIG. 14, the side facets 1412 are at a 45° angle in the azimuth relative to the front facet 1408. It will be appreciated that this 45° angle is arbitrary and different angles are possible depending on the specific radiation patterns of the various antenna elements. Furthermore, the angle may be adjustable so that the side facets 1412 can vary in azimuth angle relative to the front facet between 0° to 90° (any value or range of values between 0° to 90°). Conventional electromechanical fabrication elements could also be used to make this side facing angle dynamically adjustable by, for example, the RRC 660 of FIG. 6 or the same in combination with the IBMS Agent 700 of FIG. 7. Additionally, variations of the embodiment of FIG. 14 can use more than three facets at different angular spacing all within a nominal azimuthal range of approximately 180°, and the number of antenna elements 1404 may be less than or greater than Q=8. For example, in one embodiment, the antenna array includes four facets uniformly distributed in an azimuthal angular range across 160°.

Figure 15:
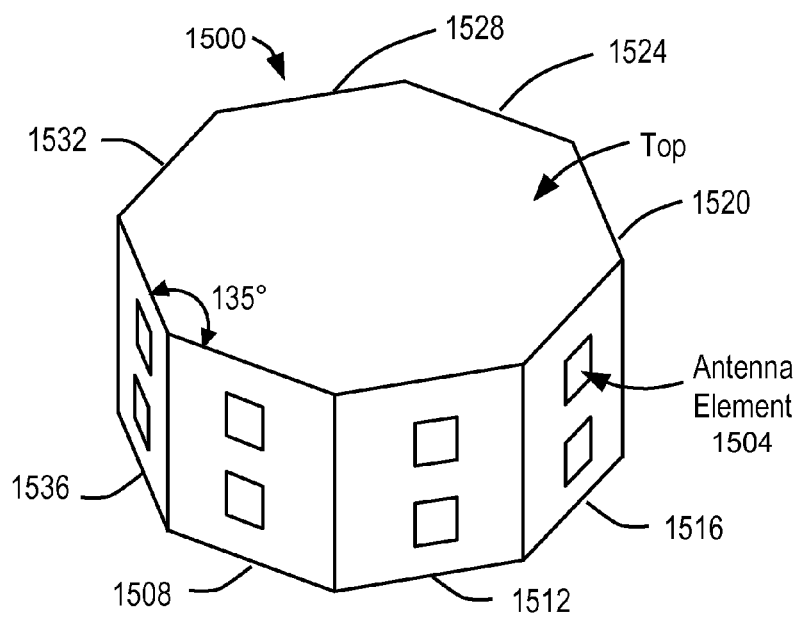
FIG. 15 is a perspective view of an IBR according to one embodiment of the invention.

FIG. 15 illustrates an IBR 1500 having an "omni-directional" (in the azimuth) array of antenna elements 1504. In FIG. 15, Q=16 antenna elements 1504 are uniformly distributed across all 360° of azimuth angles, amongst the eight facets 1508-1536. Such an embodiment can be advantageous for propagation environments with severe obstructions between IBRs in a radio link or for an omni-directional common node at a point of aggregation (i.e. fiber POP) within a PMP deployment of IBRs. It will be appreciated that the IBR may have less than or more than eight facets, and that the number of antenna elements 1504 may be less than or greater than Q=16. It will also be appreciated that the antenna elements 1504 may be distributed non-uniformly across the facets.

With reference back to FIGS. 10-12, the IBR RF Switch Fabric 1012 provides selectable RF connections between certain RF-Tx-m and/or RF-SW-Tx-q combinations and certain RF-Rx-n and/or RF-SW-Rx-q combinations. In an embodiment where Q=M=N, the IBR RF Switch Fabric 1012 can be parallel through connections or single-pole, single-throw (SPST) switches. In a maximally flexible embodiment where Q>Max (M, N) and any RF-Tx-m or RF-Rx-n can connect to any respective RF-SW-Tx-q or RF-SW-Rx-q, then a relatively complex cascade of individual switch blocks and a more extensive decoder logic may be required. Because each RF-Tx-m or RF-Rx-n can be readily interchangeable amongst their respective sets of signals at the digital baseband level, it is generally only necessary to connect any given RF-Tx-m or RF-Rx-n to a subset of the Front-ends 1008 roughly by the ratio respectively of Q/M or Q/N on average.

For example, if the IBR has Q=8 antenna elements and M=N=4, then Q/M=Q/N=2. Thus, any of the RF-Tx-m (m=1, 2, 3, 4) signals may be connectable to a pair of RF-SW-Tx-q signals, via a selectable RF connection including a SPDT switch (and similarly for RF-Rx-n to RF-SW-Rx-q). In this example, either RF-Tx-m and/or RF-Rx-n could connect via such a selectable RF connection to either one of the front-facing antenna elements or one of the side-facing antenna elements such that each RF signal has directional as well as spatial diversity options while allowing any two adjacent elements in the azimuth direction to both be selected. Similarly, for the IBR shown in FIG. 15, if the IBR has Q=16 (non-polarized) antenna elements and M=N=4, then any RF-Tx-n or RF-Rx-n signal could be oriented in one of four directions at 90° increments via a selectable RF connection including a single-pole, quadrature throw (SP4T) switch.

An alternative embodiment of the IBR RF Switch Fabric 1012 can also optionally connect, via a signal splitter, a particular RF signal (typically one of the RF-Tx-m signals) to multiple Front-ends 1008 and antenna elements 652 simultaneously. This may be advantageous in some IBR operational modes to provide an effectively broader transmit radiation pattern either in normal operation or specifically for certain channel estimation or broadcast signaling purposes. In context of the SPDT switch implementation in the example above for the IBR of FIG. 14, this would entail, if used for RF-Tx-m, the addition of another SPDT switch and three passive splitter/combiners as well as decoder logic for each antenna element pair.

In all of the foregoing descriptions of the IBR RF Switch Fabric 1012, substantially conventional components and RF board design structures as are well known can be used to physically implement such selectable RF connections. Alternatively, these selectable RF connections can also be realized by custom integrated circuits on commercially-available semiconductor technologies.

Figure 16:
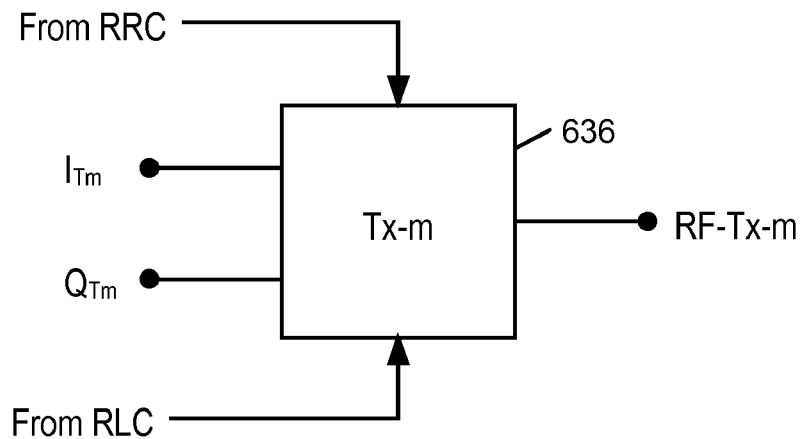
FIG. 16 is a block diagram illustrating an exemplary transmit chain within an IBR RF according to one embodiment of the invention.
Figure 17:
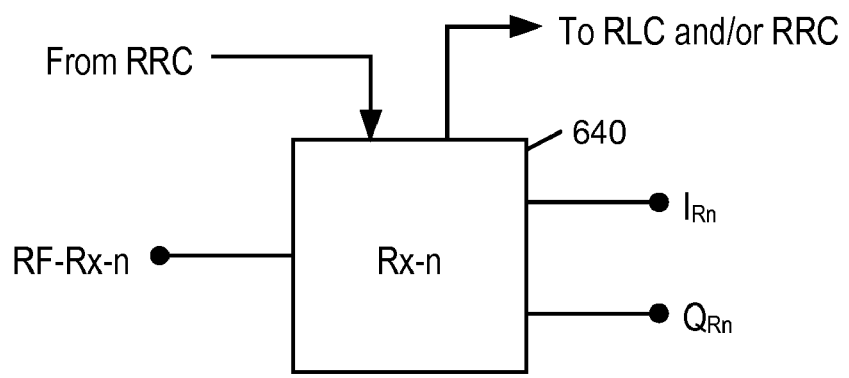
FIG. 17 is a block diagram illustrating an exemplary receive chain within an IBR RF according to one embodiment of the invention.

With reference back to FIGS. 6 and 7, the IBR RF 632 also includes transmit and receive chains 636, 640. Exemplary transmit and receive chains 636, 640 are shown in FIGS. 16 and 17 respectively. In one embodiment, as shown in FIG. 16, the transmit chain 636 takes a transmit chain input signal such as digital baseband quadrature signals $I_{Tm}$ and $Q_{Tm}$ and then converts them to a transmit RF signal RF-Tx-m. Typically, each transmit chain Tx-m 636 includes at least two signal DACs, channel filters, a vector modulator, a programmable gain amplifier, an optional upconverter, and at least one synthesized LO. Similarly, as shown in FIG. 17, the receive chain 640 converts a receive RF signal RF-Rx-n to a receive chain output signal such as digital baseband quadrature signals $I_{Rn}$ and $Q_{Rn}$. Typically, each receive chain Rx-n 640 includes an optional downconverter, a vector demodulator, an AGC amplifier, channel filters, at least two signal ADCs and at least one synthesized LO. A common synthesized LO can often be shared between pairs of Tx-m and Rx-n chains, or even amongst a plurality of such pairs, for TDD operation IBRs. Examples of commercially available components to implement the IBR RF chains include the AD935x family from Analog Devices, Inc. Numerous other substantially conventional components and RF board design structures are well known as alternatives for realizing the Tx-m and/or Rx-n chains whether for TDD or FDD operation of the IBR.

With reference back to FIGS. 6 and 7, the specific details of the IBR Modem 624 and IBR Channel MUX 628 depend somewhat on the specific modulation format(s) deployed by the IBR. In general, the IBR requires a modulation format suitable for a broadband channel subject to frequency-selective fading and multipath self-interference due to the desired PHY data rates and ranges in obstructed LOS propagation environments. Many known modulation formats for such broadband channels are possible for the IBR. Two such modulation formats for the IBR are (1) Orthogonal Frequency Division Multiplexing (OFDM) and (2) Single-Carrier Frequency Domain Equalization (SC-FDE). Both modulation formats are well known, share common implementation elements, and have various advantages and disadvantages relative to each other.

As is well known, OFDM essentially converts the frequency-selective fading broadband channel into a parallel collection of flat-fading subchannels wherein the frequency spacing between subchannels is chosen to maintain orthogonality of their corresponding time domain waveforms. In OFDM, a block of information symbols is transmitted in parallel on a block of discrete frequency subchannels, each conveying one information symbol which can be efficiently channel multiplexed into the time domain by using an Inverse Discrete Fourier Transform (IDFT). A cyclic prefix of length in time greater than the dominant time delays associated with multi-path self-interference is then pre-pended to the IDFT output block by serially transmitting first in time a fraction of the IDFT output block time domain samples that are transmitted last. This length in time is also sometimes called a guard interval. The use of a cyclic prefix effectively converts a linear convolution of the transmitted block of symbols to a circular convolution such that the effects of inter-symbol interference (ISI) associated with multipath time delays can be largely eliminated at the OFDM receiver. At the OFDM receiver, the cyclic prefix is discarded and each time domain input block of symbols is demultiplexed back into frequency domain subchannels each conveying one information symbol by using a Discrete Fourier Transform (DFT). The transmission of a known training block of symbols within each OFDM PPDU enables the OFDM receiver to correct for carrier frequency offsets and determine a complex weighting coefficient for each frequency subchannel that can equalize the effects of frequency-selective relative gain and phase distortion within the propagation channel. Furthermore, transmission of known "pilot" sequences of symbols at certain predetermined subchannels within the transmit block enables the OFDM receiver to track such channel distortions and frequency offsets during reception of information symbol blocks the PPDU as well as provide a coherent reference for demodulation. Note that for those subchannels subjected to severe flat fading, as will occur inevitably in a broadband obstructed LOS propagation channel, the information within such subchannels cannot be directly demodulated. Thus to avoid a significant irreducible bit-error rate (BER) that would be unacceptable for most IBR applications, it is essential that either forward error correction (FEC) encoding be applied with a constraint length comparable to the number of bits per OFDM block of information symbols or with a combination of constraint length and interleaving depth such that related FEC encoded bits or symbols span substantially all of the OFDM block of information symbols.

In an SC-FDE transmitter, every block of information symbols, each mapped to the same single carrier frequency at a relatively high symbol rate, has a cyclic prefix prepended to it prior to transmission. Similar to OFDM, the cyclic prefix consists of a finite fraction of the modulated symbols with a length in time greater than the dominant time delays associated with multipath self-interference wherein such modulated symbols are identical to those to be transmitted last in time for each block. Analogously to OFDM, this cyclic prefix effectively converts a linear convolution of the transmitted block of symbols to a circular convolution such that inter-block interference (IBI) due to multipath can be largely eliminated at the SC-FDE receiver. The SC-FDE receiver is similar to the OFDM receiver in that a cyclic prefix remover discards a cyclic prefix for each block of information symbols and the remaining sampled signals are decomposed into a set of frequency subchannels collectively representing the IBI-free block of symbols using a DFT. Based on a set of complex weighting coefficients, one for each frequency sub-channel, as usually determined from a known training block of symbols within each SC-FDE PPDU, the broadband channel induced relative distortions of amplitude and phase for each frequency sub-channel are then corrected in the Frequency Domain Equalizer (FDE). In contrast to OFDM where FDE-corrected subchannel estimates can be directly demapped as individual information symbols, in SC-FDE the FDE-corrected frequency domain subchannel estimates are then re-multiplexed into a channel equalized single-carrier stream of information symbol estimates using an IDFT so that such information symbol estimates can be subsequently demodulated.

Embodiments of the IBR may use Quadrature Amplitude Modulation (QAM) to map groups of information data bits to a symbol including an I (or "real") component and a Q (or "imaginary") component. These symbols (i.e., symbols that include I and Q components) are typically referred to as "complex" symbols. Such "complex" symbols may be multiplexed or demultiplexed by an IDFT or DFT respectively implemented by structures executing a complex Inverse Fast Fourier Transform (IFFT) or complex Fast Fourier Transform (FFT). In IBR embodiments, references to IDFT or DFT herein assume that such transforms will typically be implemented by structures executing an IFFT or FFT respectively. Note also that the cyclic prefix described above can also be implemented as a cyclic postfix for either OFDM or SC-FDE with equivalent performance. For SC-FDE, some re-ordering of samples at the receiver after removal during the guard interval may be required if a cyclic postfix is used. It will be appreciated however that techniques other than QAM for modulation mapping may also be used.

With reference again to FIGS. 6 and 7, the specific details of the IBR Modem 624 and IBR Channel MUX 628 also depend somewhat on the specific antenna array signal processing format(s) deployed by the IBR. In general, the IBR utilizes multiple antennas and transmit and/or receive chains which can be utilized advantageously by several well-known baseband signal processing techniques that exploit multipath broadband channel propagation. Such techniques include Multiple-Input, Multiple-Output (MIMO), MIMO Spatial Multiplexing (MIMO-SM), beamforming (BF), maximal ratio combining (MRC), and Space Division Multiple Access (SDMA).

In general, any configuration where a transmitter that has multiple transmit antennas (or "inputs" to the propagation channel) communicates with a receiver that has multiple receive antennas (or "outputs" from the propagation channel) can technically be described as MIMO. However, typically the term MIMO is used in the context of spatially multiplexing multiple encoded and modulated information streams from multiple transmit antennas into a multipath channel for receipt at multiple receive antennas wherein inversion of channel transfer matrix, usually determined by a known training block associated with each PPDU, enables separation and demodulation/decoding of each information stream—a process called MIMO-SM. Various embodiments of the IBR, as described herein, advantageously use other types of antenna diversity such as directional or polarization diversity to realize MIMO-SM performance even in propagation environments where spatial separation alone may be inadequate for conventional MIMO-SM.

For a given encoded and modulated information stream, BF or MRC can be utilized at either the transmitter or the receiver (or both) to improve either the signal to interference and noise ratio (SINR) or the signal to noise ratio (SNR). For example, BF or MRC optimally combine the information signal received from the multiple antennas or split the information stream signal as transmitted by the multiple antennas. Numerous algorithms for determining the optimal weighting criteria amongst the multiple antennas, usually as a function of frequency within a frequency-selective multipath broadband channel, are well known.

SDMA allows an Aggregation End IBR (AE-IBR) in a PMP configuration (see FIG. 5) to transmit to or receive from multiple Remote End IBRs (RE-IBRs) simultaneously using parallel encoded and modulated information streams each associated with multiple antenna and transmit/receive chain combinations wherein stream-specific BF maximizes signal quality for a given stream and IBR pair, while minimizing interference to other streams and IBR pairs. To the extent that multiple RE-IBRs are separable in space, or another antenna array characteristic such as polarization or direction, then significant increases in overall spectrum efficiency of a PMP system are possible using SDMA. As with BF (and MRC), numerous algorithms for computing the optimal weighting criteria, such as Eigen Beam Forming (EBF), amongst multiple antennas are well known.

In view of the foregoing exemplary modulation format and antenna array processing format alternatives for the IBR, exemplary embodiments of the IBR Modem 624 and IBR Channel MUX 628 are described with reference to FIGS. 18-30.

Figure 18:
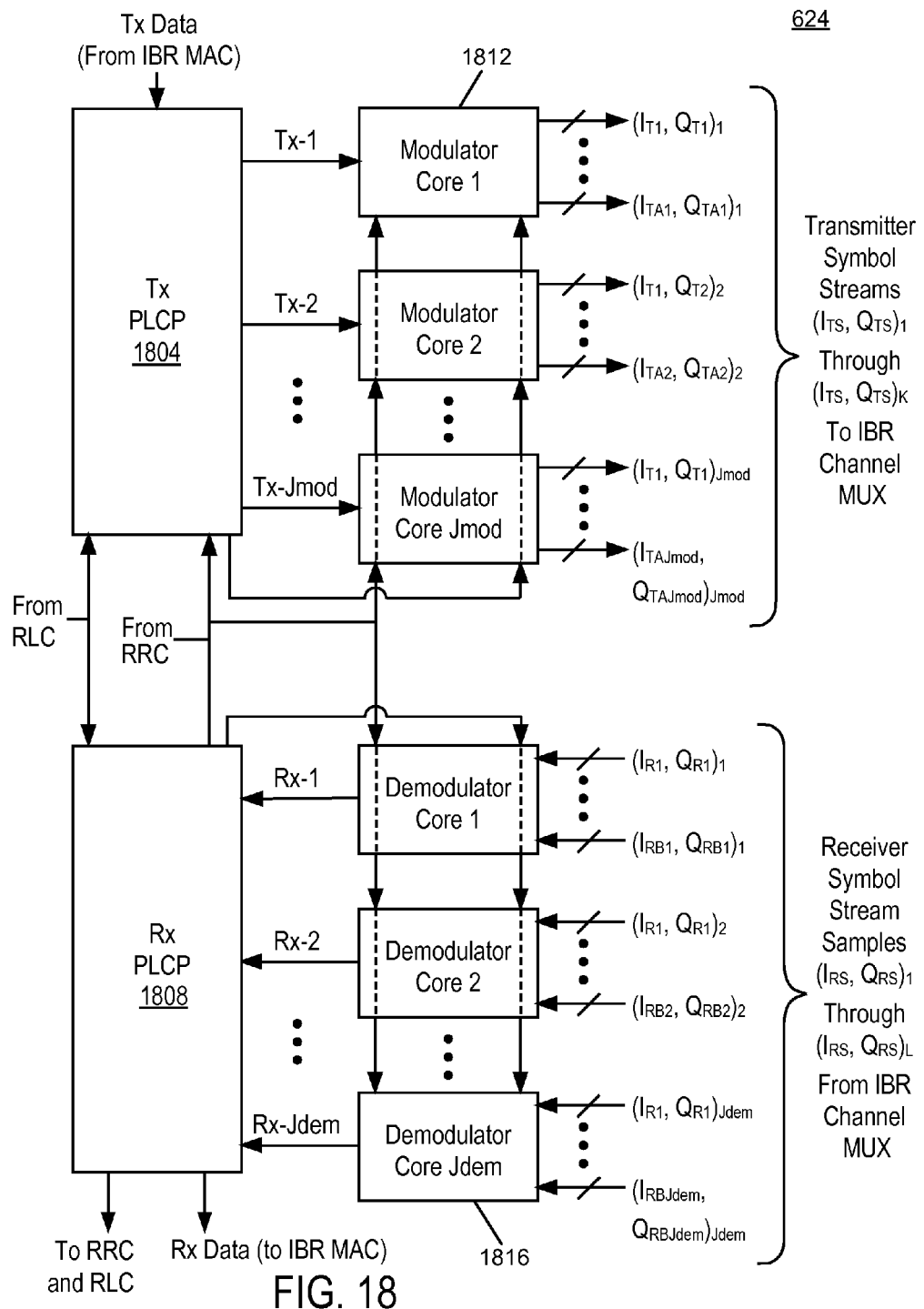
FIG. 18 is a block diagram illustrating an IBR modem according to one embodiment of the invention.

FIG. 18 shows an exemplary embodiment of the IBR Modem 624. The IBR modem 624 includes a Tx PLCP generator 1804, an Rx PLCP analyzer 1808, multiple modulator cores 1812 and multiple demodulator cores 1816. FIG. 18 is divided functionally into a transmit path and a receive path. The transmit path includes the TxPLCP 1804 and the modulator cores 1812, and the receive path includes the Rx PLCP analyzer 1808 and the demodulator cores 1816.

The transmit path of the IBR Modem 624 includes a total of Jmod "Modulator Cores" 1812, each denoted as Modulator Core j wherein j=1, 2, . . . , Jmod. The Tx PLCP generator 1804 provides transmit data interface streams, Tx-j, to each Modulator Core j 1812 such that Aj total vector outputs of mapped transmit symbol streams (denoted by the "─/─" on such I, Q connections) are generated from each Modulator Core j 1812. This results in a total number of transmit symbol streams, K=A1+A2+ . . . +AJmod, each in vector format $(I_{TS}, Q_{TS})_k$ from k=1 to K that are connected to the transmit path of the IBR Channel MUX 628.

Similarly, the receive path of the IBR Modem 624 includes a total of Jdem "Demodulator Cores" 1816 each denoted as Demodulator Core j 1816 wherein j=1, 2, . . . , Jdem. The IBR Channel MUX receive path provides L=B1+B2+ . . . +BJdem vector format receive symbol streams $(I_{RS}, Q_{RS})_l$ for l=1 to L that are input as Bj vector streams per each Demodulator Core j 1816 to produce the receive data interface stream Rx-j.

In PTP IBR configurations where Jmod=Jdem, usually Aj=Bj. However, for a PTP IBR where probing capability is present, Aj=Bj only for j=1 to Jmod in cases where Jdem>Jmod. In PMP IBR configurations, it may happen that Aj≠Bj; even if Jmod=Jdem.

An exemplary embodiment of a Modulator Core j 1812 is illustrated in FIG. 19. As shown in FIG. 19, this exemplary modulator core 1812 includes a scrambler 1908, encoder 1912, stream parser 1916, multiple optional interleavers 1920, multiple symbol groupers 1924 and multiple symbol mappers 1928.

Typically, the data from the Tx PLCP generator 1804, Tx-j 1904, is scrambled at the scrambler 1908 and then passed to the encoder 1912. The encoder 1912 provides FEC encoding and in some types of encoders also effectively interleaves the encoded data. Exemplary FEC encoder types for IBRs include convolutional, turbo and low density parity check (LDPC). The encoded data is passed to the Stream Parser 1916. The Stream Parser 1916 demultiplexes the encoded data into Aj streams. Each encoded data stream is then interleaved if necessary at the optional interleavers 1920 such that the greater of the FEC encoder constraint length and the interleaving depth approximates the total number of bits per transmitted block of symbols in either OFDM or SC-FDE. Example interleaver types include block (or "row/column") and convolutional. Such interleaved and/or encoded data in each stream is then grouped at symbol groupers 1924 based on the number of encoded bits per symbol. The groups of bits pass to the symbol mapper 1928, which converts each group of encoded bits into a vector representation (I, Q) within a constellation and then provides an output as a transmit symbol stream 1932. An exemplary technique for mapping encoded bits to a vector symbol is QAM optionally with Gray coding.

FIG. 20 illustrates an exemplary embodiment of a Demodulator Core j 1816 compatible with the exemplary Modulatory Core j 1812 of FIG. 19. As shown in FIG. 20, the demodulator core 1816 includes a descrambler 2008, decoder 2012, stream MUX 2016, multiple optional deinterleavers 2020, and multiple soft decision symbol demappers 2024.

The Demodulator Core j 1816 at the highest level can be described as performing essentially the reverse operations of those performed in the Modulator Core j 1812 of FIG. 19. A key difference though is that the vector representation (I, Q) receive symbol streams 2032 input to each Demodulator Core j 1816 are only estimates which may be corrupted due to channel or receiver impairments such as multipath self-interference, Gaussian noise, co-channel interference, carrier frequency offset (CFO), distortion through channel filters at Tx and/or Rx, non-linearity in the Tx and/or Rx chains and Frontends, or phase noise in either Tx and/or Rx local oscillators. Thus, the Demodulator Core j 1816 may use the soft decision symbol demapper 2024, which estimates the likelihood that a received symbol or bit has a particular value using, for example, a known technique such as Log-Likelihood Ratio (LLR). For example, if each data bit out of the demapper 2024 had a soft-decision representation (or "metric") of 8 bits, then a value of 0 would represent a data bit of 0, a value of 1-20 would indicate most likely a data bit of 0, a value of 21-125 would indicate more likely a data bit of 0 than a data bit of 1, a value of 126-129 would indicate near uncertainty of the data bit as either 0 or 1, a value of 130-234 would indicate more likely a data bit of 1, a value of 235-254 would indicate most likely a data bit of 1, and a value of 255 would represent a data bit of 1. These soft-decision metrics can then be deinterleaved if applicable at optional deinterleavers 2020 and stream multiplexed at the Stream MUX 2016, and then supplied to the decoder (deinterleaver) 2012 as a sequence of soft-decision metrics estimating the originally encoded (and possibly interleaved) bit stream. Decoder types are matched to encoder types as is well known. Techniques such as iterative decoding within the IBR modem or combination of IBR modem and IBR Channel MUX are also known and can be used in some embodiments.

Figure 21:
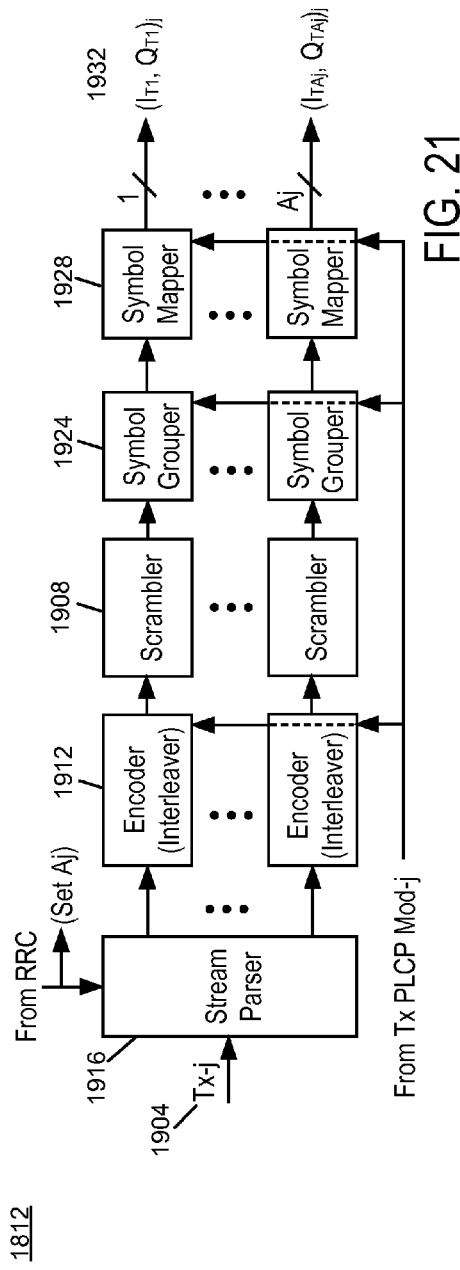
FIG. 21 is a block diagram illustrating a modulator core j according to one embodiment of the invention.
Figure 22:
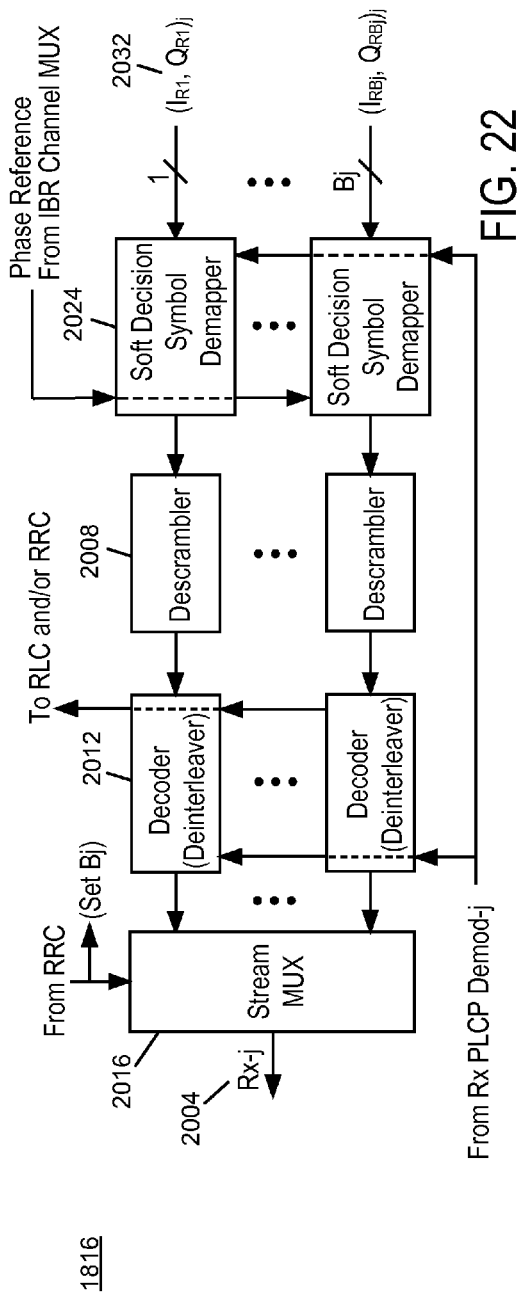
FIG. 22 is a block diagram illustrating a demodulator core j according to one embodiment of the invention.

FIGS. 19 and 20 are examples of implementations of the modulator and demodulator cores 1812, 1816, respectively, in the IBR Modem 624. It will be appreciated that the order of the Scrambler 1908 and Encoder 1912 can be reversed (and hence the Decoder 2012 and Descrambler 2008 could be reversed). Also, the Stream Parser 1916 can divide a transmit data interface stream Tx-j sequentially into multiple encoder/scrambler combinations and hence the corresponding Stream Mux 2016 would combine multiple Decoder outputs. FIGS. 21 and 22 illustrate exemplary alternatives with the above recited differences and without showing optional separate interleavers 1920 and deinterleavers 2020.

Although each element is illustrated separately in FIGS. 19-22, the elements are not required to be distinct physical structures. It is feasible to time multiplex either the entire Modulator or Demodulator Cores 1816, 1820 or constituent elements such as the Encoder 1912 or Decoder 2012 across multiple streams. Furthermore, in TDD operation, it can be advantageous to time multiplex constituent elements such as the Encoder 1912 and/or Decoder 2012 even during times where the opposite transmit/receive path is over the air compared to the time multiplexed element. For example, by buffering receive symbol stream samples from the receive path of the IBR Channel MUX 628 during the receive portion of TDD operation, some of the streams can be decoded in a common Decoder 2012 even when the IBR has changed over to transmit operation.

Note further that the exemplary embodiments of FIGS. 19-22 for the Modulator and Demodulator Cores of the IBR Modem are all suitable for either OFDM or SC-FDE operation.

Figure 23A:
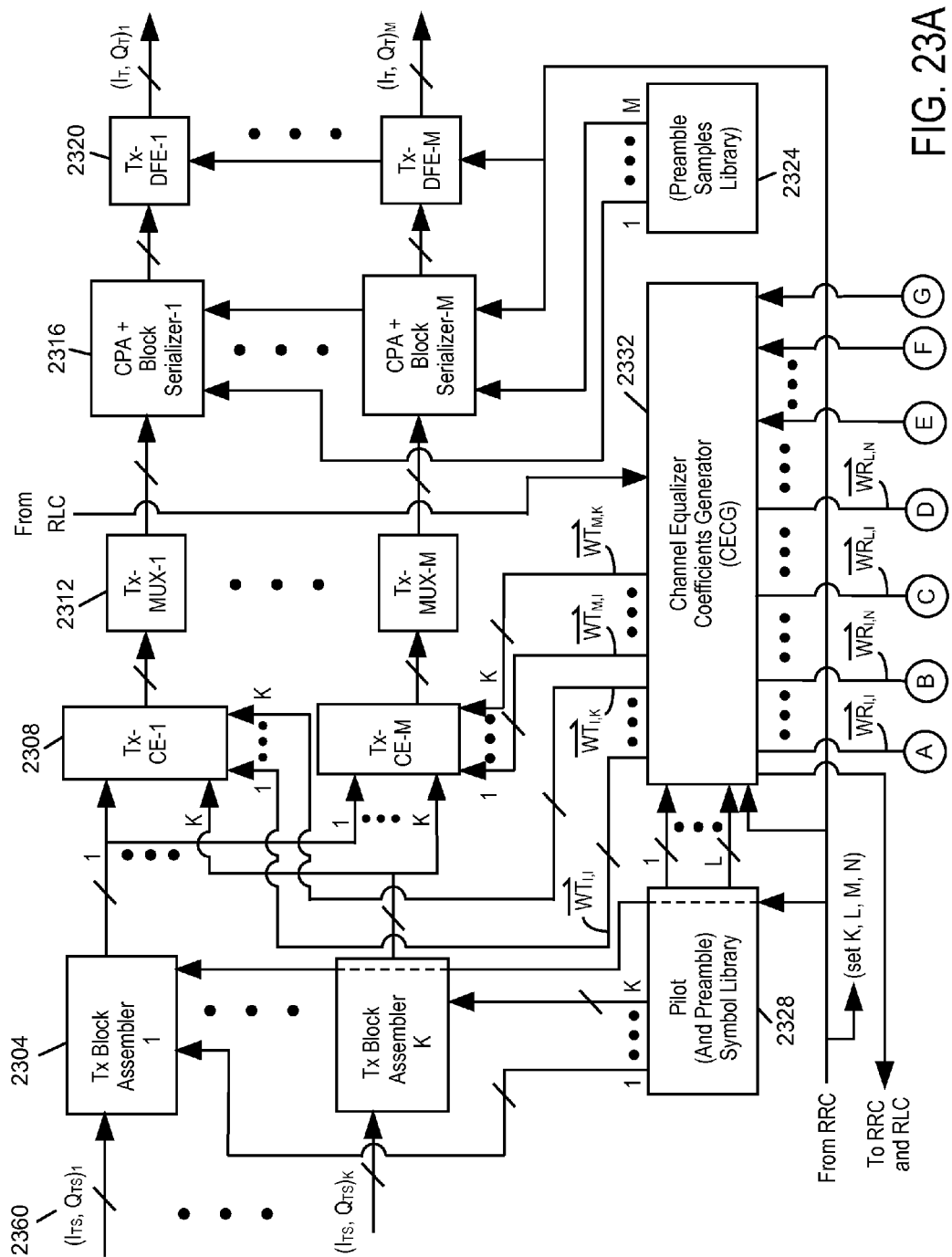
FIG. 23A shows the transmit path and the channel equalizer coefficients generator within the exemplary channel MUX.
Figure 23B:
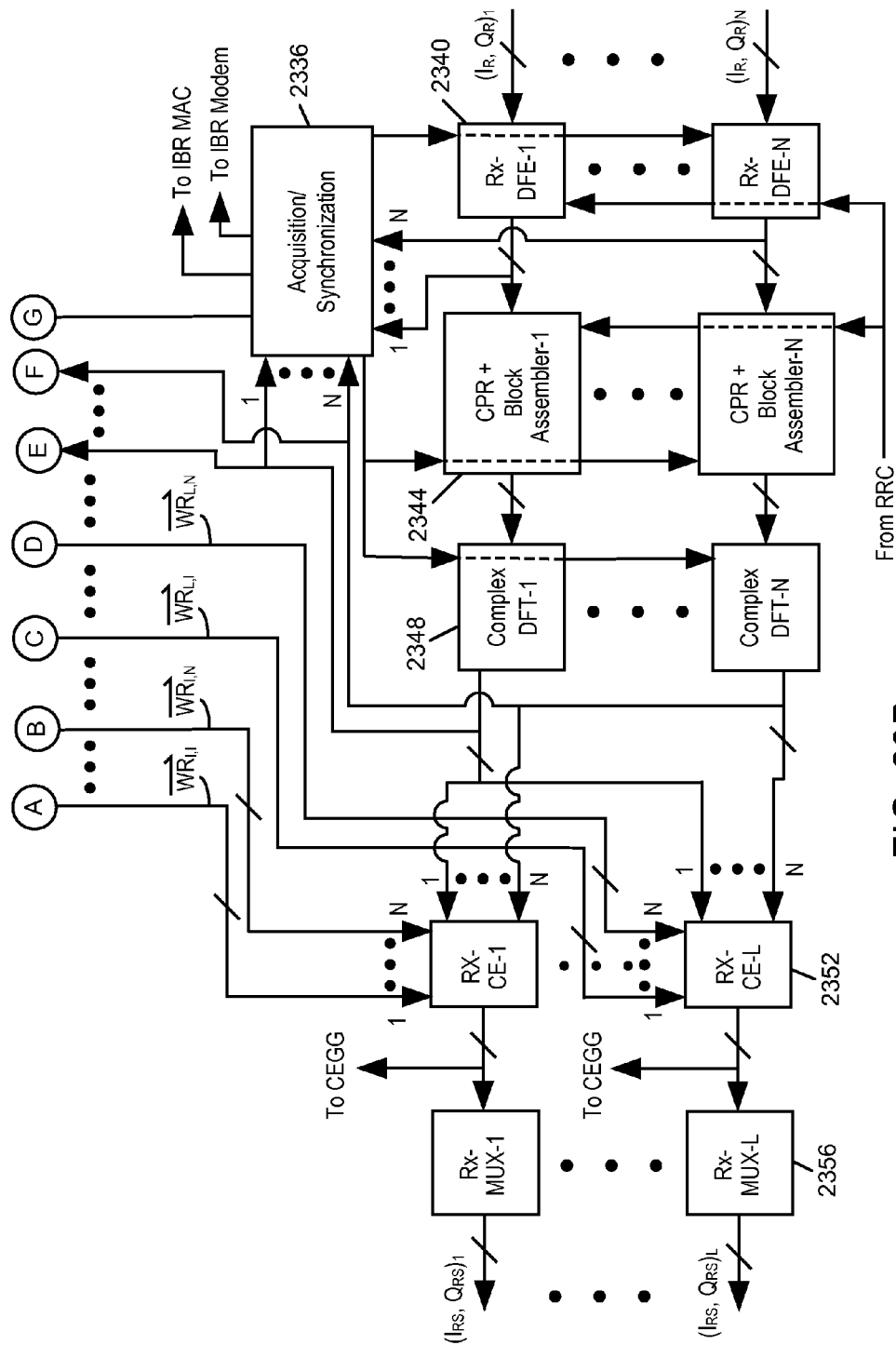
FIG. 23B shows the receive path within the exemplary channel MUX.

FIG. 23 (FIGS. 23A and 23B together) illustrates an exemplary embodiment of the IBR Channel MUX 628. FIG. 23 is divided functionally into a transmit path (FIG. 23A) and a receive path (FIG. 23B). In FIG. 23A, the transmit path includes multiple block assemblers 2304, multiple transmit channel equalizers (CEs) 2308, multiple transmit MUXs 2312, multiple cyclic prefix addition (CPA) and block serializers 2316, multiple transmit digital front ends (DFEs) 2320, an optional preamble samples library 2324, and a pilot (and optionally preamble) symbol library 2328. In FIG. 23B, the receive path includes an acquisition/synchronization calculator 2336, multiple receive digital front ends (DFEs) 2340, multiple cyclic prefix removal (CPR) and block assemblers 2344, multiple complex DFTs 2348, multiple receive channel equalizers 2352 and multiple receive MUXs 2356. The IBR Channel MUX 628 also includes a channel equalizer coefficients generator 2332 (see FIG. 23A). The channel equalizer coefficients generator 2332 may be used by both transmit and receive paths or only the receive path depending on the specific embodiment. In the receive path, the IBR Channel MUX 628 is frequency selective to enable operation in obstructed LOS propagation environments with frequency selective fading within the channel bandwidth as well as operation in predominantly unobstructed LOS.

In the transmit path, each transmit symbol stream of mapped symbols $(I_{TS}, Q_{TS})_k$ from k=1 to K 2360 is connected to a respective Tx Block Assembler k 2304 as shown in FIG. 23A. For OFDM modulation, each Tx block Assembler k 2304 is equivalent to a serial to parallel buffer that also places "running" pilot symbols in pre-determined locations corresponding to pilot subchannels. In the exemplary embodiment of FIG. 23A, such pilot symbols are supplied to each Tx Block Assembler k 2304 by a Pilot Symbol Library 2328. Alternatively, pilot symbols are selectively injected into the data stream at predetermined points with a Modulator Core 1812 similar to FIG. 19 or 21 but with a "Pilot Data Library" (not shown) providing grouped data to a selectable buffer or multiplexer (not shown) between the Symbol Grouper 1924 and Symbol Mapper 1928 of either FIG. 19 or 21.

For SC-FDE modulation with no frequency selective channel equalization, the Tx Block Assembler k 2304 would, as an exemplary embodiment, be a simple serial to parallel buffer that places pilot symbols in pre-determined symbol sequence positions either from the Pilot Symbol Library 2328 as shown, or alternatively from a "Pilot Data Library" in the Modulator Core as described above. If frequency selective channel equalization in Tx for SC-FDE is used, then in addition to the above, the Tx Block Assembler k 2304 would also include a Complex DFT that follows the serial to parallel buffer. In this DFT structure version of SC-FDE (also known as DFT pre-coding SC-DFE), it is also possible to insert the pilot symbols as "pseudo-subchannels" after the DFT operation instead of as time domain symbols before the DFT.

After block assembly, the blocks of mapped symbols (each a vector of (I, Q) constellation points) are typically supplied to each of M transmit channel equalizers 2308 ("Tx-CE-m" for m=1 to M in FIG. 23A). Each Tx-CE-m 2308 applies K blocks of amplitude and/or phase weights (each amplitude phase weight may be represented in Cartesian form as a "complex" weight with a "real" and "imaginary" sub-component values) respectively to each of the K blocks of mapped vector symbols.

Figure 24:
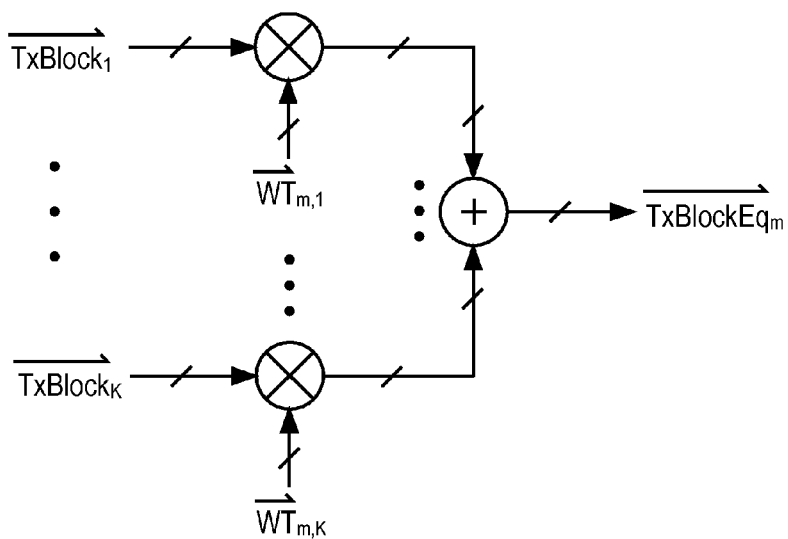
FIG. 24 is a block diagram illustrating an exemplary Tx-CE-m according to one embodiment of the invention.

An exemplary embodiment of a transmit channel equalizer Tx-CE-m 2308 is shown in FIG. 24. The blocks of mapped vector symbols are $\overrightarrow{TxBlock}_k$ wherein each symbol element within the vector $\overrightarrow{TxBlock}_k$ has an (I, Q) or, relative to FIG. 24, "complex" value (I representing a "real" sub-component value, Q representing an "imaginary" sub-component value).

Each $\overrightarrow{TxBlock}_k$ vector of complex symbols is then complex multiplied by a respective transmit weight vector $\overrightarrow{WT}_{m,k}$ as shown in FIG. 24. The channel equalized vector of symbols for each transmit chain m is then $\overrightarrow{TxBlockEq}_m$ (the transmit chain channel-equalized symbols) which represents the complex summation of the symbol by symbol output vectors of each respective weighting operation. Note that FIG. 24 depicts an exemplary implementation of transmit channel equalizer TX-CE-m 2308 based on vector complex multiplication and summation. Such an approach is easily implemented using either generic function calls or custom software modules executing on an embedded processor (or Digital Signal Processor—"DSP"). However, numerous other implementation techniques are also known such as dedicated logic circuits for complex multiplication and/or summation, a set of four scalar multiplier circuits and two scalar adders, or other logic circuits such as combinatorial gates (i.e. OR, NOR, AND, NAND, XOR, XNOR, etc.), multiplexers, shift registers, etc. that can produce an equivalent result.

Note further that for embodiments with either OFDM or SC-FDE modulation and no frequency selective channel equalization, $\overrightarrow{WT}_{m,k}$ would typically be composed of a block of identical transmit weights applied equally to all mapped symbols for a given stream k. In some OFDM or SC-FDE embodiments where K=M, no equalization or weighting amongst transmit streams and chains may be desired such that each Tx-CE-m 2308 in FIG. 23A (or FIG. 24) is equivalent to a through connection mapping each $\overrightarrow{TxBlock_k}$ directly to each $\overrightarrow{TxBlockEq_m}$ for each k=m.

For each transmit chain Tx-m, the channel equalized vector of symbols for each transmit chain $\overrightarrow{TxBlockEq_m}$ is supplied to Tx-Mux-m 2312, where m=1 to M, as shown in FIG. 23A. In the case of OFDM modulation or SC-FDE modulation with frequency-selective channel equalization, each TX-Mux-m 2312 includes an IDFT to transform the successive frequency domain symbols into a block of time domain samples. For SC-FDE modulation with no frequency selective channel equalization, and hence no DFT pre-coding within each Tx Block Assembler k 2304, then $\overrightarrow{TxBlockEq_m}$ is already effectively a block of transmit chain time domain samples and no such IDFT is required.

With reference back to FIG. 23A, each respective Tx-Mux-m 2312 is followed by a CPA and Block Serializer-m 2316. "CPA" refers to "Cyclic Prefix Addition"-cyclic prefix was described above—which is performed by the cyclic prefix adder within each CPA and Block Serializer-m 2316. Each CPA and Block Serializer-m 2316, via a cyclic prefix adder, typically replicates a set of samples from the end of the block and prepends these samples to the beginning of a cyclically-extended block or includes logic to read out these samples in a way that produces an equivalent result. The CPA and Block Serializer-m 2316, via a block serializer, then effectively performs a parallel to serial conversion of the extended block into a sequence of cyclically-extended (I, Q) transmit chain time domain samples.

The cyclically-extended block of (I, Q) time domain samples for each transmit chain Tx-m are then supplied to a respective Tx-DFE-m 2320 (DFE refers to Digital Front End). Each Tx-DFE-m 2320 performs a variety of possible time domain signal processing operations that may be specific to particular IBR embodiments. Common DFE processes in the transmit path include digital up-conversion of the sampling rate, DC offset calibration for each Tx-m transmit chain, digital pre-distortion to account for non-linearities in the analog transmit path, pulse-shaping filtering, crest factor or peak to average power ratio (PAPR) reduction, or frequency shifting to an "intermediate Frequency" (IF) suitable for analog up conversion to RF-Tx-m in the Tx-m transmit chain (as opposed to the baseband $(I_T, Q_T)_m$ interface illustrated in FIG. 16). Except for the last listed option of digital IF up conversion, the output (a transmit chain input signal) of each respective Tx-DFE-m 2320 is typically a sequence of cyclically-extended blocks of calibrated, compensated and filtered baseband symbol samples $(I_T, Q_T)_m$.

In the receive path of the exemplary IBR Channel MUX 628, downconverted and amplified samples from I and Q ADCs in each Rx-n receive chain (a receive chain output signal) are passed to respective Rx-DFE-n 2340. Although the receive path of the IBR generally follows the logic of reversing the operations of the transmit path, the details are considerably different in the IBR Channel MUX because in the receive path the samples are corrupted by channel propagation impairments and arriving at initially unknown times. In view of this the receive path Digital Front Ends of the IBR Channel MUX shown in FIG. 23B, Rx-DFE-n 2340, perform several time domain digital operations typically including matched filtering, rotating, sampling rate downconversion, and Rx-n chain calibration. At minimum, the Rx-DFE-n 2340 is used in the detection of timing synchronization information in the optional Preamble of the L PPDU-l transmissions from the transmitting IBR.

Figure 26:
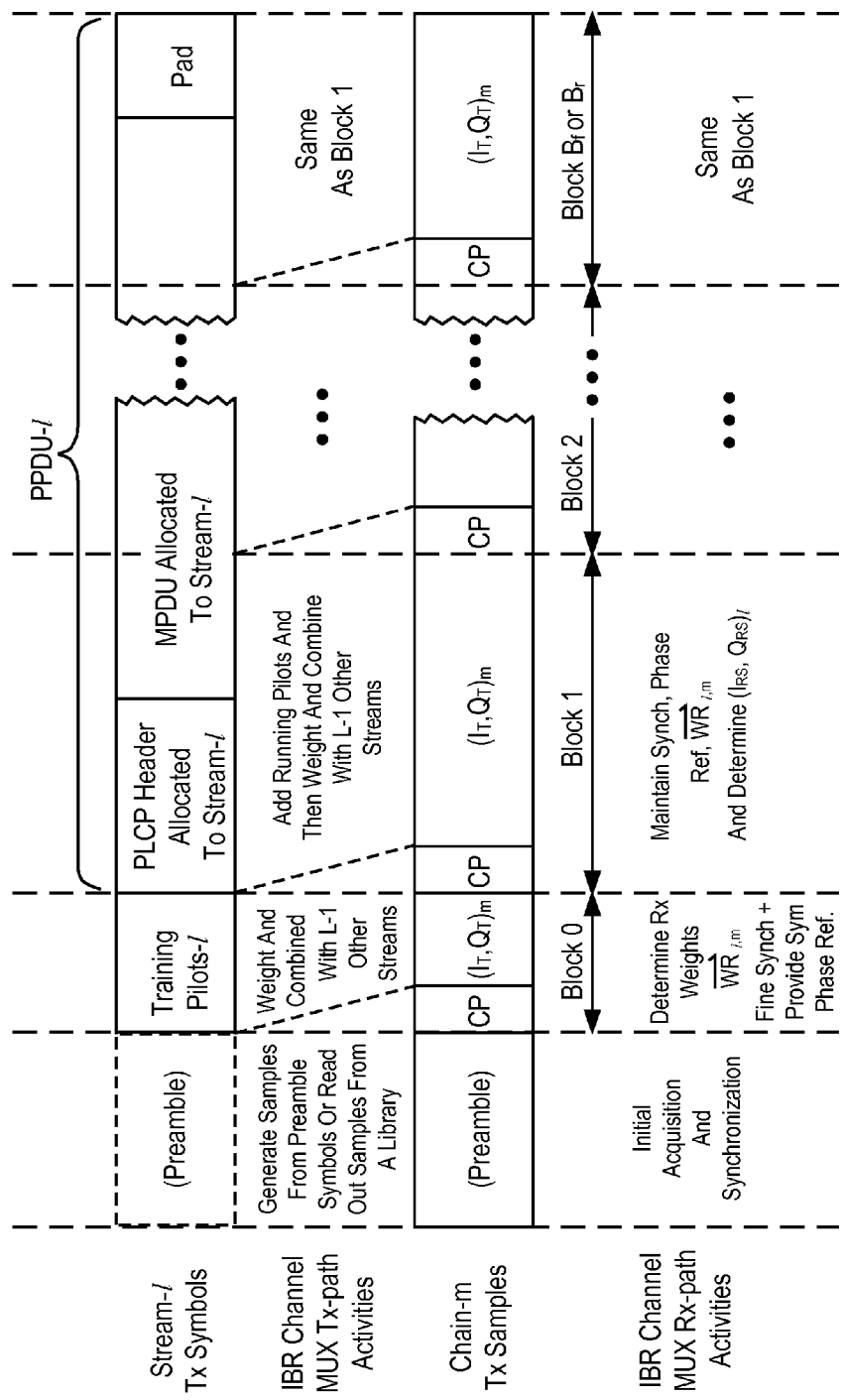
FIG. 26 is a timing diagram illustrating processing of PPDU-l with Tx-path and Rx-path of respective IBR channel MUXs according to one embodiment of the invention.

FIG. 26 illustrates this Preamble in the time domain. Note that the optional Preamble for the l-th Tx-path in a transmitting IBR could be either generated from a symbol library (as indicated optionally in Pilot (And Preamble) Symbol Library 2328 of FIG. 23) or read directly from a Preamble Samples Library 2324 (also indicated optionally in FIG. 23).

Referring again to FIG. 23B, the Acquisition/Synchronization detector 2336 acquires a timing reference, for example, from detection of one or more of the up to L optional preambles, one or more of the blocks of Training Pilots, an optional known pattern within a PLCP header, and/or pilot symbols within blocks of transmit symbol streams. The Acquisition/Synchronization detector 2336 provides a feedback signal to each Rx-DFE-n 2340 that enables, for example, symbol rotation and alignment in the time domain (typically in the RX-DFE-n using a CORDIC algorithm). The Acquisition/Synchronization detector 2336 further provides symbol boundary and block boundary timing references (not shown) for use by various elements of the IBR Channel MUX 628 and the IBR Modem 624.

Such corrected receive symbol samples are then supplied to a respective CPR and Block Assembler-n 2344. "CPR" means "cyclic prefix removal." The CPR and Block Assembler-n 2344 effectively discards the number of received samples at beginning of each block corresponding to the number of cyclic prefix samples prepended to each block in the transmit path of the transmitting IBR. The remaining samples are serial to parallel buffered into a single block (or an equivalent operation) suitable for decomposition into receive chain frequency domain subchannels in each respective Complex DFT-n 2348.

Figure 25:
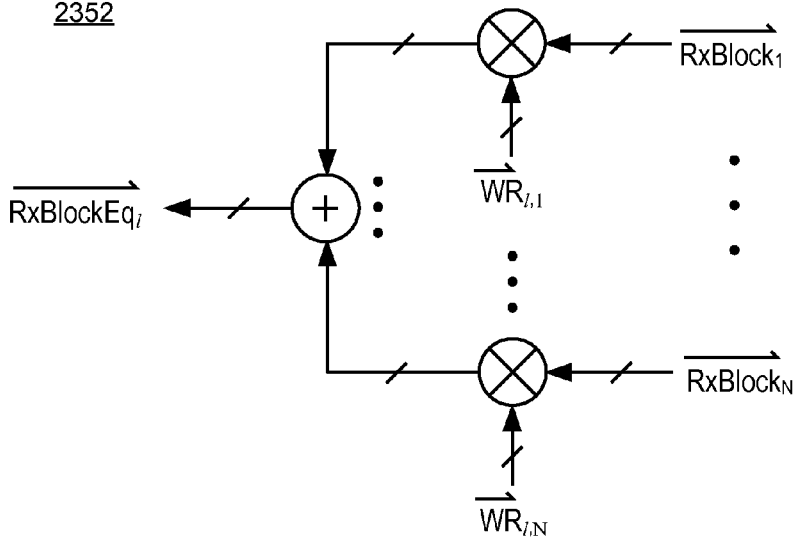
FIG. 25 is a block diagram illustrating an exemplary Rx-CE-l according to one embodiment of the invention.

As shown in FIG. 23B, the sets of receive chain frequency domain subchannel samples output from the N Complex DFT-n 2348 are collectively supplied to L frequency domain receive channel equalizers 2352, each a Rx-CE-l. FIG. 25 illustrates an exemplary embodiment of Rx-CE-l 2352. The receive channel equalizer Rx-CE-l 2352 is analogous to the transmit channel equalizer Tx-CE-m 2308 shown in FIG. 24. Although implementation details of each Rx-CE-l 2352 can vary considerably just as described above for TX-CE-m 2308, essentially the frequency domain receive vectors of I and Q samples for each block, $\overrightarrow{RxBlock_n}$, are respectively complex multiplied by complex receive weights $\overrightarrow{WR_{l,n}}$ and then complex summed to produce a set of channel-equalized frequency domain estimates, $\overrightarrow{RxBlockEq_l}$, representative of the original transmitted block corresponding to stream l.

The task of producing such complex receive weight vectors $\overrightarrow{WRl,n}$ that allow each Rx stream l to be separated from the myriad of signals, both desired and undesired, received via N (N≧L) receive chains is performed by the Channel Equalizer Coefficients Generator 2332 of FIG. 23A. There are many known algorithms for generating the appropriate frequency selective complex receive weight vectors for the IBR Channel MUX as shown in FIG. 23 wherein a known "Training Block" of pilot symbols for each stream l is used to determine the receive weight vectors $\overrightarrow{WR_{l,n}}$ that allow linear detection of each $\overrightarrow{RxBlockEq_l}$ vector in view of the actual receive chain frequency domain subchannel samples observed for the N receive chains during a reception period corresponding to transmission of the Training Block (or block of Training Pilots). In general, a Channel Equalizer Coefficients Generator 2332 that is based on these algorithms calculates the various weights by comparing the actual receive chain frequency domain subchannel samples observed during the reception of the Training Block with the expected frequency domain subchannel samples corresponding to a particular known Training Block for any given transmit stream. Such algorithms include Zero Forcing (ZF), Maximal Ratio Combining (MRC) and Minimum Mean Square Error (MMSE). Alternatively, other known algorithms for non-linear detection of each $\overrightarrow{RxBlockEq}_l$ are also known, such as Successive Interference Cancellation (SIC) in combination with ZF, MRC or MMSE, V-BLAST (an acronym for "vertical Bell Labs Layered Space-Time) with ZF or MMSE, or Maximal Likelihood (ML).

The Channel Equalizer Coefficients Generator 2332 also supplies the complex transmit weight vectors $\overrightarrow{WT}_{m,k}$ used for transmit channel equalization within the exemplary IBR Channel MUX 628. In an ideal PTP TDD configuration where K=L, M=N, and no other co-channel interference beyond the multiple transmit streams, for frequency domain transmit channel equalization, a straightforward alternative is to derive $\overrightarrow{WT}_{m,k}$ directly from the computed $\overrightarrow{WR}_{l,n}$ of the previous superframe. However, this can be sub-optimal for situations in which a co-channel interferer, such as for example either another IBR PTP or PMP link in the same vicinity or a conventional PTP link nearby, affects the received signals at the N receive chains of the AE-IBR differently from those at the RE-IBR. An alternative is to calculate $\overrightarrow{WR}_{l,n}$ using both MMSE (which will maximize SINR at the receiver) and MRC (which will maximize SNR, or effectively maximize signal power, at the receiver) and then derive $\overrightarrow{WT}_{m,k}$ from the computed, but unused in receive channel equalization, $\overrightarrow{WR}_{l,n}$ for MRC. Note that for SC-FDE with no frequency selective channel equalization, then the constant $\overrightarrow{WT}_{m,k}$ values applied to all symbols in a $\overrightarrow{TxBlock}_k$ can be blended using known algorithms from vector $\overrightarrow{WT}_{m,k}$ values derived for MRC. This allows such an SC-FDE PTP transmitter to improve the overall signal quality at the other receiver while allowing the other receiver to equalize both interference and frequency selective fading effects. In view of the foregoing, it is advantageous for the PMP AE-IBR to use either OFDM or SC-FDE with transmit frequency selective channel equalization such that the Channel Equalizer Coefficients Generator can compute MIMO-SDMA complex weights, using for example known EBF or Space Time Adaptive Processing (STAP) algorithms, to minimize multi-stream interference to RE-IBRs that beneficially receive only a subset of the transmitted streams. If SC-FDE without frequency selective transmit equalization is used, there is still a benefit in using scalar $\overrightarrow{WT}_{m,k}$ transmit weights at the AE-IBR derived for streams to a given RE-IBR from previous superframe MRC at the AE-IBR receiver but some additional signal separation such as time and/or frequency may be required to direct data to specific RE-IBRs.

With reference back to FIG. 23B, each respective channel equalized and interference cancelled symbol samples stream vector $\overrightarrow{RxBlockEq}_l$ (or set of channel-equalized frequency domain estimates) is then supplied to an Rx-MUX-l 2356. For OFDM, this is typically a parallel to serial converter that removes the pilot subchannel symbol samples which are not needed in the IBR Modem. For SC-FDE, each Rx-MUX-l 2356 includes a Complex IDFT and a parallel to serial converter that removes the time domain symbol samples at the pilot symbol sequence positions. Note though that for IBR embodiments where the transmitter uses SC-FDE with frequency selective equalization and inserts the pilot symbols as "pseudo-subchannels" (see above), each Rx-MUX-l also needs to discard the pilot subchannels prior to the Complex IDFT transformation back to a time domain symbol samples stream. The output of each Rx-MUX-l is a receive symbol stream l that is provided to a respective input to a demodulator core j.

FIG. 26 illustrates block by block generation of a given transmit symbol stream l in the transmitter IBR as combined into a transmit chain m. The designator "l" is used in FIG. 26 instead of "k" for the transmitter to denote the generation of what becomes the "l-th" receive symbol stream being demodulated at the receiver. Per the above description of FIG. 23, optionally every PPDU-l can start with a Preamble of known samples that enables rapid signal acquisition and coarse synchronization. However, for some embodiments of the IBR in either FDD or in TDD with fixed and short superframe timing, it is not necessary to perform such acquisition and synchronization from the start of every PPDU. Thus, overhead can be advantageously minimized by either discarding the Preamble from the PPDU-l generation process, at least for subsequent PPDUs after startup, or effectively combining the desired characteristics of the Preamble into the Training Block via the Pilots-l. This approach can also be used with a Channel Sense Multiple Access (CSMA) approach to MAC scheduling to the extent that a timing master in the system, usually the AE-IBR, maintains sufficiently frequent timing synchronization transmissions.

In some embodiments, the PLCP Header for stream-l is matched to a particular block such that the modulation and coding scheme (MCS) of such PLCP Header block (see, for example, Block 1 of FIG. 26) is always predetermined and usually chosen to deliver the PLCP header with higher reliability than the data payload blocks to follow. In typical embodiments, the MCS includes an index number that conveys information regarding parameters used in the modulation mapping and the forward error correction encoding processes. In such embodiments, the PLCP Header typically conveys at least the information needed to inform the receiver at the receiving-end IBR of the MCS used for the data payload blocks to follow. In other embodiments, the MCS or information indicating an increment, decrement or no change amongst a list of possible MCS values is conveyed within Block 0 of FIG. 26 by, for example, adjusting the modulation of certain pilot symbols (or pilot subchannels). In the case where Block 1 of FIG. 26 can carry more data than just the PLCP Header alone, then the IBRs may allocate PPDU payload to Block 1 even though the bits may be transferred at a different MCS than that of subsequent Blocks.

In some embodiments, each Block 1 through f (or Block 1 through r) may correspond to the output of a block encoder and/or block interleaver of FIG. 19 or 21. "f" denotes a forward link transmitted from an AE-IBR to an RE-IBR and "r" denotes a reverse link transmitted from an RE-IBR to an AE-IBR. Furthermore, each Block may include error detection bits (such as an FCS) or error correction bits (such as for a Reed-Solomon or a Reed-Muller outer encoder) that can be used either for an Automatic Repeat reQuest (ARQ) re-transmission protocol of certain blocks or for input to an RLC and/or RRC entity at either the AE-IBR or RE-IBR to optimize future link parameters or resource selections.

Figure 27:
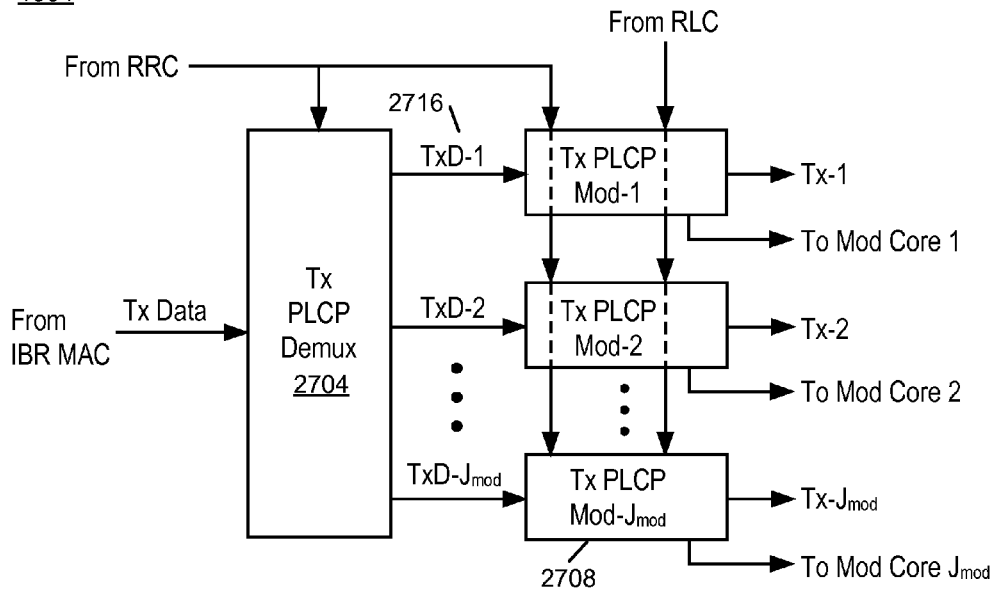
FIG. 27 is a block diagram illustrating an exemplary Tx PLCP according to one embodiment of the invention.

FIG. 27 illustrates an exemplary embodiment of the Tx PLCP generator 1804 of the IBR modem of FIG. 18. As shown in FIG. 27, the Tx PLCP generator 1804 includes a Tx PLCP Demux 2704 and multiple Tx PLCP Modulators 2708. Based on input from the RRC 660, the Tx PLCP Demux 2704 provides data interface streams TxD-j 2716, for j=1 to Jmod, to respective TxPLCP Mod-j 2708 that provide transmit data interface streams Tx-j 2720 to a respective Modulator Core j 1812 (shown in FIG. 18).

In a PTP IBR configuration, such a plurality of data interface streams 2716 and Modulator Cores 1812 may be used, for example, to provide link diversity, such as different sets of RLC parameters, carrier frequencies and/or antenna selections where each set has appropriately multiplexed streams and chains, or to provide probing capability. In a PMP IBR configuration, in addition to the above for PTP, such a plurality of data interface streams and Modulator Cores may also be used at an AE-IBR to optimize data transfer to certain RE-IBRs (or groups of RE-IBRs) by using techniques such as SDMA.

Figure 28:
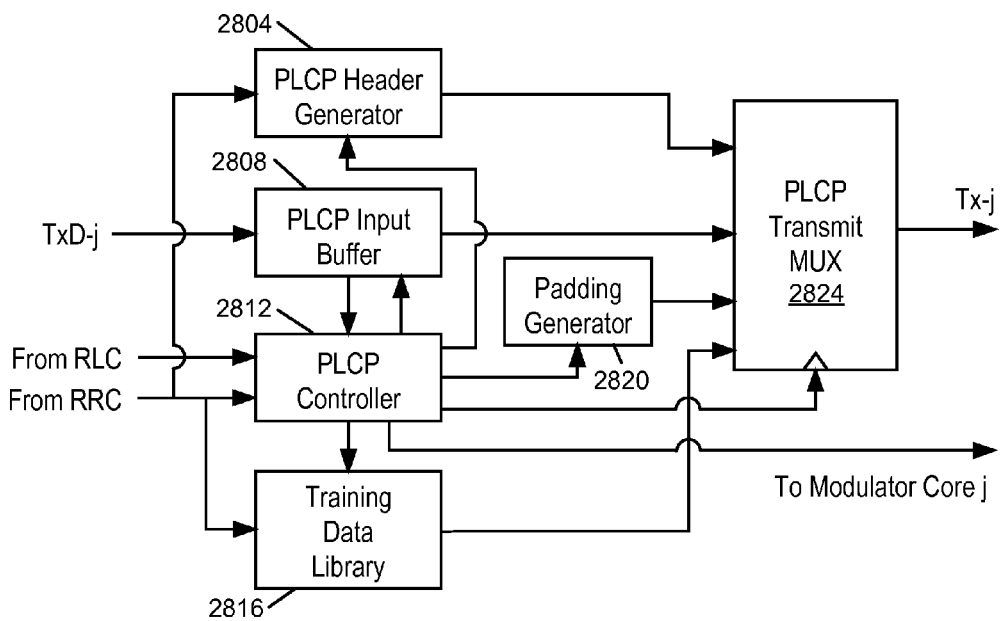
FIG. 28 is a block diagram illustrating an exemplary Tx PLCP Mod-j according to one embodiment of the invention.

FIG. 28 illustrates an exemplary embodiment of the TxPLCP Mod-j 2708 of FIG. 27. As shown in FIG. 28, the TxPLCP Mod-j 2708 includes a PLCP header generator 2804, a PLCP input buffer 2808, a PLCP controller 2812, a training data library 2816, a padding generator 2820 and a PLCP transmit MUX 2824. In FIG. 28, the PLCP Controller 2812 takes input from the RLC and the RRC as well as the current state of the PLCP Input Buffer 2808 to perform "rate matching" for a given PPDU. Rate matching typically is used to determine a particular choice of modulation and coding scheme (MCS) in view of the instantaneous data transfer demand and recent link conditions. In addition to choosing an MCS, the PLCP Controller 2812 supplies information to the PLCP Header Generator 2804 and directs the PLCP Input Buffer 2808 and the Padding Generator 2820 to supply data to the PLCP Transmit Mux 2824. Depending on the status of the RRC and the instantaneous data transfer demand, the PLCP Controller 2812 also enables training data from the Training Data Library 2816 to be multiplexed into a given PPDU as indicated by certain fields in the PLCP Header. Typically, in some embodiments, the PLCP Header conveys at least the MCS of the PPDU after Block 1, the length of the PPDU payload (for example, either in bytes of payload or in number of blocks plus length in bytes of padding), the MCS of any training data, the selected training dataset, and the number of training data blocks. Optionally, reply acknowledgements (ACKs) or non-acknowledgements (NACKs) for one or more previous receive PPDUs corresponding to a companion receive data interface stream j may also be sent in the PLCP Header. To the extent that the PLCP also concatenates multiple MPDUs and/or fragments thereof, the PLCP Header Generator also includes sufficient information to allow the RxPLCP to recover such MPDUs and/or fragments upon receipt. As described above, FIG. 26 illustrates an exemplary PPDU having a PLCP Header, a PPDU payload including one or more MPDUs or fragments thereof, and a PAD to cause the PPDU to occupy an integer number of Blocks as shown. Not shown in FIG. 26 is a PPDU extension with one or more Blocks of data from the Training Data Library 2816 of FIG. 28 as may be indicated by the PLCP Header.

Note that for Modulator Cores 1812 that divide each transmit data interface stream Tx-j into two or more transmit symbol streams, the PLCP Header of FIG. 28 may be an amalgam of two or more PLCP Headers for respective transmit symbol streams especially in the case where a separate MCS applies to each stream (the "vertical encoding" case shown for example in FIG. 21). Alternatively, a single PCLP Header may be used per Modulator Core j 1812 with parts of the PLCP Header apportioned amongst two or more transmit symbol streams (the "horizontal encoding" case shown for example in FIG. 19). Another alternative would have a single PLCP Header encoded and replicated across all transmit symbol streams of a particular Modulator Core j 1812. In some embodiments, each PLCP Header further includes an FCS (not shown in FIG. 28) to enable the Tx PLCP to determine if the PLCP Header has been demodulated and decoded without error. Note also that the PLCP Controller 2812 may be used in certain embodiments to provide or control the provision of timing signals to the IBR Channel MUX 628 (not shown in FIG. 23) that enable insertion of either or both of the optional Preamble or of the block of Training Pilots as shown in FIG. 26. In exemplary embodiments, a block of Training Pilots, used, for example, to update transmit and/or receive weights by the IBR at an opposite end of a link, may be inserted at the beginning of every transmit superframe, the beginning of every PPDU (as shown in FIG. 26), or at such intervals within a PPDU or superframe as may be communicated to the Tx PLCP generator 1804 or IBR Channel MUX 628 via the RRC 660.

Figure 29:
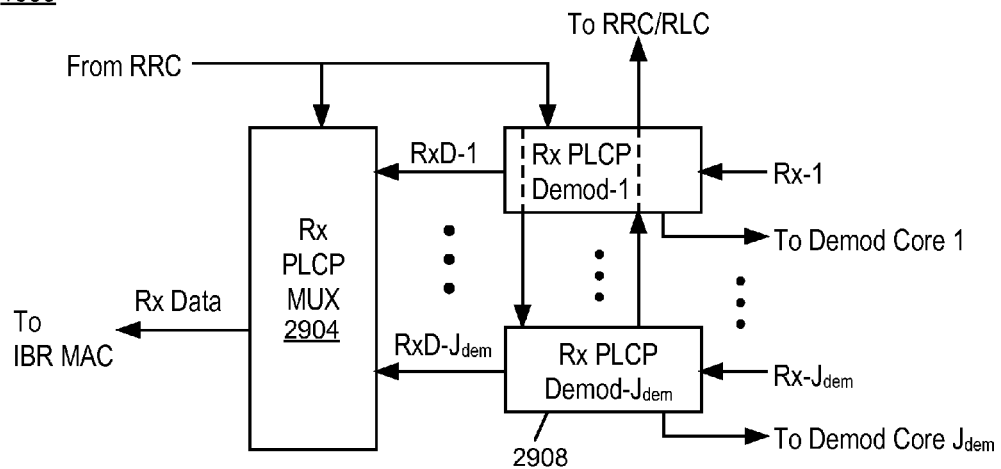
FIG. 29 is a block diagram illustrating an exemplary Rx PLCP according to one embodiment of the invention.

FIG. 29 illustrates an exemplary embodiment of the Rx PLCP analyzer 1808 of FIG. 18. As shown in FIG. 29, the Rx PLCP analyzer 1808 includes a Rx PLCP MUX 2904 and multiple Rx PLCP Demod-j 2908. In FIG. 29, multiple receive data interface streams Rx-j each from respective Demodulator Core j 1812 (see FIG. 18) are input to a respective Rx PLCP Demod-j 2908. After removing the respective PLCP Headers, Padding (if any), and Training Data (if any), each RxD-j is then multiplexed in the RX PLCP Mux 2904 and transferred to the IBR MAC 612 as Rx Data 620.

Figure 30:
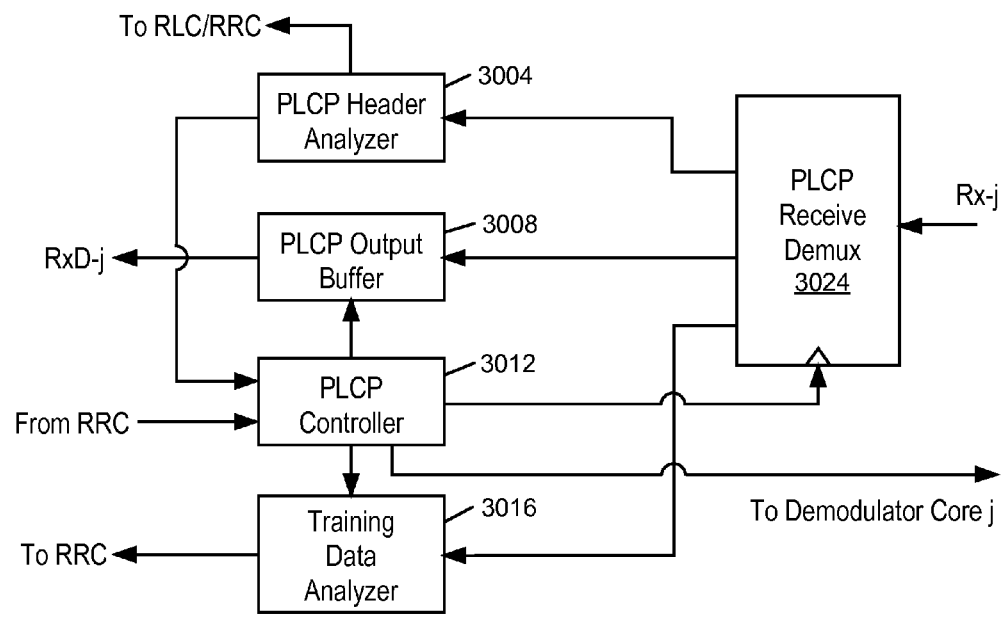
FIG. 30 is a block diagram illustrating an exemplary Rx PLCP Mod-j according to one embodiment of the invention.

FIG. 30 illustrates an exemplary embodiment of the Rx PLCP Demod-j 2908 of FIG. 29. As shown in FIG. 30, the RxPLCP Demod-j 2908 includes a PLCP header analyzer 3004, a PLCP output buffer 3008, a PLCP controller 3012, a training data analyzer 3016, and a PLCP receive Demux 3024. The PLCP Controller 3012 may be shared in some embodiments with the PLCP Controller 2812 of FIG. 28. The Tx or Rx PLCP Controllers 2812, 3012 may also be shared across some or all data interface streams. When a PPDU is received from a receive data interface stream Rx-j, the PLCP Header Analyzer 3004 filters certain fields from the PLCP Header and sends this information to the PLCP Controller 3012 (or alternatively, is a part of the PLCP Controller 3012). This enables the exemplary PLCP Controller 3012 to signal the MCS for subsequent symbols or blocks to Demodulator Core j 1812 as shown in FIG. 30 and to control the PLCP Receive Demux 3024 such that the receive data interface stream Rx-j is directed to the PLCP Output Buffer 3008 or Training Data Analyzer 3016 or ignored in the case of Padding. Further information from the PLCP Header Analyzer 3004 and/or PLCP Controller 3012 enables the Training Data Analyzer 3016 to determine the match between transmitted and received/demodulated/decoded training data and communicate certain metrics such as the number of bit errors and the distribution of errors to the RRC 660. In embodiments where the PLCP header carries an FCS, the PLCP Header Analyzer 3004 also checks the FCS (not shown in FIG. 30) and if a failure occurs, signals at least the PLCP Controller 3012, the RRC 660, and the RLC 656. The PLCP Controller 3012 may optionally also inhibit sending RxD-j for the instant PPDU in the case of such an FCS failure or it may send it on with an indicator (not shown) to the IBR MAC that such an FCS failure has occurred.

With reference back to FIGS. 6 and 7, other IBR elements include the IBR MAC 612, the Radio Link Control (RLC)

656, the Radio Resource Control (RRC) 660 and, specific to FIG. 7, the IBMS Agent 700. Although IBR embodiments are possible wherein the MAC 612, RLC 656, RRC 660 and IBMS 700 are distinct structural entities, more commonly IBRs are realized wherein the IBR MAC 612, RLC 656, RRC 660, IBMS 700 and portions of the IBR Interface Bridge 608 are software modules executing on one or more microprocessors. Note also that in some IBR embodiments that use of a "Software Defined Radio" (SDR) as the IBR Modem 624 and/or IBR Channel MUX 628 or portions thereof may also be realized in software executing on one or more microprocessors. Typically in SDR embodiments, the one or more microprocessors used for elements of the PHY layer are physically separate from those used for the MAC 612 or other layers and are physically connected or connectable to certain hardware cores such as FFTs, Viterbi decoders, DFEs, etc.

Figure 31:
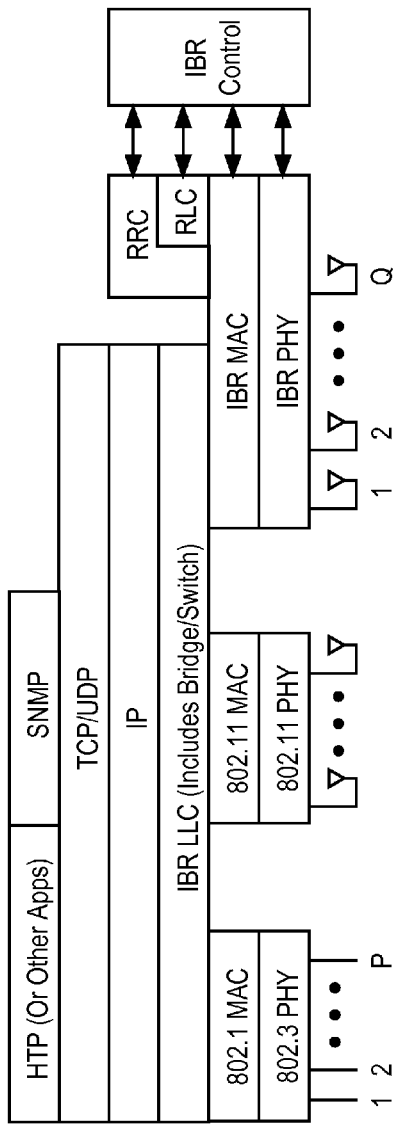
FIG. 31 is a schematic diagram of an IBR communications protocols stack according to one embodiment of the invention.
Figure 32:
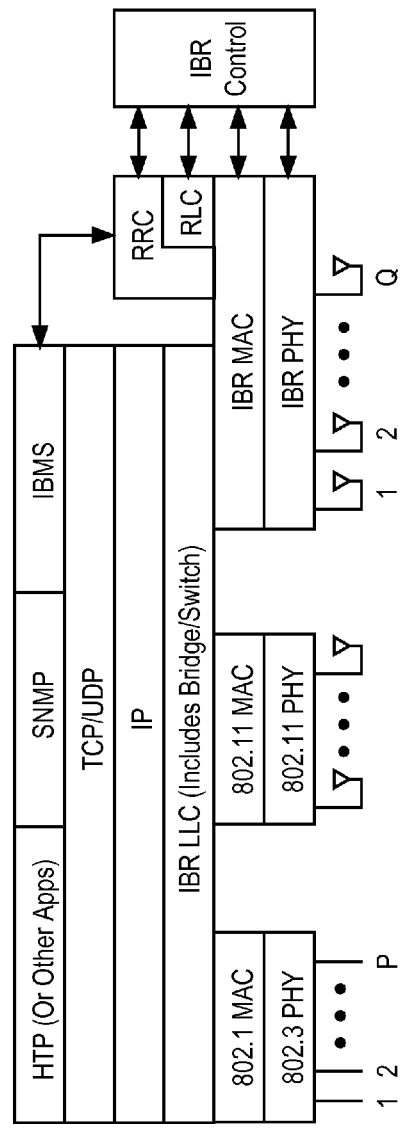
FIG. 32 is a schematic diagram of an IBR communications protocols stack according to one embodiment of the invention.

FIGS. 31 and 32 illustrate exemplary views of the IBRs of FIGS. 6 and 7, respectively, showing exemplary communications protocols stacks. It will be appreciated that some embodiments have the one or more 802.1 MAC instances, the IBR LLC, the IBR MAC, the RRC, the RLC, the IBMS and all other upper layer protocols implemented as software modules or processes executing on one or more microprocessors within the IBR.

In accordance with the previous description of the IBR Interface Bridge 608, the 802.1 MAC instances of FIGS. 31 and 32 correspond respectively to Ethernet interfaces 604 and are substantially conventional. Each 802.1 MAC instance is paired with a respective 802.3 PHY instance of which exemplary types include 100 Base-T, 1000 Base-T and various members of the 1000 Base-X family of fiber optic interfaces.

In many exemplary embodiments of the IBR, the IBR Logical Link Control (IBR LLC) layer of FIGS. 31 and 32 is compatible with IEEE 802.2. In accordance with the previous description of the IBR Interface Bridge, the IBR LLC layer also uses substantially conventional processes to bridge, for example, 802.2 compatible frames across disparate media types as exemplified by the 802.1, the 802.11 and the IBR MAC layers of FIGS. 31 and 32. Furthermore, in accordance with the previous description of the IBR Interface Bridge, the IBR LLC layer also uses substantially conventional processes to switch and/or load balance 802.2 compatible frames amongst multiple 802.1 MAC instances if available.

FIGS. 31 and 32 depict an exemplary IEEE 802.11 compatible radio (also known as "WiFi") including 802.11 MAC and 802.11 PHY layers and one or more antennas. In some IBR embodiments, such an 802.11 radio, which may be compatible with 802.11b, 802.11a, 802.11g, 802.11n or other 802.11 PHY layer variants, within the IBR may be configured as an access point (AP) to allow significant wireless local area network (WLAN) traffic to be backhauled by the IBR over its wireline or wireless interfaces as appropriate. In some embodiments, the same antennas may be utilized in both the IBR PHY, which typically includes the IBR Modem 624, IBR Channel MUX 628, IBR RF 632 and IBR Antenna Array 648 in reference to FIGS. 6 and 7, and the 802.11 PHY (e.g., via the IBR RF Switch Fabric of FIG. 10 (not shown)). Note further that multiple instances of the 802.11 radio can also be connected to the IBR LLC in an analogous manner to connecting multiple Ethernet interfaces.

Another IBR embodiment may provide a more limited 802.11 radio capability for local configuration purposes (to the exclusion of WLAN traffic and general access). Traditionally PTP and PMP systems have provided a "console" input for local configuration via a command line interface of radios in the field particularly for situations where network configuration is either unavailable or undesirable. However, when an IBR is deployed, for example, on a street light, traffic light, building side, or rooftop, a wired console access with a terminal may be extremely inconvenient and/or dangerous. Thus, in some embodiments, 802.11 radios are deployed as an access point such that terminals including smartphones, tablets, laptops or other portable computing devices with 802.11 station capability can connect to such IBRs in such a console mode. In one embodiment, this deployment is used solely for configuration purposes. Configuration by a terminal with 802.11 station capability is also possible in the case of one or more 802.11 APs deployed for WLAN access purposes. Note further that for the configuration-only 802.11 AP in an IBR, exemplary embodiments may also deploy the 802.11 radio as an Ethernet device on one of the P Ethernet interfaces depicted in FIGS. 6, 7, 31 and 32, or via some other IBR-internal wired or bus interface. In such configuration-only 802.11 AP IBR embodiments, one or more separate antennas for 802.11 use would typically be provided by the IBR. Furthermore, the configuration-only 802.11 interface is not restricted to AP mode only but can also include peer to peer ("IBSS"), AP mode at the terminal, or WiFi direct.

With reference to FIGS. 31 and 32, typical applications protocols such as Hyper Text Transfer Protocol (HTTP), Simple Network Management Protocol (SNMP), and others can also be implemented using substantially conventional software processes or modules executing on one or more microprocessors within exemplary IBRs. Such applications protocols can get access to or be accessed from any of the depicted network interfaces in FIGS. 31 and 32 via industry-standard Transmission Control Protocol (TCP) or User Datagram Protocol (UDP) transport layer protocols and the Internet Protocol (IP) network layer protocol. TCP, UDP and IP can be implemented using substantially conventional software processes or modules executing on one or more microprocessors within exemplary IBRs. Note that in certain deployments, such as backhaul within a cellular operator's radio access network (RAN), messages to or from HTTP, SNMP or other applications protocols may need to be sent either via other transport and network protocols or via encapsulation of TCP/UDP and IP segments and packets within such other transport and network protocols (not shown in FIGS. 31 and 32). Note further that messages to or from applications protocols in the IBR may also bypass the TCP/UDP and IP protocols, or their equivalents, entirely during a console mode (not shown) using a locally connected terminal.

FIGS. 31 and 32 also illustrate an exemplary element entitled "IBR Control" which is typically implemented as a distribution plane of interconnects, buses and/or controllers that arbitrate direct communications between the RRC and RLC entities with various elements of the IBR MAC and IBR PHY. Because the IBR Control does not pass information amongst such entities by using the communications protocols stack, such information can be communicated with minimal latency for real time control.

Figure 33:
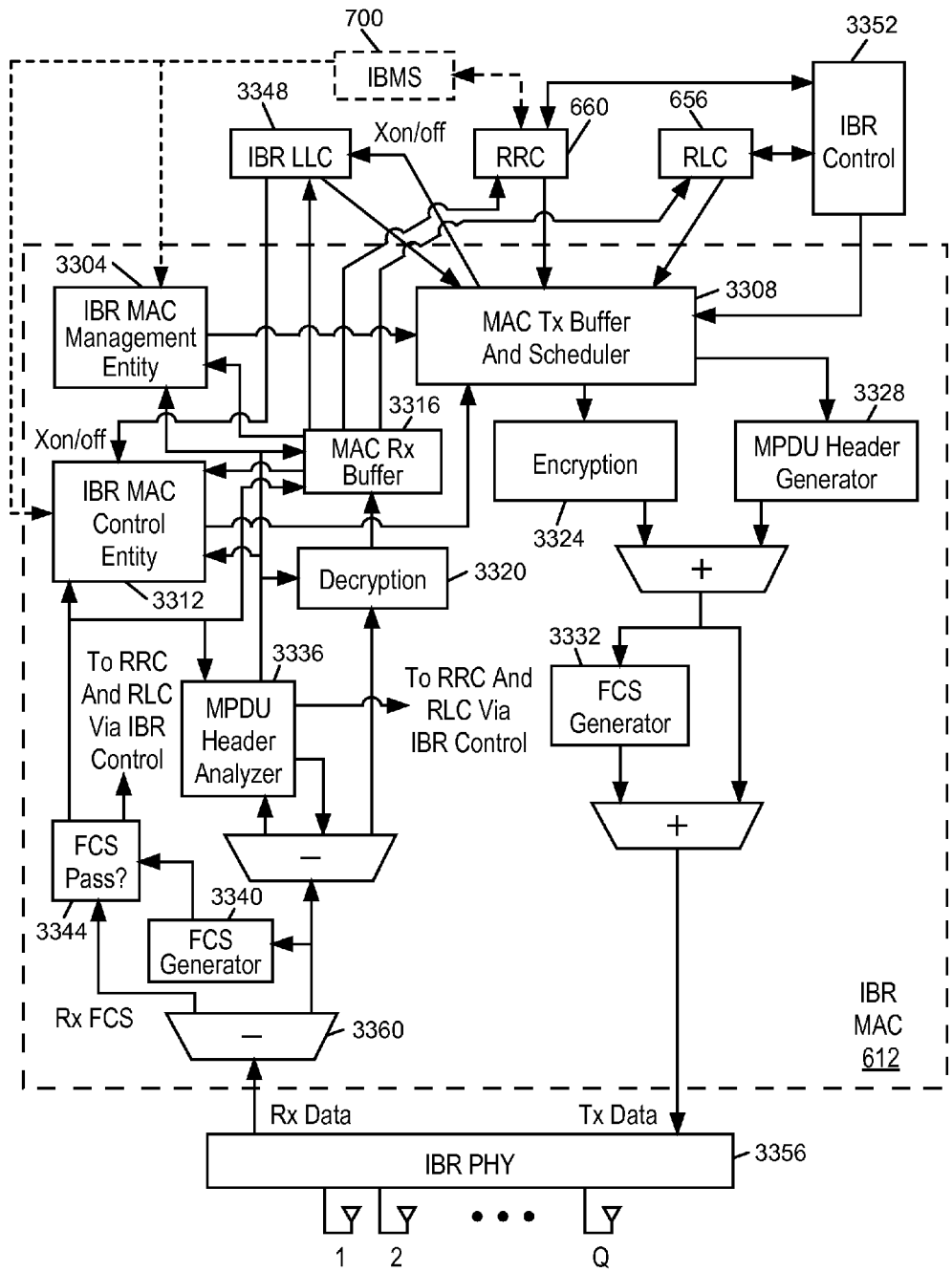
FIG. 33 is a block diagram of an IBR media access control (MAC) according to one embodiment of the invention.

FIG. 33 illustrates an exemplary implementation of the IBR MAC 612. The IBR MAC 612 is shown in terms of various functional elements and some of their relationships to each other as well as to the IBR PHY, the IBR LLC, the RRC, the RLC and the IBR Control. Operation of the IBR MAC of FIG. 33 may depend on the type of "superframe" timing utilized. Typically, IBRs send a single PPDU per Modulator Core-j (or per transmit stream k), which may include Training Data blocks as described above, in a given transmit superframe (TxSF) and conversely will receive a single PPDU per Demodulator Core-j (or per receive stream 1) in a given receive superframe (RxSF).

As shown in FIG. 33, the IBR MAC 612 includes a IBR MAC management entity 3304, a MAC Tx Buffer and Scheduler 3308, an IBR MAC Control Entity 3312, a MAC Rx Buffer 3316, a decryption block 3320, an encryption block 3324, a MPDU header generator 3328, a first FCS generator 3332, a MPDU header analyzer 3336, a second FCS generator 3340 and a FCS Pass? analyzer 3344.

FIG. 34 illustrates channel activity for a modulator and demodulator pair j with data interface streams Tx-j and Rx-j respectively versus time for an exemplary IBR using FDD with fixed superframe timing. Similarly, FIG. 35 illustrates analogous channel activity for TDD with fixed superframe timing and FIG. 36 illustrates analogous channel activity for TDD and Collision Sense Multiple Access (CSMA) with variable superframe timing.

Figure 4:
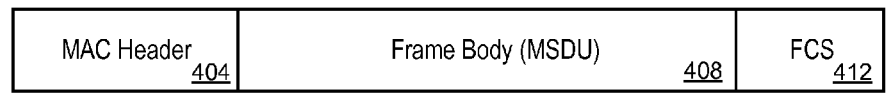
FIG. 4 is an illustration of a MAC Protocol Data Unit (MPDU).

With reference back to FIG. 33, the operation of the IBR MAC is first described in the context of an example based on TDD/CSMA with variable superframe timing. As shown in FIG. 36, in CSMA transmissions by either the AE-IBR or RE-IBR paired in an active link, whether PTP or PMP, defers to other channel activity detected within its present receive antenna pattern. In practice, this can be achieved by using the receive portion of the IBR PHY to determine in channel and in-view signal energy which if above a threshold causes an inhibit control signal at either a Tx PLCP Mod-j of FIG. 27 (not shown) corresponding to the affected link or at the MAC Tx Buffer and Scheduler of FIG. 33 (not shown) identifying the affected link. For purposes of this description, the latter option is considered. Furthermore, it is assumed that for this specific example every MSDU or frame request at the MAC Tx Buffer and Scheduler results in a single MPDU based on such MSDU or frame request (see, for example, FIG. 4) that is then matched to a single PPDU in the Tx PLCP corresponding to a given link. Other variants are possible with the IBR MAC and IBR PHY as discussed subsequently.

With reference again to FIG. 33, the primary source of MSDUs to the MAC Tx Buffer and Scheduler 3308 is typically in the data plane from the IBR LLC 3348. Either MSDUs and/or frame requests in the control plane can originate from the RRC 660 (or indirectly from the optional IBMS Agent 700), the RLC 656, the IBR MAC Management Entity 3304, or the IBR MAC Control Entity 3312. Exemplary details of frame requests and/or MSDUs originating from the RRC 660 or RLC 656 are discussed subsequently.

Exemplary frames originating at the IBR MAC Management Entity 3304 include those associated with management processes such as Association, Authentication and Synchronization. In some cases, the IBR MAC Management Entity 3304 may send an MSDU payload to the MAC Tx Buffer and Scheduler 3308 with a specific frame request type. In other cases, the IBR MAC Management Entity 3304 may send only the specific frame request type wherein all relevant information to be conveyed to the receiving IBR(s) will be present in the MPDU Header to be generated based on the details of the frame request type and other information presently known to the IBR MAC.

In some embodiments, Association and Authentication processes can occur via exchange of management frames in a substantially conventional fashion. A particular RE-IBR may choose to associate with a given AE-IBR by sending an Association Request management frame directed to the AE-IBR based on either advertised information received from such AE-IBR and/or configuration information currently present in the RE-IBR. Upon receipt of an Association Request, the AE-IBR can proceed according to its presently configured policies to associate with or deny association to the RE-IBR. If associated, the AE and RE would exchange authentication frames in substantially conventional fashion to ensure that compatible encryption/decryption keys are present for subsequent frame exchanges.

In exemplary IBRs, an RE-IBR can, for example, associate with a different AE-IBR if its present AE-IBR (or its wireline link interface) fails, the link throughput falls below a minimum threshold, the present AE-IBR forces a disassociation, the present AE-IBR inhibits link resource allocations to the RE-IBR below a minimum threshold, or the RE-IBR becomes aware of a preferred AE-IBR, all as set by certain configuration policies at the time as may be set by the optional IBMS Agent 700 as shown in FIG. 33. Furthermore, certain exemplary IBRs with a plurality of modulator cores can as an RE-IBR maintain a plurality of current associations with multiple AE-IBRs per configuration policies to enable enhanced throughput and/or link diversity.

Another set of exemplary management frames issued by the IBR MAC Management Entity 3304 concerns synchronization, status and presence. Periodically, (as configured or directed by the optional IBMS Agent 700) an exemplary AE-IBR may choose to send a Synchronization Frame that advertises certain capabilities of the AE-IBR including wireline link failure conditions and provides a time stamp reference usable by exemplary RE-IBRs for timing synchronization as either broadcast uniformly across the full directionality possible for the IBR Antenna Array and/or across all current links. Advantageously, particularly for an AE-IBR with multiple associated RE-IBRs in a PMP configuration, such a Synchronization Frame (or other such management frame) can direct one or more RE-IBRs to make internal reference timing offsets such that the time of arrival of transmissions from such RE-IBRs is more optimally aligned for best simultaneous reception at the AE-IBR in either FDD or TDD with fixed superframe timing (see FIGS. 34 and 35). For example, the AE-IBR may determine such timing offsets within the Acquisition/Synchronization element of the IBR Channel MUX 628 by analyzing preamble samples corresponding to particular RE-IBR transmissions.

With reference again to FIG. 33, exemplary frames originating at the IBR MAC Control Entity 3312 include those associated with control processes such as Acknowledgement and Access Control. Analogously to the IBR MAC Management Entity 3304, the IBR MAC Control Entity 3312 may send an MSDU payload to the MAC Tx Buffer and Scheduler 3308 and/or a specific frame request type wherein relevant information can be conveyed to the receiving IBR in the MPDU Header.

In exemplary IBRs, Acknowledgement Frames can provide an ACK or NACK indication for configured frame types recently received. The frames are identified uniquely and then set to ACK or NACK based on the receive path FCS comparison process illustrated in FIG. 33. To minimize transport overhead, implementation complexity and transmit latency, some embodiments of the IBR utilize a NACK protocol administered by the IBR MAC Control Entity. With reference to FIGS. 34-36, upon receipt of one or more MPDUs within RxSF(s), where "s" is a superframe sequence number, then if any MPDU has an FCS failure within RxSF(s), a NACK bit is set in the MPDU Header of the first (or each) MPDU within TxSF(s+1). If the originating IBR detects a positive NACK in TxSF(s+1) at its receiver, then such an IBR will re-transmit via its MAC Tx Buffer and Scheduler 3308 the MPDU (or MPDUs) associated with RxSF(s) using link parameters as determined by its RLC 656 at that time. For the FDD case of FIG. 34, such re-transmitted MPDU (or MPDUs) originally from RxSF(s) would at least partially be received in RxSF(s+2) whereas for the TDD cases of FIGS. 35 and 36, it would be RxSF(s+1). If there were no FCS failures in RxSF(s), or the originating IBR fails to detect a positive NACK in TxSF(s+1) for any reason, then the originating IBR will clear the MPDU (or MPDUs) associated with RxSF(s) from its MAC Tx Buffer and Scheduler 3308. Note that unlike conventional ACK protocols, this exemplary IBR NACK protocol does not guarantee 100% delivery of MPDU. However, occasional MPDU delivery failures are typically correctable at a higher layer for data plane MSDUs (i.e., using TCP or an equivalent transport layer protocol), non-catastrophic for management or control plane frames to the IBR MAC Management Entity 3304, the IBR MAC Control Entity 3312, the RRC 660, or the RLC 656, and preferable to the increased latency and jitter of conventional ACK protocols applied to backhaul for those data plane MSDUs not subject to higher layer correction (i.e. using UDP or an equivalent transport layer protocol). Note further that this NACK protocol is also advantageously used when PLCP Header FCS failures occur by, for example, having the Rx PLCP Demod-j discarding such a failed PPDU but substituting an MPDU with correct link ID but dummy FCS to RxD-j in FIGS. 29 and 30 to trigger an FCS failure at the IBR MAC 612.

In some embodiments, Access Control Frames are initiated at the IBR MAC Control Entity 3312 to control the behavior of other IBRs with current links to the initiating IBR. Such Access Control Frames can, for example, restrict the rate at which data plane MSDUs are sent, restrict the timing in which data plane MSDUs are sent, or temporarily inhibit further data plane MSDUs from being sent in a local overloading scenario. For example, an exemplary AE-IBR could utilize Access Control Frames to enforce access policies discriminatorily amongst multiple RE-IBRs according to certain configuration parameters such as a Service Level Agreement (SLA). Such access policies may also be set via the optional IBMS Agent 700 as shown in FIG. 33.

With reference to FIG. 33, the MAC Tx Buffer and Scheduler 3308 temporarily stores data plane MSDUs from the IBR LLC 3348 as well as frames or frame requests from the IBR MAC Management Entity 3304, IBR MAC Control Entity 3308, RRC 660 and/or RLC 656 until such data can be scheduled for transmission within one or more MPDUs. Such scheduling is advantageously performed based on policies either configured locally or optionally communicated from the IBMS Agent 700 via the RRC 660 and the IBR Control 3352. In some embodiments, data plane MSDUs from the IBR LLC 3348 usually are the lowest priority in the queue for scheduling composition of the next MPDU. If the rate of MSDU delivery from the IBR LLC 3348 exceeds the instant link delivery capability, then to avoid buffer overflow the MAC Tx Buffer and Scheduler 3308 may have an Xon/off control feedback to the IBR LLC 3348 to cause the IBR LLC 3348 to stop sending MSDUs until the appropriate buffer status returns. This may result in the IBR LLC 3348 causing certain other interfaces such as an Ethernet or WiFi interface to reduce MSDU traffic. To the extent that the ratio of control plane traffic to data plane traffic is small, as is by design for some embodiments, then scheduling priority amongst frames other than MSDUs from the IBR LLC 3348 is unimportant and "first-in, first-out" is sufficient.

Note that the foregoing embodiment of the MAC Tx Buffer and Scheduler 3308 performs scheduling based on frame type without regard for other information such as the PCP within an 802.1 MAC frame as may be present in MSDUs from the IBR LLC 3348. The IBR LLC 3348 in its bridging capacity may forward MSDUs to the MAC Tx Buffer and Scheduler 3308 in order based on PCP (or other such QoS or CoS indicators) so that the MAC Tx Buffer and Scheduler 3308 need not repeat the queuing exercise. In alternative embodiments, such QoS prioritization of MSDUs can also be performed at the MAC Tx Buffer and Scheduler 3308 instead.

Upon scheduling an MPDU for transmission as described above, the MAC Tx Buffer and Scheduler 3308 causes the MPDU Header Generator 3328 to compose an MPDU Header specific to the pending MPDU. In conventional IEEE 802 based communications systems, such an MPDU Header would include at least the physical address (also known as the "MAC address" or the "hardware address") of both the origination and destination IBRs. However, sending such physical addresses (typically 48 or, more recently, 64 bits) in every MPDU unduly burdens the IBR links with unnecessary overhead that reduces MAC efficiency. Thus, in some embodiments, a Link Identifier (LID) is substituted in every MPDU header instead. Exemplary LID implementations can be as few as 16 bits in length. For example, each exemplary LID may include an AE-IBR identifier of 10 bits and an identifier of 6 bits for an RE-IBR presently associated with the AE-IBR. This is possible because in some embodiments the IBRs are configured in view of their fixed geographic positions in the field as set at time of deployment or optionally controlled by the IBMS Agent 700 such that no overlapping AE-IBR identifiers are within radio range of RE-IBRs possibly associated with them. The AE-IBR may assign a locally unique RE-IBR association identifier field as part of the association process. For unassigned links, all zeros (or ones) can be sent for LID and then the frame payload, for example a management frame used in the association process, can include the full physical addresses as appropriate. Note that even if, in the alternative, that longer (possibly 24 bits or 32 bits) "regionally-unique" or even "globally-unique" LIDs were used, then because the overall number of worldwide backhaul links is generally much less the overall number of worldwide network devices, such extended length LIDs can still be much shorter than traditional IEEE 802 based addressing schemes.

A Frame Type Identifier (FTI) may be placed in the MPDU header by the MPDU Header Generator 3328. In one embodiment, the FTI is no more than 5 bits total. In one particular embodiment, the FTI is part of a Frame Control Field (FCF) of 8 bits, and the other 3 bits include 1 bit for the NACK protocol control bit indicator (set to 1 if the previous RxSF(s) had an MPDU with an FCS failure), 1 bit to indicate if the instant frame of the MPDU payload is encrypted, and 1 bit to indicate if the instant frame of the MPDU payload is the last frame (LF) in the payload. Alternatively, the 1 bit for the NACK can be 1 bit for the ACK indicator (set to 1 if the previous RxSF(s) had an MPDU without an FCS failure) if an ACK protocol is used for the instant MPDU FTI. Following this FCF byte, a 16 bit Fragment and Length Indicator (FLI) is placed sequentially in the MPDU header, wherein, for example, 3 bits of the FLI indicates by 1 bit if the instant frame payload is the last fragment and by 2 bits the fragment sequence number and 13 bits indicate the instant frame payload length in bytes. Following the 2 FLI bytes, an 8 bit Frame Sequence Number (FSN) is placed sequentially in the MPDU header. The FSN are typically sequentially generated except where repeated for those frame payloads sent as fragments. If LF=1 in the initial FCF byte of the MPDU header (as would be the case for the single MSDU of frame payload per MPDU scenario described above for TDD/CSMA), then the MPDU header is complete. If the MAC Tx Buffer and Scheduler 3308 is configured to permit concatenation of MSDUs or other frame payloads up to some maximum MPDU payload (as would be compatible with many TDD/CSMA deployments), then LF=0 when FLI describes an instant frame payload length sufficiently low to allow another available frame payload to be concatenated within the maximum MPDU payload length and an additional FCF, FLI and FSN combination would be generated at the MPDU Header Generator 3328 and repeated until an FCF with LF=1 is encountered. Note this process of concatenated FCF, FLI and FSN fields within an MPDU header corresponding to concatenated frame payload can also be advantageously applied to fixed superframe timing in either FDD or TDD as illustrated in FIGS. 34 and 35.

The MAC Tx Buffer and Scheduler 3308 further provides the one or more frame payloads that form the MPDU payload to the Encryption element 3324 to be encrypted on a frame payload by frame payload basis as indicated in the FCF using substantially conventional encryption algorithms. An exemplary algorithm suitable for the IBR is the Advanced Encryption Standard (AES) which has been published by the National Institute of Standards and Technology. In one embodiment, the IBRs use AES with a 256 bit key length. Other key lengths and other encryption algorithms are also possible for exemplary IBRs. Exemplary IBRs can also employ encryption for all frames after encryption keys are exchanged during authentication (and even including association and authentication frames to the extent encryption keys sufficient at least for association and authentication are provided to IBRs via, for example, factory setting or console mode interface).

The encrypted (and/or unencrypted as desired) frame payload(s) and the MPDU header are then concatenated together as shown in FIG. 33 and then passed through an FCS Generator 3332 that generates an FCS (e.g., of at least 32 bits in length). Alternatively, some IBR embodiments may also encrypt (and decrypt) MPDU headers. Other IBR embodiments may attain some measure of MPDU header privacy (and PLCP header privacy) by setting scrambler and descrambler parameters (see FIGS. 19-22) derived from, for example, the encryption keys and/or LID. The FCS is then appended following the MPDU header and frame payload(s) as also shown in FIG. 33 to complete the composition of an MPDU to be sent to the IBR PHY 3356 over the Tx Data interface.

Note also that for those frame types, particularly certain management frames originating at the AE-IBR of a PMP configured deployment, that are intended to be broadcast to all current links at an IBR, such frame payloads may be distributed to all such links in parallel at the MAC Tx Buffer and Scheduler 3312 such that the same frame payload is provided to at least one MPDU corresponding to each current link. The IBRs typically generate very little broadcast traffic and most Ethernet or WiFi broadcast traffic on the other IBR interfaces is filtered at the IBR LLC 3348.

With reference to FIG. 33, the receive path of the exemplary IBR MAC performs essentially the reverse operations described above in the transmit path. Starting with the IBR PHY 3356, after the Rx PLCP analyzer 1808 (see FIG. 18) recovers an MPDU, it is passed via the Rx Data interface in FIG. 33 to a splitter 3360 within the IBR MAC. The splitter 3360 removes the trailing bits of the MPDU corresponding to the FCS, or RxFCS. The remainder of the MPDU minus RxFCS is passed through an FCS Generator 3340, the result of which is compared at FCS Pass? analyzer 3344 to determine if it is identical to RxFCS. If it is identical, then a known-good (barring the extraordinarily rare false positive FCS event) MPDU is received. The FCS Pass? status is communicated to the IBR MAC Control Entity 3312, the MAC Rx Buffer 3316, the MPDU Header Analyzer 3336, and the RRC 660 and RLC 656 (for analytical purposes) as shown in FIG. 33. The MPDU Header Analyzer 3336 receives from a second splitter the leading bits of the MPDU corresponding to a minimum length MPDU header described above. If LF=1, then the remaining payload portion of the MPDU is passed to the Decryption element 3320 (or bypassed if appropriate) for decryption when the encryption indicator bit of the FCF is set. The MPDU Header Analyzer 3336 may also verify (or cause to be verified) that the payload length corresponds to that described in the FLI field of the MPDU Header and that the LID is valid. Upon decryption (as appropriate), the MPDU payload is passed to the MAC Rx Buffer 3316 which then forwards the MSDU or frame payload to the IBR MAC Management Entity 3304, the IBR MAC Control Entity 3312, the IBR LLC 3348, the RRC 660 or the RLC 656 as appropriately directed by the MPDU Header Analyzer 3336 based on LID and FTI. The MPDU Header Analyzer 3336 may also directly signal the IBR MAC Control Entity 3312 with the status of the NACK bit in the exemplary MPDU header described above. In the event that the instant frame payload is a fragment, as evident by the FLI field in the exemplary MPDU header described above, then the MPDU Header Analyzer 3336 instructs the MAC Rx Buffer 3316 based on the FSN field to either store the fragment, concatenate the fragment to one or more other stored fragments, or deliver the multiple fragments if the instant fragment has the last fragment indicator within the FLI field as described above. Optionally if a positive ACK protocol is used for 100% delivery of every MPDU (versus the superframe NACK protocol described above), then the MDPU Header Analyzer 3336 also verifies the FSN for duplicated detection and discards (or causes to be discarded) such duplicate payloads.

In the event that the MPDU being received has multiple concatenated MSDUs and/or frame payloads as described optionally above, then the MPDU Header Analyzer 3336 interacts with the second splitter via the feedback signal shown to continue parsing off consecutive MDPU header bytes, for example the repeated exemplary FCF, FLI and FSN fields, until an FCF with LF=1 is encountered. The above described process for the MPDU Header Analyzer 3336 directing the Decryption element 3320 and the MAC Rx Buffer 3316 to deliver the multiple payloads is then repeated either serially or in parallel as desired until all contents of the MPDU payload have been resolved by the IBR MAC.

In the event that the FCS Pass? analyzer 3344 described above determines an FCS failure then the receive path of the exemplary IBR MAC operates differently depending on certain options that may be designed into the IBR or selected based on configuration policies. For the superframe NACK protocol described above, the FCS failure is directly communicated to the RRC 660 and RLC 656 (via the IBR Control 3352 of FIGS. 31-33) for their analytical purposes and is directly communicated to the IBR MAC Control Entity 3312 so that TxSF(s+1) is sent with NACK=1 in the exemplary MPDU header described above. Optionally, the MPDU Header Analyzer 3336 may attempt to determine if an apparently valid MPDU header is present, and, if so, attempt to deliver certain MSDUs or frame payloads as described above for the case of a known-good MPDU. However, as directed by configuration policies, certain frame types may be discarded. For example, in one embodiment, only MSDUs to the IBR LLC 3348 that correspond to apparently valid MPDU header fields would be delivered in an FCS failure situation, and even then only after buffering such MSDUs for one additional superframe period to determine if a duplicate FSN MSDU may be available due to the re-transmission attempt associated with the superframe NACK protocol described above. Alternatively, in the case of an ACK protocol that guarantees 100% delivery of known-good MPDUs, then the entire MPDU payload is discarded.

For the types of data throughput rates and superframe lengths that are practical, the single payload MPDU per superframe example described above for the TDD/CSMA example of FIG. 36 is not an optimum choice for the fixed superframe timing examples for FDD in FIG. 34 or TDD in FIG. 35. One alternative uses concatenated multi-payload frame MPDUs up to some maximum length and then forwards such MPDUs to the Tx PLCP to compose PPDUs as described previously. Another alternative, compatible with the superframe NACK protocol described above, would have the MAC Tx Buffer and Scheduler 3308 utilize the same information from the RLC 656 and the RRC 660 available to the Tx PLCP and thus compose a single multi-payload MPDU that will, with appropriate padding added in the Tx PLCP to an integer block count, maximally occupy the available PPDU for the pending superframe.

Note that for the TDD case depicted in FIG. 35 with fixed superframe timing, IBRs are capable of operating in such modes wherein the superframe timing in the forward link from AE to RE may be different than in the reverse link. For a PMP AE-IBR this typically requires that all RE-IBRs adopt the same superframe timing parameters in association with this particular AE-IBR. Some RE-IBRs, in either PTP or PMP configurations, may be simultaneously associated with two or more AE-IBRs to the extent such IBRs permit this policy and have sufficient radio resources to maintain such links. Given that multiple AE-IBRs associated with such RE-IBRs can adopt different TDD fixed superframe timing parameters relative to each other, such timing parameters may be communicated to all RE-IBRs via management frames originating in the IBR MAC Management Entity 3304. Similarly, to the extent an RE-IBR is limited in superframe timing access due to such multiple associations, such an RE-IBR can communicate such restrictions to the AE-IBRs via management frames from its IBR MAC Management Entity 3304.

For PMP configurations, the AE-IBR can advantageously transmit to or receive from multiple RE-IBRs simultaneously in a given radio channel using SDMA as described above. To the extent that the number of RE-IBRs associated with an AE-IBR exceeds either the AE-IBR's available SDMA resources or certain RE-IBRs are not spatially separable by the AE-IBR, then simultaneous transmissions to such RE-IBRs would require multiple radio channels which in practice is often either undesirable or impractical. Another alternative for maintaining links to RE-IBRs wherein such SDMA capabilities are being exceeded is through the use of Time-Division Multiplexing (TDM). For either an FDD or TDD system with fixed superframe timing, such as depicted in FIGS. 34 and 35, an AE-IBR can use TDM to designate certain "subframes" within a given superframe applied to a modulator/demodulator resource pair j to particular LIDs. Management frames from the AE-IBR's IBR MAC Management Entity 3304 can, in exemplary embodiments, inform affected RE-IBRs of such LID to TDM sub-frame mappings and associated subframe timing parameters. In some embodiments, any RE-IBR associated with two or more AE-IBRs simultaneously could request that such LID to TDM sub-frame mappings and/or timing parameters account for its local timing preferences for optimally maintaining such simultaneous links. The MAC Tx Buffer and Scheduler 3308 may compose MPDUs in view of TDM sub-frame timing parameters that are assigned such that the TxPLCP can optimally utilize an integer number of transmit blocks in each sub-frame. The number of sub-frames per superframe are typically relatively low (e.g., usually less than 5).

To the extent that IBRs deployed in the field are within co-channel interference range of each other and configured to use overlapping channels in general or periodically, such IBRs advantageously synchronize their TDD fixed superframe timing to minimize simultaneous co-channel TxSF/RxSF overlaps amongst disparate links. Several exemplary synchronization strategies may be used by such IBRs to align superframe timing boundaries in such scenarios. For example, if "free-running" or "self-synchronizing" IBRs are able to detect at least a preamble, a training block, a PLCP header, an unencrypted MPDU header, or other information such as management frames with timing information that may be decipherable without link-specific encryption keys that correspond to links involving a different AE-IBR, then the slower in time IBRs may adopt the superframe timing boundary and cadence of the faster in time IBRs. At the AE-IBR, which may act as a local timing master, this can be performed directly by making a timing offset and communicating it to is associated RE-IBR(s). At the RE-IBR, which may be able to detect disparate link information otherwise undetectable at its associated AE-IBR, the RE-IBR can inform its AE-IBR via a management frame of any timing offset necessary to obtain local disparate AE-IBR co-channel superframe timing synchronization. It will be appreciated that this process is ongoing because after synchronizing, the reference clocks in the AE-IBRs inevitably will drift differently over time.

In certain field deployment scenarios, IBRs located in the same regional area may be capable of undesirably interfering with each other at ranges beyond their ability to detect and synchronize as described above. An alternative synchronization strategy better suited to this situation would utilize a network-wide central synchronization capability. One example of this would be the use of Global Positioning Satellite (GPS) timing at each AE-IBR. GPS is more than adequate in terms of timing accuracy for the needs of synchronizing superframe timing boundaries. However, GPS adds cost, size, power consumption and form factor constraints that may be undesirable or unacceptable to some IBRs. Note further that because IBRs are designed to operate in street level deployments with obstructed LOS, GPS may fail to operate in places where RE-IBRs function normally. Another alternative would be to use a system-wide synchronization technique such as SynchE or IEEE 1588v2. In this scenario, AE-IBRs are configured to derive timing parameters in a consistent fashion. Alternatively, the AE-IBRS include IBMS Agents capable of coordinating such configurations when co-channel operation in a mutual interfering deployment is encountered.

In the deployment scenario where multiple AE-IBRs are co-located (e.g., at a single pole, tower, building side or rooftop), even if such IBRs are configured to avoid co-channel operation, at least some form of local superframe timing synchronization for TDD may be utilized to avoid overloading receiver RF/analog circuits from simultaneous in-band transmissions and receptions amongst the co-located IBRs. One exemplary strategy for the above synchronization would be to distribute by hard wiring a local superframe timing synchronization signal which can be configured at or arbitrarily assigned to any one of the co-located IBRs.

Note that the foregoing descriptions and figures for exemplary IBR embodiments have provided minimal internal details on the distribution of various clocks and timing references amongst the structural and functional elements of the IBR. These exemplary embodiments can all be realized using substantially conventional strategies for internal timing distribution.

As described above, IBRs with fixed superframe timing may use a NACK protocol wherein a previous superframe FCS failure in receive causes NACK=1 in an MPDU header of the respective link in transmitting its next sequential superframe PPDU back to the sender of the MPDU received in error. If the original sender detects NACK=1, then a re-transmission of the previous superframe PPDU contents occurs at the direction of its MAC Tx Buffer and Scheduler 3308. Otherwise, the original sender discards the previous superframe PPDU contents at its MAC Tx Buffer and Scheduler 3308. This approach is different from many conventional wireless data networking protocols that use ACK receipt to guarantee 100% delivery at the MAC layer even if theoretically unbounded re-try attempts may be required. This fixed superframe NACK protocol is similar to using an ACK protocol with a "time to live" of effectively one superframe duration after initial transmission. This approach advantageously bounds the latency at a very low length for processing frames through the IBR MAC without resorting to reliability of simply the raw frame error rate. By allowing one immediate re-transmission opportunity, this fixed superframe NACK protocol effectively produces a net frame error rate that is the square of the raw frame error rate. For example, if the raw frame error rate were $10^{-3}$ (1 in 1000), the net frame error rate per the fixed superframe NACK protocol should be approximately $10^{-6}$ (1 in 1,000,000).

To improve the reliability of the fixed superframe timing NACK protocol even further, IBRs may have the TxPLCP set a 1 bit field in the PLCP header(s) for the Modulator Core j corresponding to the LID with NACK=1 (or with a previous RxSF(s) PLCP header FCS failure as described above). This approach advantageously exploits the fact that PLCP headers, typically sent at the most reliable MCS, are of short duration and always sent immediately after the Training Block 0 (see FIG. 26) where the channel equalization coefficients most accurately reflect current conditions. Thus, a NACK bit sent in a PLCP header is likely to be received accurately even if the PPDU payload that includes the MPDU header NACK field is not. In the case where NACK=1 in a PLCP header, an exemplary PLCP Header Analyzer 3004 (see FIG. 30) will signal the exemplary MAC Tx Buffer and Scheduler 3308 via the IBR Control 3352. In the case where an originator of an MPDU does not receive a valid NACK field in either the PLCP header or the next MPDU header of a subsequent transmit superframe, then the MAC Tx Buffer and Scheduler 3308 may choose to re-send the pending MPDU(s), possibly at a more reliable MCS as directed by the RLC 656, or may choose to discard the pending MPDU(s) so as not to cascade latency for further frames awaiting transmission. Such a decision may be made based on configurable policies that may vary with current conditions or be updated by the IBMS Agent 700. To the extent that a "blind" retransmission is made due to an invalid NACK field wherein the actual NACK field value was NACK=0, then the receive path MPDU Header Analyzer 3336 at the destination IBR will discard the re-sent MPDU(s) based on duplicate detection of the FSN at the MPDU Header Analyzer 3336 shown in FIG. 33. The MPDU Header Analyzer 3336 may also report incidents of duplicate detections of MPDUs for a given LID to the RRC 660 and RLC 656 as shown in FIG. 33. This provides an advantageous additional local indication to the RRC 660 and RLC 656 of problems being encountered in the transmit direction from such an IBR for the particular LID.

With reference to FIGS. 31 and 32, the RRC 660 and RLC 656 interact with the IBR MAC 612 and various elements of the IBR PHY both via "normal" frame transfers and direct control signals via the conceptual IBR Control plane. Both the RRC 660 and the RLC 656 may execute concurrent control loops with the respective goals of optimizing radio resource allocations and optimizing radio link parameters for current resources in view of the dynamic propagation environment conditions, IBR loading, and possibly system-wide performance goals (via the optional IBMS Agent 700). It is instructive to view the RLC 656 as an "inner loop" optimizing performance to current policies and radio resource allocations for each active link and to view the RRC 660 as an "outer loop" determining if different policies or radio resource allocations are desirable to meet overall performance goals for all IBRs currently interacting with each other (intentionally or otherwise). Typically both the RRC 660 and the RLC 656 are implemented as software modules executing on one or more processors.

The primary responsibility of the RLC 656 in exemplary IBRs is to set or cause to be set the current transmit MCS and output power for each active link. In one exemplary embodiment described above, the RLC 656 provides information to the TxPLCP that enables, for example, a PLCP Controller 2812 in FIG. 28 to set the MCS for a particular LID. In another embodiment compatible with the single MPDU for fixed superframe timing with NACK protocol example of IBR MAC operation, the RLC 656 determines the MCS for each LID and then communicates it directly to the MAC Tx Buffer and Scheduler 3308 of FIG. 33 and the PLCP Controller 2812 for every TxPLCP Mod-j of FIGS. 27 and 28. The RLC 656 causes the transmit power of the IBR to be controlled both in a relative sense amongst active links, particularly of interest for the AE-IBR in a PMP configuration, and also in an overall sense across all transmits chains and antennas. In an exemplary IBR embodiment, the RLC 656 can cause such transmit power control (TPC) as described above by setting parameters at the Channel Equalizer Coefficients Generator 2332 of FIG. 23 (for relative power of different simultaneous modulation streams), at each active transmit RF chain Tx-m 636 of FIGS. 6, 7 and 16 (for relative power of different simultaneous RF chains) and at each Front-end PA 1104, 1204 within the IBR Antenna Array of FIGS. 6, 7, 10-12 (for total power from all antennas).

In some embodiments, the RLC 656 can determine its MCS and TPC selections across active links based on information from various sources within the IBR. For example, the IBR MAC can deliver RLC control frames from other IBRs with information from such other IBRs (for example, RSSI, decoder metrics, FCS failure rates, etc.) that is useful in setting MCS and TPC at the transmitting IBR. Additionally, such RLC control frames from an associated IBR may directly request or demand that the RLC in the instant IBR change its MCS and/or TPC values for transmit directly on either a relative or absolute basis. For TDD IBR deployments, symmetry of the propagation environment (in the absence of interference from devices other than associated IBRs) makes receiver information useful not only for sending RLC control frames to the transmitting IBR but also for use within the receiving IBR to set its transmitter MCS and/or TPC. For example, the FCS Pass? analyzer 3344 and MPDU Header Analyzer 3336 of the exemplary IBR MAC in FIG. 33 can supply the RLC 656 with useful information such as FCS failures, duplicate detections and ACK or NACK field values. Similarly, each PLCP Header Analyzer 3004 as shown in FIG. 30 can send the RLC FCS failure status on the PLCP Header and/or PPDU payload(s). Another possibility is to have the PLCP Header carry a closed-loop TPC control field requesting a TPC step up or down or stay the same. Additionally, the Channel Equalizer Coefficients Generator 2332 in computing channel weights can provide SNR and/or SINR information per demodulator stream that can help the RLC set MCS and/or TPC as shown in FIG. 23. Each decoder within each demodulator core j can provide the RLC 656 with decoder metrics useful for MCS and/or TPC as indicated by FIGS. 20 and 22 for example. And each receive chain Rx-n 640 of FIG. 17 can provide receive signal strength indicator (RSSI) values helpful especially for determining TPC requests back to the transmitting IBR.

The actual MCS values are typically selected from a finite length list of modulation types and coding rates. Exemplary IBRs can use QAM ranging from 2-QAM (better known as BPSK), through 4-QAM (better known as QPSK), 16-QAM, 64-QAM, 256-QAM and 1024-QAM. Exemplary IBRs can use a base coding rate of 1/3 or 1/2 and then can use "puncturing" (wherein predetermined bit positions are deleted in transmit and replaced by dummy bits in receive) to derive a set of effective coding rates of, for example only, 1/2, 2/3, 3/4, 5/6, 7/8, and 9/10. In typical embodiments, the lowest MCS index corresponds to the lowest available QAM constellation size and the lowest available coding rate (i.e. the most reliable transmission mode) and the highest MCS index corresponds to the converse.

The TPC absolute range tends to be lower for IBRs than that desired for many conventional wireless networking systems operating in obstructed LOS due to the more limited range of separations between AE-IBRs and RE-IBRs for backhaul applications (i.e. backhaul radios are almost never placed in close proximity to each other). The relative variation in desired power between active links at an AE-IBR may also limited in range particularly by the transmit DACs.

Many possible algorithms are known for generally relating information provided to the RLC 656 as described above to selecting MCS and TPC values. In dynamic propagation environments, averaging or dampening effects between channel quality information and MCS changes are advantageously utilized to avoid unnecessarily frequent shifts in MCS. To the extent that an IBR is operating at below the maximum allowable TPC value, it is generally advantageous to permit TPC to vary more quickly from superframe to superframe than the MCS. However, if operating at maximum allowable TPC, then it is often advisable to immediately down select MCS to a more reliable setting upon detection of an MPDU FCS failure and/or a NACK=1 condition. Conversely, up selecting MCS is usually performed only after repeated superframe metrics indicating a high likelihood of supporting an MCS index increase. At the limit, where RLC 656 has reached maximum TPC and minimum MCS (most reliable mode), to maintain ongoing link reliability, the imperative increases for the RRC 660 to allocate different resources to enable the RLC 656 to operate again in MCS and TPC ranges with margin for temporal channel impairment.

The primary responsibility of the RRC 660 is to set or cause to be set at least the one or more active RF carrier frequencies, the one or more active channel bandwidths, the choice of transmit and receive channel equalization and multiplexing strategies, the configuration and assignment of one or more modulated streams amongst one of more modulator cores, the number of active transmit and receive RF chains, and the selection of certain antenna elements and their mappings to the various RF chains. Optionally, the RRC may also set or cause to be set the superframe timing, the cyclic prefix length, and/or the criteria by which blocks of Training Pilots are inserted. The RRC 660 allocates portions of the IBR operational resources, including time multiplexing of currently selected resources, to the task of testing certain links between an AE-IBR and one or more RE-IBRs. The RRC 660 evaluates such tests by monitoring at least the same link quality metrics as used by the RLC 656 as evident in the exemplary embodiments depicted in FIGS. 6, 7, 17, 18, 20, 22, 23, 29, 30, 31, 32 and 33. Additionally, in some embodiments, additional RRC-specific link testing metrics such as those produced by the exemplary Training Data Analyzer described above for FIG. 30 in relation to the exemplary Training Data Library of FIG. 28 are used. The RRC 660 can also exchange control frames with a peer RRC at the other end of an instant link to, for example, provide certain link testing metrics or request or direct the peer RRC to obtain link specific testing metrics at the other end of the instant link for communication back to RRC 660.

In some embodiments, the RRC 660 causes changes to current resource assignments in response to tested alternatives based on policies that are configured in the IBR and/or set by the optional IBMS Agent 700 as depicted for example in FIGS. 7, 32, and 33. An exemplary policy includes selecting resources based on link quality metrics predicted to allow the highest throughput MCS settings at lowest TPC value. Additional exemplary policies may factor in minimizing interference by the instant link to other AE-IBR to RE-IBR links (or other radio channel users such as conventional PTP radios) either detected at the instant IBRs or known to exist at certain physical locations nearby as set in configuration tables or communicated by the optional IBMS Agent 700. Such policies may also be weighted proportionately to reach a blended optimum choice amongst policy goals or ranked sequentially in importance. Also as discussed above regarding the RLC 656, the RRC 660 may have policies regarding the fraction of IBR resources to be used for RRC test purposes (as opposed to actual IBR backhaul operations) that factor the current RLC settings or trajectory of settings.

The RRC 660 in one IBR can communicate with the RRC in its counterpart IBR for a particular link AE-IBR to RE-IBR combination. For example, the RRC 660 sends RRC control frames as discussed for the exemplary IBR MAC of FIG. 33 or invokes a training mode within the exemplary Tx PLCP as discussed for FIG. 28.

In some embodiments, for either PTP or PMP deployment configurations, the selection of either the one or more active RF carrier frequencies used by the RF chains of the IBR RF, the one or more active channel bandwidths used by the IBR MAC, IBR Modem, IBR Channel MUX and IBR RF, the superframe timing, the cyclic prefix length, or the insertion policy for blocks of Training Pilots is determined at the AE-IBR for any given link. The RE-IBR in such an arrangement can request, for example, an RF carrier frequency or channel bandwidth change by the AE-IBR by sending an RRC control frame in response to current link conditions at the RE-IBR and its current RRC policies. Whether in response to such a request from the RE-IBR or due to its own view of current link conditions and its own RRC policies, an AE-IBR sends the affected RE-IBRs an RRC control frame specifying at least the parameters for the new RF frequency and/or channel bandwidth of the affected links as well as a proposed time, such as a certain superframe sequence index, at which the change-over will occur (or alternatively, denies the request). The AE-IBR then makes the specified change after receiving confirmation RRC control frames from the affected RE-IBRs or sends a cancellation RRC control frame if such confirmations are not received before the scheduled change. In some deployment situations, the RRC policy condition causing the change in the RF carrier frequency and/or channel bandwidth for a particular LID may be a directive from the IBMS Agent 700.

The selection of other enumerated resources listed above at an IBR can generally be made at any time by any given IBR of a link. Additionally, requests from the opposite IBR can also be made at any time via RRC control frames. An RE-IBR typically attempts to utilize all available modulator and demodulator cores and streams as well as all available RF chains to maximize the robustness of its link to a particular AE-IBR. In an RE-IBR embodiment where at least some redundancy in antenna elements amongst space, directionality, orientation, polarization and/or RF chain mapping is desirable, the primary local RRC decision is then to choose amongst these various antenna options. An exemplary strategy for selecting antenna options (or other enumerated resources listed previously) at the RE-IBR is to apply alternative selections of such resources to the Training Data portion of PPDUs described above in relation to the Tx PLCP and FIGS. 27 and 28. The RRC 660 at the RE-IBR then compares link quality metrics such as those used by the RLC 656 and training data metrics from the exemplary Training Data Analyzer of FIG. 30 to determine if the alternatively-selected resources are likely to result in improved performance based on current IBR RRC policies compared to the known performance of the currently-selected resources of the instant link. If the RRC 660, based on one or more such alternative selection tests, decides that the instant link's performance goals are likely to improve by using the alternately-selected resources, then the RRC 660 at such RE-IBR can cause such selections to become the new current settings at any time and without requiring notification to the AE-IBR.

For the RE-IBR alternate resource selection process described above applied to a TDD configuration, channel propagation symmetry for a given link (if interference is ignored) may make changing to a corresponding set of resources for transmit from such RE-IBR as have been alternatively-selected for receive preferable. However, this is generally not true for an FDD configuration or a scenario where unknown interference represents a significant channel impairment or where a PMP AE-IBR has simultaneous links to other RE-IBRs. In such scenarios, an RE-IBR may notify the AE-IBR when such RE-IBR is testing alternately-selected resources in a portion of its Tx PPDUs, whether in response to an RRC control frame request by the AE-IBR or by such RE-IBR's own initiative, and then receive a return RRC control frame from the AE-IBR that either reports the measured link quality metrics observed at the AE-IBR and/or directs the RE-IBR to adopt the alternatively-selected resources for future Tx PPDUs from the RE-IBR on such link.

For the PTP configuration, an AE-IBR performs its RRC-directed alternate resource selections using substantially the same processes described above for the RE-IBR but with the roles reversed appropriately. In the PMP configuration, an AE-IBR may utilize similar RRC-directed testing of alternate resource selections across its multiple current links but to the extent that such links depend concurrently on certain resources, the decision to actually change to different resources may be based on policies applied to the benefit of all current links. One strategy for PMP operation of IBRs is to use the maximum possible RF chain and antenna element resources at all times at the AE-IBR and then optimize selectable resources at the RE-IBRs to best achieve RRC policy goals.

Note that in some deployment situations, spectrum regulations, such as those set by the Federal Communications Commission (FCC) in the USA, may require active detection of and avoidance of interference with other users of the spectrum (such as, for example, radar systems). The process of detecting such other co-channel spectrum users and then changing RF carrier frequencies to another channel void of such other uses is commonly called Dynamic Frequency Selection (DFS). Spectrum regulations may require that a DFS capability operate in a certain manner in response to certain interference "signatures" that may be detected at the receiver of a certified radio for such spectrum. For example, some regulations require that upon detection of certain pulse lengths and received powers that certified radios change immediately to another channel known from some minimum observation time not to have such interferers in operation. In some exemplary IBR implementations, such observations of alternative channels in advance of needing to make a change can be performed by time division multiplexing certain RF chain and antenna resources to make such measurements using RSSI and/or channel equalization metrics reported to the RRC 660. In some embodiments, the AE-IBR and the one of more associated RE-IBRs coordinate such observations using RRC control frames to minimally disrupt backhaul operations and maximally increase the aggregate observation time and improve the observation accuracy. In other exemplary IBR embodiments, at least one IBR, typically the AE-IBR, has at least one Rx-n chain, one antenna and possibly one demodulator core path through the IBR Channel MUX dedicated to such spectral observations.

In embodiments with the optional IBMS Agent 700, the above channel observation techniques of the RRC 660 can also be used in a "probe in space" mode of operation, either at one IBR or coordinated amongst multiple IBRs, to observe and record RF channel activity within designated portions of the addressable bands of operation. Such spectral analysis information may be passed from the RRC 660 to the IBMS Agent 700 for further analysis and possibly communication to other IBMS Agents or to other databases or expert systems elsewhere within the IBR operator's private network or to an external network such as the Internet.

Note also that the DFS operation described above is desirable for exemplary IBRs operating in spectrum bands that do not require DFS explicitly. For example, if IBRs are deployed in licensed spectrum where conventional PTP links operate, such conventional links generally lack the RF carrier frequency agility and radio resource control intelligence of the IBR. Even if the interference immunity capabilities of the IBR through the advantageous combinations of elements described herein is sufficient to reject the interference caused by such conventional PTP links at the IBR receiver, it is still desirable to have the RRC 660 perform DFS to avoid the converse scenario where the IBRs are interfering with the conventional PTP links. This may be advantageous because it minimizes licensed band user conflicts especially if a different operator uses the conventional PTP equipment from that operating the IBRs. The presence of the conventional PTP link may be detected in normal operation of the one or more IBRs using a particular RF carrier frequency channel or may be communicated to the RRC 660 via the optional IBMS Agent 700 that has gathered the information from another source. An exemplary technique that the RRC 660 can use in an IBR where N>L and the instant SINR is approximately the same as the SNR (i.e. no significant co-channel interference) per metrics available to the RRC 660 from the Channel Equalizer Coefficients Generator 2332 is to assign up to N minus L combinations of an antenna element 652, an Rx-n chain, and a channel MUX receive path to a Complex DFT-n to different frequency channels than the instant link channel to perform DFS or "probe in space" measurements and spectral analysis. For FDD configurations, assigning these combinations to monitor the instant or candidate transmit frequency channels (possibly during a time when the transmitter is otherwise inhibited) can allow the RRC to evaluate potential interference to other conventional PTP links and to adjust transmit resources accordingly. To the extent that the remaining at least L receive chains provide sufficient SNR or SINR to maintain the instant traffic load, this approach allows the RRC 660 to utilize available IBR resources simultaneously for both supporting link traffic and supporting DFS or "probe in space" measurements and spectral analysis.

As described previously, exemplary IBRs advantageously exploit the propagation path diversity usually present in an obstructed LOS environment to send multiple modulated streams concurrently and thus increase overall link throughput. For practical reasons regarding actual field deployments, it is likely that some IBRs will be deployed in locations where propagation may be dominated at least at some times by unobstructed LOS conditions. In such situations, IBR embodiments using the IBR Channel MUX 628 of FIG. 23 may not be able to resolve multiple streams during the training Block 0 of FIG. 26 because all streams arrive at all antennas by substantially similar paths which makes cancellation for multiple demodulation streams impractical. One alternative for the RRC 660 in this situation is to allocate one stream per link only. However, this results in reduced throughput for the link which is not only undesirable but highly counterintuitive for many backhaul operations personnel likely to perceive that unobstructed LOS should be "better" than obstructed LOS. Thus, the RRC 660 may also evaluate certain antenna selection options to intentionally create path diversity in otherwise unobstructed or nearly unobstructed LOS conditions.

A first alternative for the RRC 660 to provide multiple streams with both obstructed and non-obstructed LOS operation is the dynamic testing and possibly selection of mapping different modulator streams to different antenna elements (via separate RF chains) based on different antenna polarizations. Because of the typically substantial signal impairment associated with a link that is transmitting receiving from opposite polarization antenna elements, testing of alternative polarization antenna elements with training data may be pre-arranged in time by RRC control frames exchanged by both IBRs with an instant link. Similarly, the AE-IBR may select any changes in link antenna elements involving polarization and verify an agreed upon changeover time by RRC control frame exchange for reasons analogous to those for RF carrier frequency or channel bandwidth changes. A significant advantage of using polarization diversity amongst the set of selectable antenna elements is that multiple stream throughput can be maintained using a common set of channel equalization techniques as described above for MIMO operation with the exemplary IBR Channel MUX of FIG. 23.

A second alternative for the RRC 660 to provide multiple streams with both obstructed and non-obstructed LSO operation is the dynamic testing and possibly selection of mapping different modulator streams to different antenna elements (via separate RF chains) based on different direction orientations of antenna elements as is possible with exemplary antenna arrays such as those depicted in FIGS. 14 and 15. The RRC 660 in such IBR embodiments can test and/or changeover such multi-directional antenna element combinations entirely at one end of a link without the necessity of exchanging RRC control frames or requiring a coordinated changeover at both IBRs in a link simultaneously. For at least the preceding reason, this second alternative to maintaining multi-stream operation by using multi-directional antenna element combinations that intentionally create propagation path diversity may be desirable for an RE-IBR used in a PMP configuration. An example antenna array suitable for such an RE-IBR is depicted in FIG. 14. Furthermore, this directional orientation diversity strategy to multi-stream operation in otherwise unobstructed LOS is also advantageous compared to the polarization diversity option in PMP deployments because it does not require that the AE-IBR deploy certain resources (e.g., dedicated RF chains and antenna elements) to link modalities of benefit to some RE-IBRs but not others (that do experience obstructed LOS) as may occur with polarization diversity in a PMP deployment.

With reference to FIGS. 7, 32 and 33, the Intelligent Backhaul Management System (IBMS) Agent 700 is an optional element of the IBR that optimizes performance of the instant links at the IBR as well as potentially other IBR links in the nearby geographic proximity including potential future links for IBRs yet to be deployed. As described above in reference to the RRC 660 and depicted in FIG. 32, the primary interaction of the IBMS Agent 700 with the internal elements of the IBR is via a direct bi-directional path to the RRC 660. In one direction, the various policies and configuration parameters used by the RRC 660 to allocate resources within and amongst IBRs with active links to each other are sent from the IBMS Agent 700 to the RRC 660. In the return direction, the RRC 660 reports operational statistics and parameters back to the IBMS Agent 700 both from normal operation modes and from "probe in space" modes as directed by the IBMS Agent 700.

In contrast with the RRC 660, which communicates with other elements of the IBR internally or with other RRC entities at IBRs actively linked to its IBR, the IBMS Agent 700 can receive information from or transmit information to or initiate sessions with other elements of the overall IBMS that are logically located anywhere within any network (subject to appropriate access privileges). As shown in FIG. 32, the IBMS Agent 700 appears to the overall network as an Applications layer entity that exchanges messages typically over TCP/IP and any of the link layer interfaces within the IBR. For the common deployment of IBRs within a cellular system Radio Access Network (RAN) to backhaul cellular base station sites, it may be necessary for the IBR to tunnel TCP/IP across a cellular RAN specific transport and network layers protocol, such as GPRS Tunneling Protocol (GTP) to reach a gateway that bridges to TCP/IP and on to the desired other IBMS elements.

In some embodiments, the IBMS Agent 700 can act as an autonomous entity that per configuration settings draws information from network resources (whether private or public) and serves as an expert system local to be a specific IBR to optimize its performance. In other embodiments, the IBMS Agent 700 interacts with other peer IBMS Agents at other IBRs within its "interference" zone of influence via self-discovery within the immediate network so that such peer IBMS Agents can collectively optimize IBR performance within the zone. In some embodiments, the IBMS Agent 700 is a client of one or more IBMS servers that may be within the private and/or public networks such that communications with a particular IBMS Agent 700 is always to or from or via such IBMS servers.

The information gathered at the IBR and distilled by the IBMS Agent 700 regarding, for example, operational statistics (such as RSSI, channel equalization metrics, FCS failures, etc.) and resource selections (such as antennas, channel bandwidth, modulator stream assignments, etc.), may be sent to an IBMS server. Such information can be used by the IBMS server to improve performance predictability of future IBR deployments or to enable overall IBR system performance of all links within the purview of the IBMS server by policy optimization across IBRs. The communications from the IBMS server to the IBMS Agents can include such optimized policy parameters based on information from other IBMS Agents and private and/or public databases such as directories of known non-IBR links including their locations, antenna patterns, power levels, carrier frequencies and channel bandwidths, tower heights, etc.

With reference to FIGS. 31 and 32, other exemplary applications layer protocols are shown for the IBR. A Hyper Test Transfer Protocol (HTTP) server application can enable any browser (or browser-like application) on a networked computer, including a WiFi connected mobile device such as laptop, table or smart-phone, to query or modify various IBR configuration parameters. The Simple Network Management System client of FIGS. 31 and 32 is an example of an industry-standard network management utility that can also be used to query or modify IBR configuration parameters using tools such as HP Open View.

The foregoing description of the various elements of the IBR in reference to FIGS. 5-36 have described numerous exemplary embodiments. These exemplary element embodiments may be assembled together in many different combinations and permutations. A very short description of but a few of the possible overall IBR exemplary embodiments is summarized briefly below.

A first exemplary embodiment of an IBR includes the features outlined in Table 1.

TABLE 1

First Exemplary Intelligent Backhaul Radio Features

TDD operation
PTP configuration only (AE-IBR or RE-IBR)
SC-FDE modulation
Jmod = Jdem = 1
K = 2, M = 4
L = 2, N = 4
Q = 8, antenna array similar to FIG. 14
front facet with 2 Vertical and 2 Horizontal polarization antenna elements at 15 dBi
side facets each with 1 Vertical and 1 Horizontal polarization antenna elements at 12 dBi
QPSK, 16 QAM, 64 QAM, 256 QAM
1/3, 1/2, 2/3, 3/4, 5/6, 7/8 coding rates
1 or 2 modulated streams
MMSE combining of up to 4 receive chains
MRC weighting of up to 4 transmit chains based on blended weights per chain across entire channel as derived from Rx conditions
fixed superframe (1 ms) NACK protocol
up to 28 MHz channel bandwidth
single MPDU per PPDU This first exemplary embodiment can have a very high MAC efficiency (ratio of MPDU payload bits to overall MAC bits) under heavy loading from the IBR LLC—in excess of 95%. Furthermore, the PHY efficiency (ratio of time where PPDU payload symbols excluding PAD are actually transmitted to superframe time) can exceed 90% for typical channel impairment conditions and ranges of 2 km or less. At 28 MHz symbol rate and channel bandwidth, 256 QAM, 2 modulated streams, 7/8 rate coding, and with MAC and PHY efficiencies of 95% and 90% respectively, the aggregate bi-directional throughput for this first exemplary IBR embodiment can exceed 330 Mb/s with an average end to end latency of about 2 ms.

A second exemplary embodiment of an IBR includes the features outlined in Table 2.

TABLE 2

Second Exemplary Intelligent Backhaul Radio Features

TDD operation
PMP configuration as the AE-IBR

TABLE 2-continued

Second Exemplary Intelligent Backhaul Radio Features

OFDM modulation
Jmod = 2, Jdem = 3
K = 4, M = 4
L = 5, N = 5
Q = 9, antenna array similar to a 180° azimuth coverage "half-array" of FIG. 15
per each of 4 facets: 1 Vertical and 1 Horizontal polarization antenna elements at 15 dBi
on "top": 1 non-polarized, 180° azimuth (aligned with array) coverage 8 dBi element connected only to the $5^{th}$ Rx chain and $3^{rd}$ demodulator core
QPSK, 16 QAM, 64 QAM, 256 QAM
1/3, 1/2, 2/3, 3/4, 5/6, 7/8 coding rates
up to 2 modulated streams per modulator core
MMSE combining of up to 5 receive chains
Eigenbeamforming transmit SDMA of up to 4 transmit chains
fixed superframe (0.5 ms or 1 ms) NACK protocol
TDMA alternate superframe per RE-IBR up to 2 RE-IBRs per modulator core
up to 28 MHz channel bandwidth
single MPDU per PPDU This second exemplary embodiment uses OFDM rather than SC-FDE in order to enable transmit SDMA of up to 4 RE-IBRs (only 2 simultaneously) in a highly frequency selective channel. As discussed above, SC-FDE could also be used in this PMP AE-IBR with theoretically similar performance but with more complex baseband processing required. This second exemplary embodiment should have similar MAC efficiency to the first for the 1 ms superframe case but the PHY efficiency (which needs a definition that accounts for data block pilot subchannels and zero-padded subchannels) is typically lower with 85% being excellent. The eigenbeamforming may also require additional overheads in many propagation environments. If 4 RE-IBRs are used in TDMA mode, the latency would expand to 4-5 ms on average for 1 ms superframes and about half that for 0.5 ms superframes. With 2 RE-IBRs that are spatially separable and with operating parameters set as described for the first exemplary embodiment above, aggregate bi-directional throughput for this second exemplary embodiment can be as high as about 600 Mb/s. Note that the "top" antenna which is not connected to a transmit chain can be used to provide the MMSE combiner with an additional degree of freedom to cancel interference when 4 modulated streams from 2 RE-IBRs are being simultaneously received. It can also be used advantageously as a "probe in space" to provide information to the IBMS or to assist in DFS by scanning channels not currently used at the AE-IBR. Also note that although this second exemplary embodiment can be used as an RE-IBR for itself that preferably this role may be filled by the third exemplary embodiment described below.

A third exemplary embodiment of an IBR includes the features outlined in Table 3.

TABLE 3

Third Exemplary Intelligent Backhaul Radio Features

TDD operation
PTP configuration only (AE-IBR or RE-IBR) or PMP configuration as the RE-IBR
OFDM modulation
Jmod = Jdem = 1
K = 2, M = 4
L = 2, N = 4
Q = 8, antenna array similar to FIG. 14
front facet with 2 Vertical and 2 Horizontal polarization antenna elements

TABLE 3-continued

Third Exemplary Intelligent Backhaul Radio Features at 15 dBi
side facets each with 1 Vertical and 1 Horizontal polarization antenna elements at 12 dBi
QPSK, 16 QAM, 64 QAM, 256 QAM
1/3, 1/2, 2/3, 3/4, 5/6, 7/8 coding rates
1 or 2 modulated streams
MMSE combining of up to 4 receive chains
MRC weighting of up to 4 transmit chains based on blended weights per chain across entire channel as derived from Rx conditions
fixed superframe (1 ms) NACK protocol
up to 28 MHz channel bandwidth
single MPDU per PPDU Note that while this third embodiment can also be used as a PTP AE-IBR and RE-IBR combination, it is unlikely to provide meaningful performance improvements for PTP compared to the first exemplary embodiment and quite possibly would have slightly lower aggregate bi-directional throughput and would require a less efficient and more expensive power amplifier and stricter phase noise considerations. For commercially-available components today, using OFDM versus SC-FDE at RF carrier frequencies above 10 GHz is extremely challenging. Note that for below 10 GHz operation, it is commercially feasible today to use SDR baseband approaches and common chain and Front-end components to build an IBR software programmable as either the PTP first exemplary embodiment or the PMP RE-IBR third exemplary embodiment.

A fourth exemplary embodiment of an IBR includes the features outlined in Table 4.

TABLE 4

Fourth Exemplary Intelligent Backhaul Radio Features

FDD operation
PMP configuration as the AE-IBR
OFDM modulation
Jmod = 4, Jdem = 6
K = 8, M = 8
L = 10, N = 10
Q = 18, antenna array similar to FIG. 15
per each of 8 facets: 1 Vertical and 1 Horizontal polarization antenna elements at 15 dBi
on "top": 2 non-polarized, opposite facing, 180° azimuth coverage 8 dBi elements connected only to the respective ones of the $9^{th}$ and $10^{th}$ Rx chains and the $5^{th}$ and $6^{th}$ demodulator cores
QPSK, 16 QAM, 64 QAM, 256 QAM
1/3, 1/2, 2/3, 3/4, 5/6, 7/8 coding rates
up to 2 modulated streams per modulator core
MMSE combining of up to 10 receive chains
Closed-loop eigenbeamforming transmit SDMA of up to 8 transmit chains
fixed superframe (.5 ms or 1 ms) NACK protocol
TDMA round-robin superframe order per RE-IBR up to 4 RE-IBRs per modulator core
up to 28 MHz channel bandwidth
single MPDU per PPDU This fourth exemplary embodiment is similar to the second exemplary embodiment except that it utilizes a larger 360° azimuth antenna array and FDD operation as well as 4 time slot per modulator TDMA to support up to 16 RE-IBRs with an aggregate bi-directional throughput of about 2 Gb/s after the increased overhead in efficiencies of the system are accounted for. Latency also increases proportionally if 4 TDMA slots are used.

A fifth exemplary embodiment of an IBR includes the features outlined in Table 5.

TABLE 5

Fifth Exemplary Intelligent Backhaul Radio Features

FDD operation
PMP configuration as the RE-IBR
OFDM modulation
Jmod = Jdem = 1
K = 2, M = 4
L = 2, N = 4
Q = 8, antenna array similar to FIG. 14
front facet with 2 Vertical and 2 Horizontal polarization antenna elements at 15 dBi
side facets each with 1 Vertical and 1 Horizontal polarization antenna elements at 12 dBi
QPSK, 16 QAM, 64 QAM, 256 QAM
1/3, 1/2, 2/3, 3/4, 5/6, 7/8 coding rates
1 or 2 modulated streams
MMSE combining of up to 4 receive chains
Selected unweighted Tx antennas as directed by receiver at opposite end
fixed superframe (1 ms) NACK protocol
up to 28 MHz channel bandwidth
single MPDU per PPDU The primary application of this fifth exemplary embodiment is to serve as an RE-IBR for the fourth exemplary embodiment AE-IBR.

A sixth exemplary embodiment of an IBR includes the features outlined in Table 6.

TABLE 6

Sixth Exemplary Intelligent Backhaul Radio Features

Figure 1:
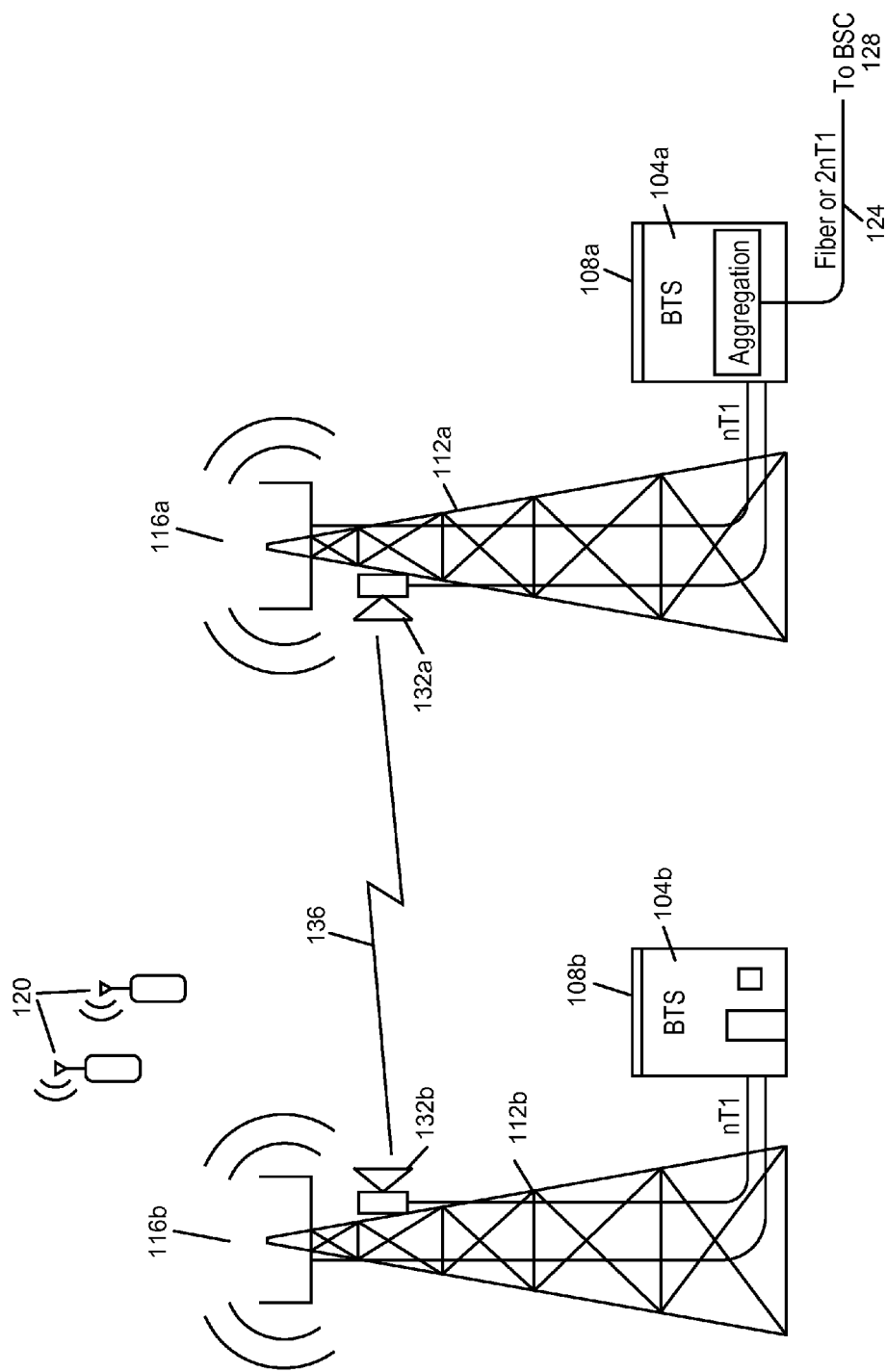
FIG. 1 is an illustration of conventional point to point (PTP) radios deployed for cellular base station backhaul with unobstructed line of sight (LOS).
Figure 2:
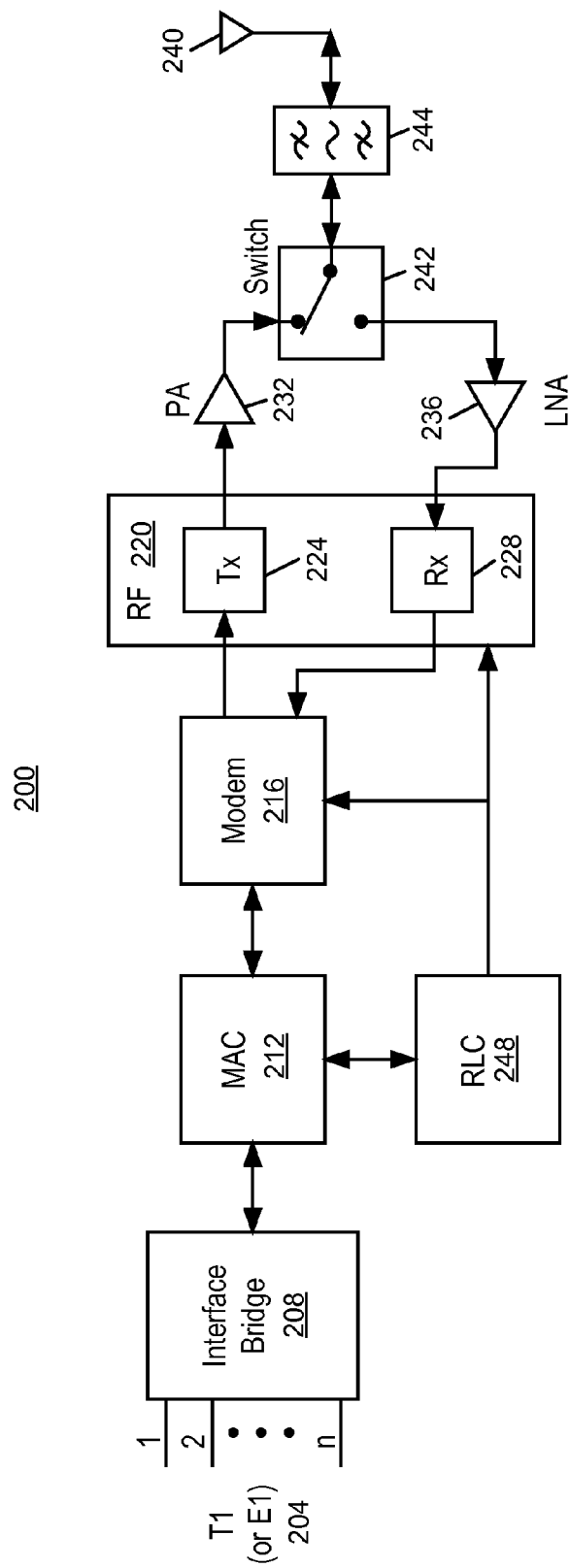
FIG. 2 is a block diagram of a conventional PTP radio for Time Division Duplex (TDD).
Figure 3:
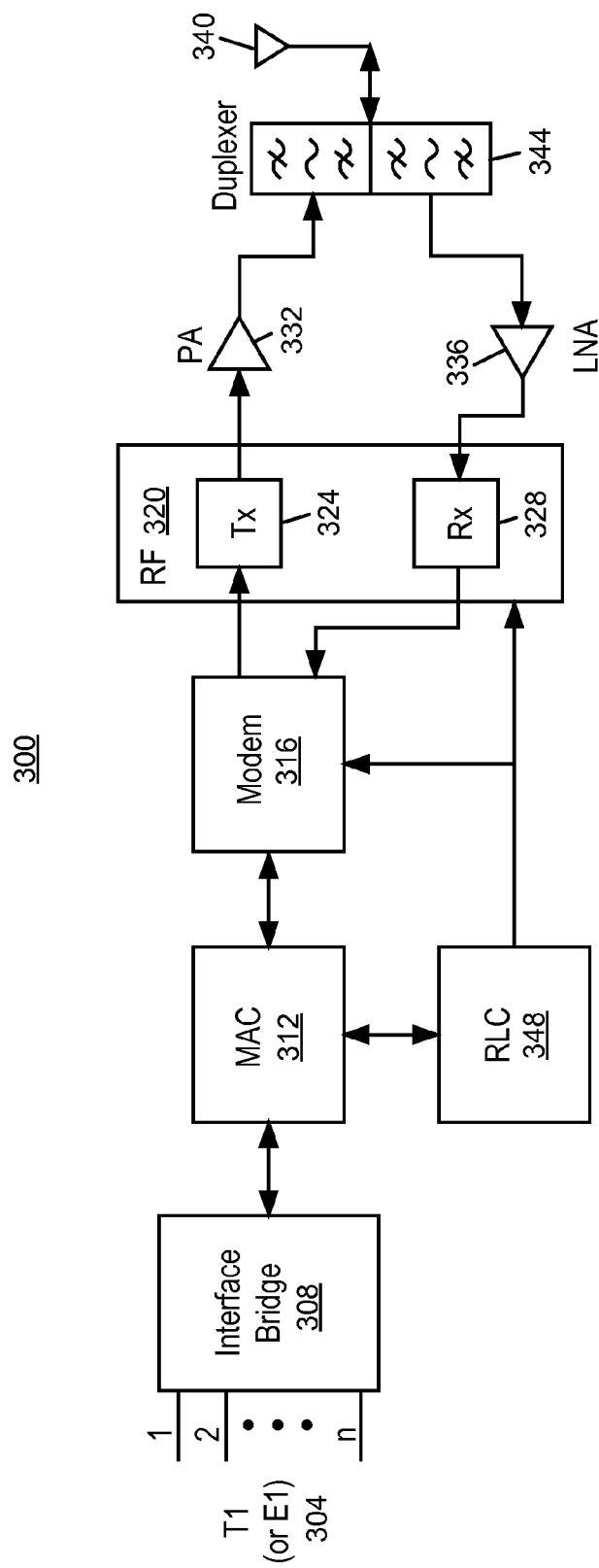
FIG. 3 is a block diagram of a conventional PTP radio for Frequency Division Duplex (FDD).

FDD operation
PTP configuration only (AE-IBR or RE-IBR)
SC-FDE modulation
Jmod = Jdem = 1
K = M = 2
L = 2, N = 4
Q = 6, antenna array similar to FIG. 13
3 Vertical polarization antenna elements, 2 at 13 dBi and 1 at 18 dBi, 3 Horizontal polarization antenna elements, 2 at 13 dBi, 1 at 18 dBi
QPSK, 16 QAM, 67 QAM, 256 QAM, 1024 QAM
1/3, 1/2, 2/3, 3/4, 5/6, 7/8, 9/10 coding rates
1 or 2 modulated streams
MMSE combining of up to 4 receive chains
selection of 2 antennas in transmit
fixed superframe (1 ms) NACK protocol
up to 56 MHz channel bandwidth
single MPDU per PPDU This sixth exemplary embodiment provides high aggregate bi-directional throughput of up to about 1.8 Gb/s with moderate complexity relative to other IBRs. This sixth exemplary embodiment performs optimally in propagation channels with only moderate obstructions compared to unobstructed LOS. FDD also provides <1 ms average latency.

A seventh exemplary embodiment of an IBR includes the features outlined in Table 7.

TABLE 7

Seventh Exemplary Intelligent Backhaul Radio Features

FDD/TDD hybrid operation
PTP configuration only (AE-IBR or RE-IBR)
SC-FDE modulation
Jmod = Jdem = 1
K = 4, M = 8
L = 4, N = 8
Q = 12, antenna array similar to FIG. 14
per each of 3 facets: 2 Vertical and 2 Horizontal antenna elements of 15 dBi each
QPSK, 16 QAM, 64 QAM, 256 QAM
1/3, 1/2, 2/3, 3/4, 5/6, 7/8 coding rates TABLE 7-continued Seventh Exemplary Intelligent Backhaul Radio Features up to 4 modulated streams
MMSE combining of up to 8 receive chains
MRC weighting of up to 8 transmit chains based on blended weights per chain across entire channel as derived from Rx conditions
fixed superframe (1 ms) NACK protocol
up to 56 MHz channel bandwidth
single MPDU per PPDU This seventh exemplary embodiment has additional resources compared to the sixth exemplary embodiment to provide higher aggregate bi-directional throughput of about 3 Gb/s for a PTP link with <1 ms latency that can operate in a severely obstructed LOS propagation channel. It advantageously uses hybrid FDD/TDD operation wherein each frequency duplexed channel alternates in opposite synchronization to each other between transmit and receive. This enables a relatively straightforward and efficient transmit chain weighting to be derived from receive chain equalization analysis without increasing latency. Furthermore, an additional degree of frequency diversity (and space to the extent different antennas are selected) is achieved. The FDD/TDD hybrid can be utilized on any FDD IBR deployment where spectrum regulations permit it. To the extent each FDD band operation relies on band-specific band-select filters in the Front-ends, then additional circuit complexity for switching between transmit and receive is needed.

Note that the preceding embodiments are a small subset of the possible IBR embodiments that are enabled by the disclosure herein. Note further that many additional optional structures or methods described herein can be substituted within the above exemplary embodiments or other embodiments.

For example, TDD CSMA could be used advantageously in high interference spectrum allocations or where required by spectrum regulations as a substitute for fixed superframe timing in the above exemplary embodiments.

Note also that all of the above exemplary embodiments are compatible with any RF carrier frequencies in the range of interest from approximately 500 MHz to 100 GHz.

Note further that in multi-channel embodiments, it is possible to use different access and MAC protocols in different channels especially where advantageous for or required by spectrum regulations. For example, an IBR link may advantageously provide a "base" throughput capability in a channel expected to have minimal interference but for which licensing costs or regulatory restrictions limit total throughput. Then a "surge" throughput capability can be provided in a second channel, such as unlicensed spectrum, where throughput can be higher but the risk of temporal interference outages is also higher.

As evident from the above exemplary embodiments, OFDM is typically used for PMP deployments because at a baseband processing level it is relatively less complex than SC-FDE if frequency-selective channels are to be used with transmit SDMA (at least at the AE-IBR). However, OFDM has higher peak to average ratio and is more sensitive to carrier frequency offset and phase noise than SC-FDE. Thus, for PTP, SC-FDE is often preferable, especially for operation at RF carrier frequencies above 10 GHz where commercially viable components are expensive for either OFDM power amplification or OFDM-compatible local oscillator specifications.

Note that in backhaul applications where links are nominally continuous, additional techniques can improve PHY efficiency. For example, with OFDM, the training block can be combined with a PLCP Header block by interleaving sub-channels appropriately. This is also possible for SC-FDE if DFT pre-coding (i.e. Tx block Assembler-k includes a DFT and Tx-Mux-m includes an IDFT) is used. DFT pre-coding for SC-FDE can also be used to pulse shape the transmitted waveform similar to OFDM zero padding and/or windowing. The training block in SC-FDE can also be shorter than the data blocks to save PHY overhead by either using another FFT for training or switching the FFT bin size during the training block. The channel equalization function so derived is then interpolated for use on the longer data blocks with additional frequency bins. Also, when using DFT pre-coding in SC-FDE, it is possible to time multiplex an FFT block between transmit and receive or within transmit or receive such that all four FFT operations of an SC-FDE transceiver can be realized by 2 or even 1 FFT hardware core. Another technique to simplify PMP deployment of IBRs is to use OFDM in the forward link from AE-IBR to the multitude of RE-IBRs, and then use SC-FDE in the reverse link from RE-IBR to AE-IBR. This enables the advantages of transmit eigenbeamforming at the AE-IBR in a frequency-selective channel based primarily on receive equalization while keeping the RE-IBRs relatively straightforward with much simpler transmitters than in the OFDM only case.

Numerous additional variations of the above-described elements of the IBR can also be advantageously utilized in substitution for or in combination with the exemplary embodiments described above. For example, antenna elements need not always be shared between transmit and receive whether in TDD or FDD mode. In certain embodiments, it is preferable to have a smaller number of transmit antenna elements, often with broader azimuthal coverage than those used by the receive antenna elements, that are always used versus a selectable larger number of receive antenna elements. In some embodiments with separate transmit and receive antenna elements, the respective front-ends of FIGS. 11 and 12 would not require respectively the SPDT switch or the band selection within a duplexer filter and either the receive path elements for a front-end coupled to a transmit antenna element or the transmit path elements for a front-end coupled to a receive antenna element, which further advantageously reduces cost and complexity of the IBR. In such embodiments, each transmit antenna element is coupled to a respective transmit power amplifier which is in turn coupled to a respective transmit RF chain wherein such couplings may be selectable RF connections or fixed RF connections—the latter for IBR embodiments wherein certain transmit RF chains are always connected to certain transmit power amplifiers and certain transmit antenna elements whenever the IBR is in a transmit mode. Similarly, each receive antenna element is coupled to a respective receive low noise amplifier which is in turn coupled to a respective receive RF chain wherein such couplings are typically selectable RF connections as described herein.

As another example, the NACK protocol described above with reference to FIG. 33 and various IBR embodiments can be extended to either ACK/NACK, single NACK as described above, or persistent NACK until delivered. Furthermore, such exemplary choices can be applied to individual MSDUs based on either an indicator from the IBR LLC of FIG. 33 or inspection of MSDU class of service or type of service header field bits as defined by a policy either within the IBR MAC or updateable via the optional IBMS Agent 700. For example, MSDUs corresponding to Voice over Internet Protocol (VoIP) packets are typically sent at a high class of service priority but with so little tolerance for latency that it may be preferable to send such MSDUs with no ACK/NACK retransmission option or with only the single NACK protocol described previously. At the opposite extreme, certain data transfers, such as for example only, cellular network control or management plane messages or user file transfer data, may tolerate considerable or unpredictable latencies associated with persistent retransmission until NACK=0 rather than rely on much slower upper layer retransmission protocols. The policy for mapping MSDUs to a particular ACK/NACK strategy may also be responsive to radio channel conditions and/or loading as determined within the various elements of the IBR described above. For example, when the current packet failure rate is very low and/or the loading demand on the IBR is high compared to the capacity of the MCS, then one policy may be to minimize retransmissions by transmitting most MSDUs with no ACK/NACK or a single NACK. Alternatively, for a high packet failure situation and/or low demand at a given MCS, the opposite strategy may be used. Also, any of the IBR embodiments described herein that use copper Ethernet interfaces may also use such interfaces to supply Power over Ethernet (PoE) to the IBR.

One or more of the methodologies or functions described herein may be embodied in a computer-readable medium on which is stored one or more sets of instructions (e.g., software). The software may reside, completely or at least partially, within memory and/or within a processor during execution thereof. The software may further be transmitted or received over a network.

The term "computer-readable medium" should be taken to include a single medium or multiple media that store the one or more sets of instructions. The term "computer-readable medium" shall also be taken to include any medium that is capable of storing, encoding or carrying a set of instructions for execution by a machine and that cause a machine to perform any one or more of the methodologies of the present invention. The term "computer-readable medium" shall accordingly be taken to include, but not be limited to, solid-state memories, and optical and magnetic media.

Embodiments of the invention have been described through functional modules at times, which are defined by executable instructions recorded on computer readable media which cause a computer, microprocessors or chipsets to perform method steps when executed. The modules have been segregated by function for the sake of clarity. However, it should be understood that the modules need not correspond to discreet blocks of code and the described functions can be carried out by the execution of various code portions stored on various media and executed at various times.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The invention has been described in relation to particular examples, which are intended in all respects to be illustrative rather than restrictive. Those skilled in the art will appreciate that many different combinations of hardware, software, and firmware will be suitable for practicing the present invention. Various aspects and/or components of the described embodiments may be used singly or in any combination. It is intended that the specification and examples be considered as exemplary only, with a true scope and spirit of the invention being indicated by the claims.

What is claimed is:

1. An intelligent backhaul radio comprising:
   one or more demodulator cores, wherein each demodulator core demodulates one or more receive symbol streams to produce a respective receive data interface stream,
   a plurality of receive radio frequency (RF) chains to convert from a plurality of receive RF signals to a plurality of respective receive chain output signals;
   a frequency selective receive path channel multiplexer, interposed between the one or more demodulator cores and the plurality of receive RF chains, to produce the one or more receive symbol streams provided to the one or more demodulator cores from the plurality of receive chain output signals;
   one or more modulator cores, wherein each modulator core modulates a respective transmit data interface stream to produce one or more transmit symbol streams;
   a plurality of transmit RF chains to convert from a plurality of transmit chain input signals to a plurality of respective transmit RF signals;
   a transmit path channel multiplexer, interposed between the one or more modulator cores and the plurality of transmit RF chains, to produce the plurality of transmit chain input signals provided to the plurality of transmit RF chains from the one or more transmit symbol streams;
   an antenna array comprising:
      a plurality of directive gain antenna elements;
      one or more selectable RF connections that selectively couple certain of the plurality of directive gain antenna elements to certain of the plurality of receive RF chains, wherein the number of directive gain antenna elements that can be selectively coupled to receive RF chains exceeds the number of receive RF chains that can accept receive RF signals from the one or more selectable RF connections; and
      a plurality of RF connections to couple at least certain of the plurality of directive gain antenna elements to the plurality of transmit RF chains;
   a radio resource controller, wherein the radio resource controller sets or causes to be set the specific selective couplings between the certain of the plurality of directive gain antenna elements and the certain of the plurality of receive RF chains;
   an interface bridge configured to couple the intelligent backhaul radio to a data network, the interface bridge comprising one or more Ethernet interfaces to couple the interface bridge to the data network, the interface bridge multiplexing and buffering the one or more Ethernet interfaces;
   a media access controller to exchange data to and from the data network via coupling to at least the interface bridge and to and from at least one other intelligent backhaul radio; and
   a radio link controller, wherein the radio link controller sets or causes to be set certain modulation mapping or forward error correction encoding parameters for the one or more modulator cores.

2. The intelligent backhaul radio of claim 1, wherein the radio resource controller further sets or causes to be set at least one of a transmit RF carrier frequency, a transmit channel bandwidth and a number of active receive RF chains.

3. The intelligent backhaul radio of claim 1, wherein the set of receive RF chains that can accept receive RF signals from the one or more selectable RF connections is divided between one subset that accepts receive RF signals from directive gain antenna elements with a first polarization and a second subset that accepts receive RF signals from directive gain antenna elements with a second polarization.

4. The intelligent backhaul radio of claim 1, wherein the directive gain antenna elements that can be selectively coupled to receive RF chains are arranged on a plurality of facets with one or more directive gain antenna elements per facet, and wherein each facet is oriented at a different angle in the azimuth relative to at least one other facet.

5. The intelligent backhaul radio of claim 1, wherein the number of transmit RF chains equals the number of transmit symbol streams.

6. The intelligent backhaul radio of claim 1, wherein the transmit path channel multiplexer couples the plurality of transmit RF chains to respective transmit symbol streams such that each respective transmit chain input signal comprises information from only one respective transmit symbol stream.

7. The intelligent backhaul radio of claim 1, wherein the number of transmit RF chains exceeds the number of transmit symbol streams, and wherein transmit path channel multiplexer couples at least one set of two or more of the plurality of transmit RF chains to a particular transmit symbol stream such that each transmit chain input signal for a particular set of two or more of the plurality of transmit RF chains comprises information from only the one respective particular transmit symbol stream.

8. The intelligent backhaul radio of claim 1, wherein the set of the plurality of directive gain antenna elements that can be coupled to the plurality of transmit RF chains is different than the set of the plurality of directive gain antenna elements that can be coupled to the plurality of receive RF chains.

9. The intelligent backhaul radio of claim 1, wherein the number of directive gain antenna elements that can be coupled to the plurality of transmit RF chains equals the number of transmit RF chains.

10. The intelligent backhaul radio of claim 1, wherein the antenna array further comprises:
   a plurality of transmit power amplifiers, wherein each transmit power amplifier can be coupled to at least one of the plurality of transmit RF chains and to at least one of the plurality of directive gain antenna elements that can be coupled to the plurality of transmit RF chains.

11. The intelligent backhaul radio of claim 1, wherein at least two or more of the directive gain antenna elements that can be coupled to transmit RF chains are oriented in different directions to provide directional diversity.

12. The intelligent backhaul radio of claim 1, wherein the set of directive gain antenna elements that can be coupled to transmit RF chains include directive gain antenna elements of at least two different orthogonal polarizations.

13. The intelligent backhaul radio of claim 1, wherein the set of the directive gain antenna elements that can be coupled to transmit RF chains is divided between one subset with a first transmit polarization and a second subset with a second transmit polarization.

14. The intelligent backhaul radio of claim 13, wherein the first transmit polarization is vertical and the second transmit polarization is horizontal.

15. The intelligent backhaul radio of claim 13, wherein the set of transmit RF chains that can provide transmit RF signals to the one or more RF connections is divided between one subset that provides transmit RF signals to directive gain antenna elements with the first transmit polarization and a second subset that provides transmit RF signals to directive gain antenna elements with the second transmit polarization.

16. The intelligent backhaul radio of claim 1, wherein at least two of the directive gain antenna elements that can be coupled to transmit RF chains are each arranged on separate respective facets amongst a plurality of facets with one or more directive gain antenna elements per facet, and wherein each facet is oriented at a different angle in the azimuth relative to at least one other facet.

17. The intelligent backhaul radio of claim 1, wherein at least one of the directive gain antenna elements that can be coupled to transmit RF chains is arranged on a facet with no directive gain antenna element that can be coupled to any receive RF chain.

18. The intelligent backhaul radio of claim 1, wherein the directive gain antenna elements that can be coupled to transmit RF chains are arranged on one or more facets, and wherein the one or more facets do not include a directive gain antenna element that can be coupled to a receive RF chain.

19. The intelligent backhaul radio of claim 1, wherein at least one of the one or more modulator cores produces at least two transmit symbol streams and such at least one of the one or more modulator cores further comprises:
   a stream parser, interposed between the transmit data interface and the at least two symbol groupers, to split a stream of data within the modulator core into two or more sub-streams.

20. The intelligent backhaul radio of claim 1, wherein at least one of the one or more demodulator cores demodulates at least two receive symbol streams and wherein such at least one of the one or more demodulator cores further comprises:
   a stream multiplexer, interposed between the receive data interface and the at least two soft decision symbol demappers, to combine two or more sub-streams of data within the demodulator core into a single stream.

21. The intelligent backhaul radio of claim 1, wherein a respective block of training pilots from a pilot symbol library within or coupled to the transmit path channel multiplexer is selectively applied to each of the one or more transmit symbol streams.

22. The intelligent backhaul radio of claim 1, wherein a pilot symbol library within or coupled to the transmit path channel multiplexer supplies pilot symbols for selective insertion at predetermined positions within certain successive blocks of symbols from the one or more transmit symbol streams.

23. The intelligent backhaul radio of claim 1, wherein a respective block of training pilots from a pilot data library within or coupled to one or more modulator cores is selectively applied to each of the one or more transmit symbol streams.

24. The intelligent backhaul radio of claim 1, wherein a pilot data library within or coupled to one or more modulator cores supplies pilot data for selective insertion at predetermined positions within certain successive blocks of symbols from the one or more transmit symbol streams.

25. The intelligent backhaul radio of claim 1, wherein the radio link controller sets or causes to be set certain parameters within the plurality of transmit RF chains or a plurality of transmit power amplifiers each coupled to a respective transmit RF chain related to the transmitted signal power from the intelligent backhaul radio.

26. The intelligent backhaul radio of claim 1, wherein the radio link controller composes or causes to be composed a control frame to be sent via the media access controller to another radio link controller in another intelligent backhaul radio.

27. The intelligent backhaul radio of claim 1, wherein the radio resource controller composes or causes to be composed a control frame to be sent via the media access controller to another radio resource controller in another intelligent backhaul radio.

28. The intelligent backhaul radio of claim 1, further comprising:

an intelligent backhaul management system agent that sets or causes to be set certain policies relevant to the radio resource controller, wherein the intelligent backhaul management system agent exchanges information with other intelligent backhaul management system agents within other intelligent backhaul radios or with one or more intelligent backhaul management system servers.

* * * * *